(12) United States Patent
Stump et al.

(10) Patent No.: US 11,442,439 B2
(45) Date of Patent: Sep. 13, 2022

(54) SYSTEM AND METHOD FOR INDUSTRIAL AUTOMATION DEVICE LIBRARY

(71) Applicant: Rockwell Automation Technologies, Inc., Mayfield Heights, OH (US)

(72) Inventors: Andrew R. Stump, Mentor, OH (US); Anthony Carrara, Strongsville, OH (US); Christopher W. Como, Chagrin Falls, OH (US); Sharon Billi-Duran, Euclid, OH (US); Matthew R. Ericsson, Lyndhurst, OH (US); Srdjan Josipovic, Lyndhurst, OH (US); Eashwer Srinivasan, Fremont, CA (US); Michael D. Kalan, Highland Heights, OH (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 388 days.

(21) Appl. No.: 16/586,288

(22) Filed: Sep. 27, 2019

(65) Prior Publication Data
US 2021/0096554 A1 Apr. 1, 2021

(51) Int. Cl.
*G06F 3/0482* (2013.01)
*G05B 19/418* (2006.01)
(Continued)

(52) U.S. Cl.
CPC ... *G05B 19/41885* (2013.01); *G05B 19/0426* (2013.01); *G05B 19/4183* (2013.01);
(Continued)

(58) Field of Classification Search
CPC .... G05B 19/41885; G05B 2219/23005; G05B 19/0426; G05B 19/4183;
(Continued)

(56) References Cited

U.S. PATENT DOCUMENTS

| | | | |
|---|---|---|---|
| 2003/0035010 A1* | 2/2003 | Kodosky | G06F 8/60 715/771 |
| 2003/0037119 A1* | 2/2003 | Austin | H04L 29/06 709/217 |

(Continued)

OTHER PUBLICATIONS

Extended European Search Report for Application No. 20189401.1 dated Feb. 8, 2021, 9 pages.

*Primary Examiner* — Tuyetlien T Tran
(74) *Attorney, Agent, or Firm* — Fletcher Yoder, P.C.

(57) ABSTRACT

A system is configured to receive a first selection of a first object corresponding to a first portion of computer code that defines a first operation of a first industrial automation device from a library, receive a second selection of a second object corresponding to a second portion of computer code that defines a second operation of a second industrial automation device from the library, and generate an industrial automation project code file. Generating the industrial automation project code file includes modifying the first portion of computer code to enable the first industrial automation device to operate in conjunction with the second industrial automation device, modifying the second portion of computer code to enable the second industrial automation device to operate in conjunction with the first industrial automation device, and combining the modified first portion of computer code and the modified second portion of computer code.

20 Claims, 50 Drawing Sheets

(51) Int. Cl.
*G06F 30/13* (2020.01)
*G06F 3/04817* (2022.01)
*G06F 3/04842* (2022.01)
*G05B 19/042* (2006.01)

(52) U.S. Cl.
CPC ........ *G06F 3/0482* (2013.01); *G06F 3/04817* (2013.01); *G06F 3/04842* (2013.01); *G06F 30/13* (2020.01); *G05B 2219/23005* (2013.01); *G05B 2219/32252* (2013.01); *Y02P 90/02* (2015.11)

(58) Field of Classification Search
CPC ........... G05B 2219/32252; Y02P 90/02; G06F 3/04817; G06F 3/0482; G06F 3/04842; G06F 30/13
See application file for complete search history.

(56) References Cited

U.S. PATENT DOCUMENTS

| | | | | |
|---|---|---|---|---|
| 2004/0056896 | A1* | 3/2004 | Doblmayr | G06F 3/0486 715/769 |
| 2005/0119767 | A1* | 6/2005 | Kiwimagi | G05B 19/042 700/19 |
| 2005/0222698 | A1* | 10/2005 | Eryurek | G06F 8/34 700/90 |
| 2006/0052884 | A1* | 3/2006 | Staples | G06F 8/38 700/83 |
| 2007/0132779 | A1* | 6/2007 | Gilbert | G05B 19/41885 345/619 |
| 2007/0143736 | A1* | 6/2007 | Moriarty | G06Q 10/06 717/100 |
| 2007/0198588 | A1* | 8/2007 | Moritz | G06Q 10/06 |
| 2009/0089709 | A1* | 4/2009 | Baier | G05B 19/409 715/817 |
| 2009/0192857 | A1* | 7/2009 | Morse | G05B 15/02 705/7.12 |
| 2010/0083232 | A1* | 4/2010 | Chouinard | G06F 21/10 717/124 |
| 2011/0246963 | A1* | 10/2011 | Kodosky | G06F 9/485 717/113 |
| 2014/0223411 | A1* | 8/2014 | Slone | G06F 8/34 717/105 |
| 2016/0171143 | A1* | 6/2016 | Suiter | G06F 30/392 716/112 |
| 2016/0179359 | A1* | 6/2016 | Kodejs | G06F 3/04817 715/763 |
| 2017/0139404 | A1* | 5/2017 | Anand | G06F 8/34 |
| 2017/0227944 | A1* | 8/2017 | Goli | G06F 3/0482 |
| 2017/0293418 | A1* | 10/2017 | Hams | G05B 19/418 |
| 2018/0074660 | A1* | 3/2018 | Nixon | G08B 21/185 |
| 2018/0088783 | A1* | 3/2018 | Anand | G06F 9/451 |
| 2019/0087069 | A1* | 3/2019 | McCauley | G05B 19/0423 |
| 2020/0186378 | A1* | 6/2020 | Six | G06F 3/04817 |

\* cited by examiner

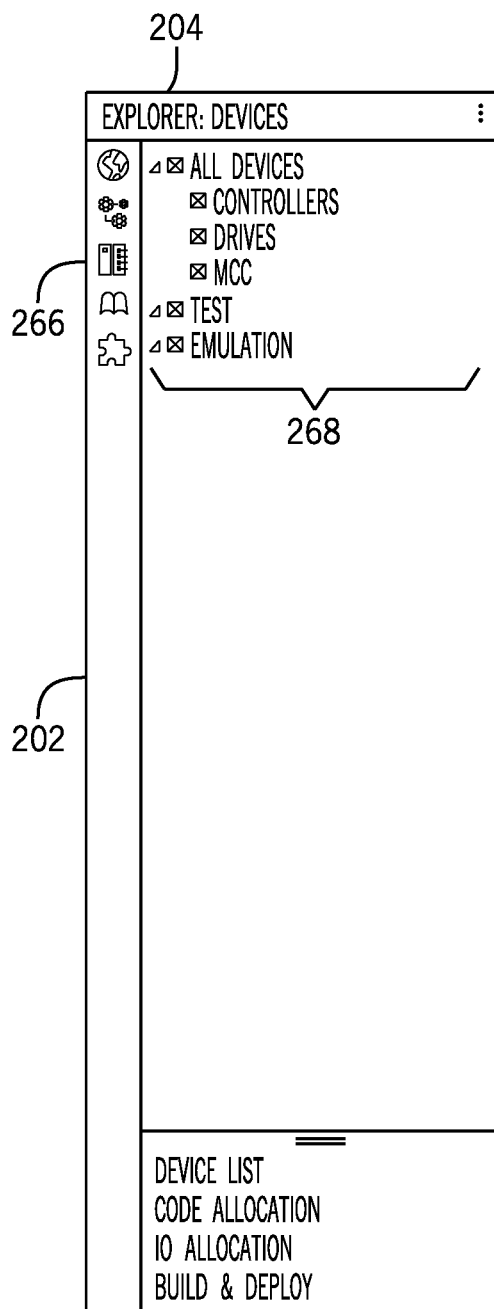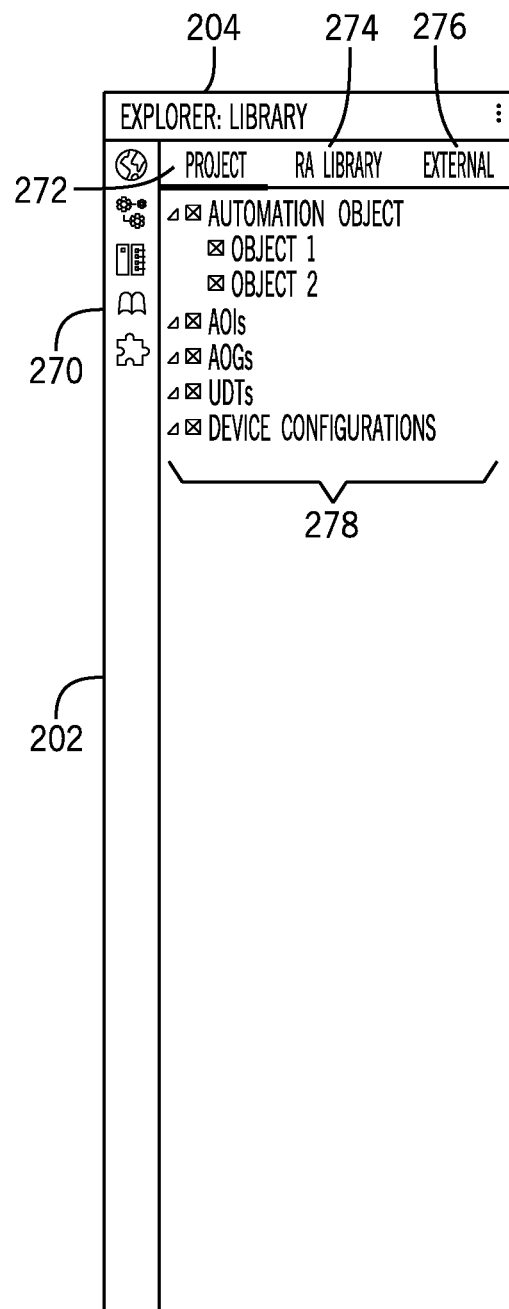
FIG. 6C
FIG. 6D

204

EXPLORER: EXTENSIONS

INSTALLED EXTENSIONS

| | |
|---|---|
| DASHBOARD | 👁 |
| SYSTEM VIEWER | 👁 |
| SYSTEM DESIGNER | 👁 |
| RLL EDITOR | 👁 |
| FBD EDITOR | 👁 |
| ST EDITOR | 👁 |
| SFC EDITOR | 👁 |
| SEQUENCE EDITOR | 👁 |
| TAGS / PARAMETERS EDITOR | 👁 |
| SCREEN EDITOR | 👁 |
| FACEPLATE EDITOR | 👁 |
| GRAPHIC EDITOR | 👁 |
| ALL DEVICES WORKSPACE | 👁 |
| CODE ALLOCATION WORKSPACE | 👁 |
| I/O ALLOCATION WORKSPACE | 👁 |
| HMI ALLOCATION WORKSPACE | 👁 |
| MONITOR EXPLORER | 🗑 👁 |
| BATCH EXPLORER | 🗑 👁 |
| ASSET CENTER | 🗑 👁 |

280
202
282

ROCKWELL EXTENSION STORE

FIG. 6E

☒ ACME PROJECT – ROCKWELL
FILE  EDIT  VIEW  TOOLS  WINDOW  HELP

○ OFFLINE   ⊙ JOHN DOE

SYSTEM
EDITOR
DEVICES ☒ DEVICES
LIBRARY
MONITOR

ARRANGE BY
⊙ CONTROLLER
○ CHASSIS
○ DEVICE TYPE

TYPE
○ ANALOG
○ DIGITAL
○ COMMUNICAT
○ DRIVE
○ MOTION
○ OTHER
○ SAFETY
○ SPECIALTY
○ CONTROLLER

ALERTS
○ FIRMWARE U
○ PRODUCT NO
○ FAULTED
○ DEPLOYMENT

ALERTS
○ HARDY PROC
○ MOLEX INCOR
○ ROCKWELL A
○ ALLEN-BRADLEY
○ ENDLESS+HAUSER

EXTENSION

— 400

IMPORT HARDWARE / CONFIGURATION-VIEW DATA
IMPORT FILE: Ethanol_Plant

| ⊙ IMPORT | ⊙ IMPORT | ⊙ IMPORT | ⊙ IMPORT | ⊙ IMPORT | | ⊙ IMPORT | | | ⊙ IMPORT | |
|---|---|---|---|---|---|---|---|---|---|---|
| TAG | TYPE | MODEL | REMOTE I/O RACK TAG | MODULE TAG | CHANNEL | CONTROLLER | TASK | | HMI SERVER | HMI SCREEN |
| LT131.InpPV | Controller | 1756-L85E | RIO101 | RIO101AIO1 | Channel0 | LGXC01 | Task_500ms | | PASS01 | Extraction |
| FT132.InpPV | Controller | 1756-L85E | RIO101 | RIO101AIO1 | Channel1 | LGXC01 | Task_500ms | | PASS01 | Extraction |
| XC132.OutCV | Module | 1756-EN2T | RIO101 | RIO101AO01 | Channel0 | LGXC01 | Task_500ms | | PASS01 | Extraction |
| LT310.InpPV | Module | 1756-EN2T | RIO301 | RIO301AIO1 | Channel1 | LGXC01 | Task_500ms | | PASS01 | Fermentation |
| TT331.InpPV | Module | 1756-EN2T | RIO301 | RIO301AIO1 | Channel2 | LGXC01 | Task_500ms | | PASS01 | Fermentation |
| TT332.InpPV | Module | 1756-EN2T | RIO301 | RIO301AIO1 | Channel3 | LGXC01 | Task_500ms | | PASS01 | Fermentation |
| TT333.InpPV | Module | 1756-IF8IH | RIO301 | RIO301AIO1 | Channel4 | LGXC01 | Task_500ms | | PASS01 | Fermentation |
| TT334.InpPV | Module | 1756-IF8IH | RIO301 | RIO301AIO1 | Channel5 | LGXC01 | Task_500ms | | PASS01 | Fermentation |
| TT335.InpPV | Module | 1756-IF8IH | RIO301 | RIO301AIO1 | Channel6 | LGXC01 | Task_500ms | | PASS01 | Fermentation |
| TT336.InpPV | Module | 1756-OF8IH | RIO301 | RIO301AIO1 | Channel0 | LGXC01 | Task_500ms | | PASS01 | Fermentation |
| XC331.OutCV | Module | 1756-OF8IH | RIO301 | RIO301AIO1 | Channel1 | LGXC01 | Task_500ms | | PASS01 | Fermentation |
| XC332.OutCV | Module | 1756-IB16D | RIO301 | RIO301AIO1 | | | | | | |

<BACK TO CHOOSE          CANCEL   CONTINUE

FIG. 9

SYSTEM AND METHOD FOR INDUSTRIAL AUTOMATION DEVICE LIBRARY

BACKGROUND

Embodiments of the present disclosure relate generally to the field of automation control and monitoring systems. More particularly, embodiments of the present disclosure relate to techniques for designing, monitoring, and troubleshooting automation control systems.

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Design of industrial automation systems typically involves a designer writing portions of programmatic code for each device and/or object within the industrial automation system. Accordingly, design of even relatively simple industrial automation systems involves a designer having multiple windows of code open at a time and paying close attention to making sure the various portions of code properly function with one another. Though certain combinations of devices or objects may be used frequently together, when used in a particular industrial automation system, the designer writes code for each component as though they have never been used together before. Further, in existing design environments, the designer is free to use incompatible objects together, or form invalid connections between objects, without any warning that design actions taken may render the industrial automation system inoperable. This may result in designer spending a great deal of time reviewing previous designs and/or specifications of candidate objects or devices. If a problem arises, the designer is left on his or her own to troubleshoot the programmatic code for the industrial automation system without any guidance as to what the issue is and how to resolve it. Additionally, if designer wishes to employ a particular naming convention for objects or devices within an industrial automation system, the designer manually updates names of objects or devices when a name change is warranted by the naming convention. Accordingly, if the designer wishes to insert, remove, or relocate an object, the naming convention may dictate that the names of objects upstream and/or downstream of the change should be updated accordingly. Typically, a designer would manually update the names one by one. Further, if the designer wishes to change naming conventions, the designer manually derives new object names according to the new naming convention and then goes through and updates the names one by one. Not only is manually updating the names of objects in the industrial automation system time consuming and tedious, but when each component has an associated portion of programmatic code that may reference other components in the industrial automation system by name, manually updating component names may be subject to human error.

As a result of these factors, designers of industrial automation systems are a relatively small, highly trained, and highly experienced group. Accordingly, rather than designing industrial automation systems themselves, customers typically hire as a designer as a contractor to design an industrial automation system, or pay a vendor to design an industrial automation system and deliver the programmatic code for the customer to implement. Accordingly, the customer may have limited understanding of a design for an industrial automation system that it operates, making modifications to that industrial automation system difficult and resource intensive. Further, once a design is implemented, the resultant industrial automation system may be operated by an operator via a run-time environment. However, the run time environment may not provide the operator with avenues to make small adjustments or modifications to the industrial automation system to troubleshoot the industrial automation system when an issue arises. Instead, the industrial automation system may be taken offline and an engineer or designer brought in to diagnose and resolve the problem.

BRIEF DESCRIPTION

When designing industrial automation systems with existing design software, designers are free to use incompatible objects with one another, create invalid connections between objects, or otherwise take actions that do not comply with best practices or internal guidelines for designing industrial automation systems. If a designer takes multiple actions that do not comply with best practices or guidelines during design of an industrial automation system, issues that arise from taking these actions may not present themselves until later in the design process. Attempting to resolve the issue later in the design process, when the offending action is stacked under multiple subsequent design actions, may be time consuming and challenging to unpack and resolve. The disclosed techniques include applying a set of industrial automation system design rules to determine whether each action taken by a designer (e.g., adding an object to a project, drawing connections between objects, etc.) is allowed by the rules. The rules may act as "design guardrails" to help designers design better systems more efficiently, avoiding long periods of time spent troubleshooting. In some cases, designers may be entirely prevented from taking prohibited actions, whereas in other cases, designers having certain specified credentials may be able to override the warning message that a given design action does not follow the guidelines.

Typically, designers designing industrial automation systems manually select components they want to include in a system and define connections between those components. Accordingly, the designer may spend a significant amount of time reviewing previous designs of industrial automation systems and reviewing specification sheets of components to determine the suitability of a given component for use in the industrial automation system and the component's compatibility with other components within the system. The disclosed techniques include using AI and/or machine learning to consider actions taken by a designer in view of previous designs and known component specifications to suggest design actions, which the designer may accept or reject. Suggestions may include, for example, using specific models of components, adding connections between components, inserting additional components, replacing end of life components with replacement components, and so forth. When an action is suggested, the designer may choose whether to accept the suggestion or dismiss the suggestion. In some cases, the system may also provide the designer with contact information or hyperlinks to vendors or manufacturers of the suggested component, or other avenues to purchase the suggested component.

Typically, designers of industrial automation systems are left to their own devices when troubleshooting a design of an industrial automation system. Accordingly, designers are left to develop their own processes for troubleshooting designs. As a result, a designer's proficiency in troubleshooting a design depends upon the troubleshooting processes he or she has developed, as well as the experience of the designer in troubleshooting a wide range of circumstances. The disclosed techniques include using AI and/or machine learning to analyze a historical data set, identify when the instant issue has been encountered before, and suggest a remedial action to the designer. For example, the system may recognize that a problem has been encountered and use a historical data set to identify when the problem has been encountered in the past. The system may then consider what was done in those previous occurrences to remedy the problem. The system may then identify one or more possible remedial actions to address the problem. In some cases, the system may rank or otherwise evaluate the possible remedial actions to identify a likelihood of success for each possible remedial action. The system may then suggest one or more of the remedial actions to the designer. For example, the system may communicate to the designer, "The last time this problem occurred, we took this remedial action." In some cases, the designer may have the option to automatically implement the suggested remedial action, see instructions for manually implementing the suggested remedial action, or dismiss the suggestion.

Industrial automation system software is typically separated into design-time environments and run-time environments. Design-time environments are used by designers to design industrial automation systems and develop the code that runs these systems. Typically, design of industrial automation systems occurs at a location remote from the industrial automation system. In contrast, run-time environments are used by operators, on site, to monitor the operation of the industrial automation system. Sometimes issues arise during operation of an industrial automation system that only require minor adjustments to resolve (e.g., reset component, adjust set point, adjust threshold, etc.). Run-time environments typically do not have the capability to make even minor adjustments to industrial automation systems. Accordingly, when an issue arises, the industrial automation system may be stopped and a designer or engineer brought in to resolve an issue that may only require minor adjustments. The disclosed techniques include a light engineering client environment, which is similar to a run-time environment, but includes some functionality of the design-time environment, allowing operators to make minor adjustments to an industrial automation system to resolve minor issues. In some embodiments, the light engineering client may also be capable of providing recommendations for how to resolve issues that arise.

When designing industrial automation systems, designers typically write a portion of code for each object or device in the industrial automation system. Though a group of components may be used together frequently (e.g., a tank, a valve, and a pump), for each instance in which the group of components is used, the designer has to write new code defining the interactions between the components. This can be tedious and resource intensive. The disclosed techniques include using component libraries that include objects that are programmed to interact with one another in known ways. Accordingly, the designer may drag components from a library into a design window, and the system may understand how the components are intended to interact with each other. Using the example from above, a user may drag a tank, a valve, and a pump into a design environment, and the system may automatically arrange the components and connect the components accordingly to how they are frequently implemented. Each component in a library may have a respective portion of code that defines the operation of the respective component. Based on how the components are arranged and connected in the design window, the system may then generate or modify program code for the components so the designer is not burdened with writing the code for the system.

Typically, if a customer or designer wishes to use a naming convention for one or more industrial automation systems, it is the responsibility of the designer to manually edit the names of components in libraries and/or components used in industrial automation systems. Thus, creating a new naming convention and updating the names of existing components to adhere to the naming convention can be time consuming. Additionally, some frequently used naming conventions may give unique names to each instantiation of a component within an industrial automation system. In such a naming convention, the names may include fields that increase or decrease along a flow path of the industrial automation system (e.g., motor_1, motor_2, motor_3, etc.). However, when a component is inserted into, removed from, or rearranged within, the middle of an industrial automation system, it may be up to the designer to manually adjust the names of the other components in the industrial automation system to maintain the naming convention. Because this is tedious and time consuming, a designer may choose to break the naming convention or not make the modification to the industrial automation system, even though it would improve the performance of the industrial automation system, because of the work involved in making the modification. The disclosed techniques include using AI and/or machine learning to learn new naming conventions and propagate the new naming convention through one or more industrial automation systems and/or libraries, and to automatically adjust component names to maintain a naming convention when components are added, removed, or rearranged within the system.

Writing project code files for industrial automation systems is typically outsourced to contractors or third parties who are paid to deliver a project code file for an industrial automation system and then are subsequently not involved in the operation of the industrial automation system. Accordingly, the person who created the project code file for a particular industrial automation system is frequently not available to make adjustments to the project code file or answer questions about the project code file. Accordingly, while the customer that paid to have the project code file generated may have possession of the project code file, the customer may not be intimately familiar with the structure of the project code file (e.g., the structure of the project code file, the quality of the project code file, etc.), and may not have the ability to modify the project code file. The disclosed techniques include a project code file analysis algorithm that may be applied to project code files and generate a report for the project code file. The project code analysis algorithm may be configured to determine a structure of the project code file, create a visualization of the project code file, identify dead code (i.e., code that is not executed) within the project code file, identify dead ends within the project code file, identify inefficient tag usage, identify parallel concurrent tasks, consider the validity of connections between components, identify overload situations, calculate a complexity score for the code, determine whether the project code file meets an acceptance criteria, and so forth. Further, once the project code file has been analyzed, a database may be updated with data from the analysis. As the database is populated with data from analyzing numerous project code files, adjustments may be made to the project code analysis algorithm, such that the project code analysis algorithm improves over time.

DRAWINGS

These and other features, aspects, and advantages of the present embodiments will become better understood when the following detailed description is read with reference to the accompanying drawings in which like characters represent like parts throughout the drawings, wherein.

Figure 6A:
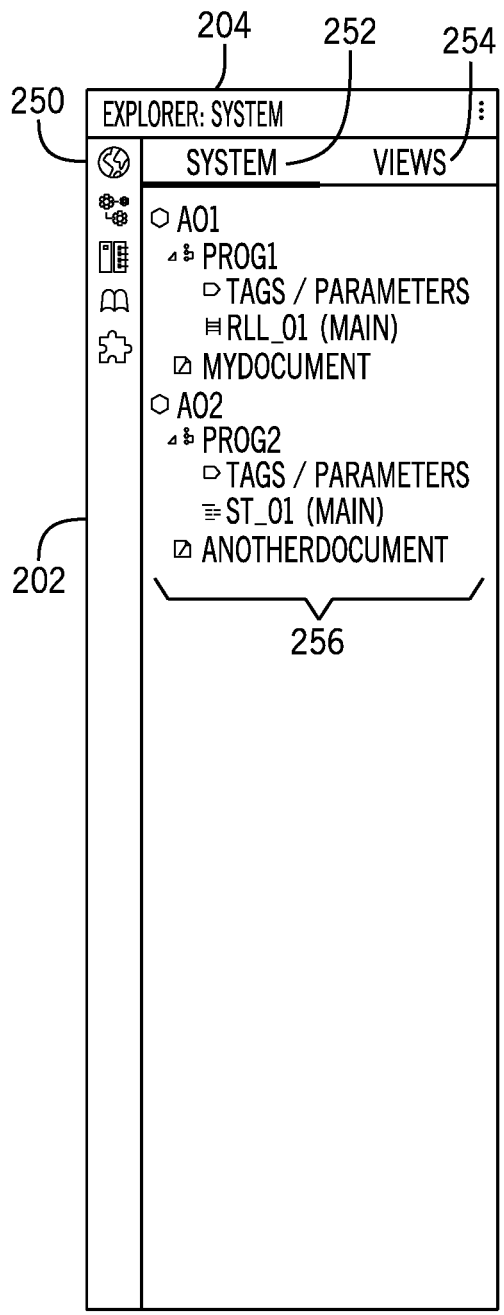
FIG. 6A is a screenshot of an explorer window of the dashboard on FIG. 5 when a system tab is selected from a vertical navigation bar, in accordance with embodiments presented herein.
Figure 6B:
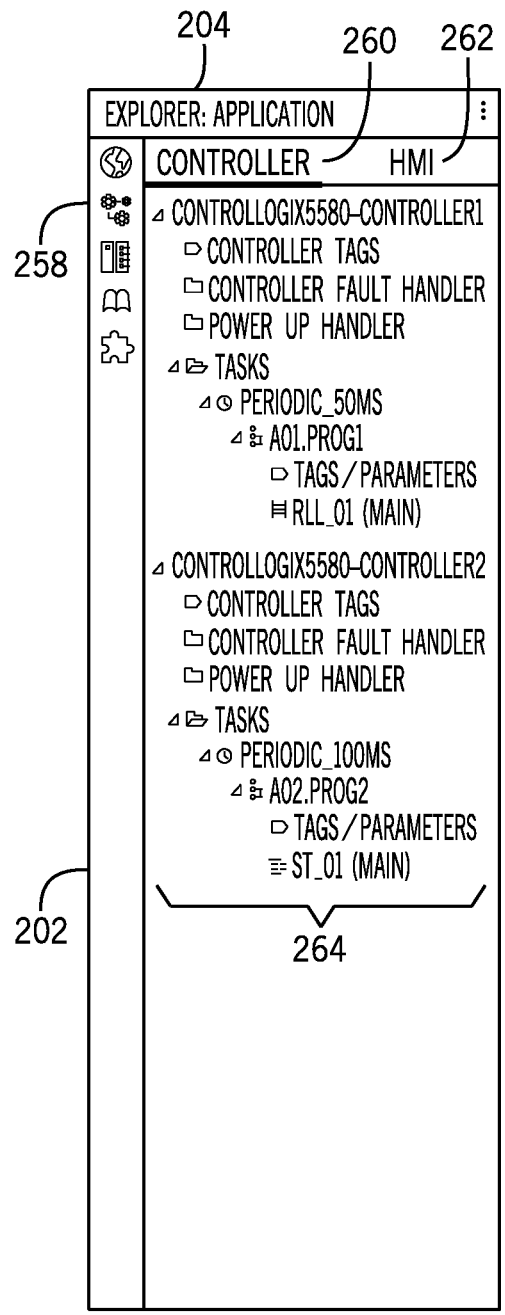
Figure 7:
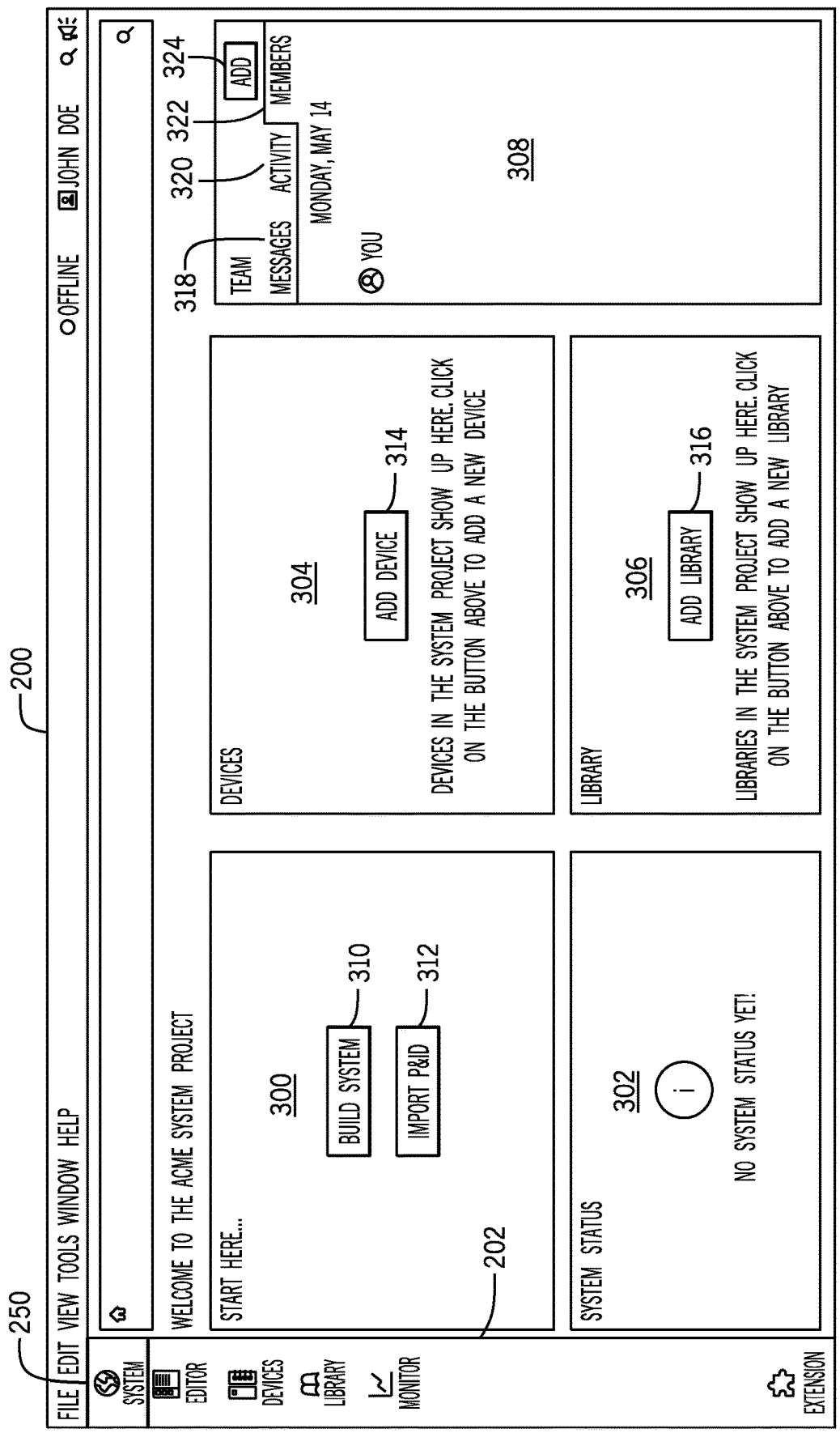
Figure 8:
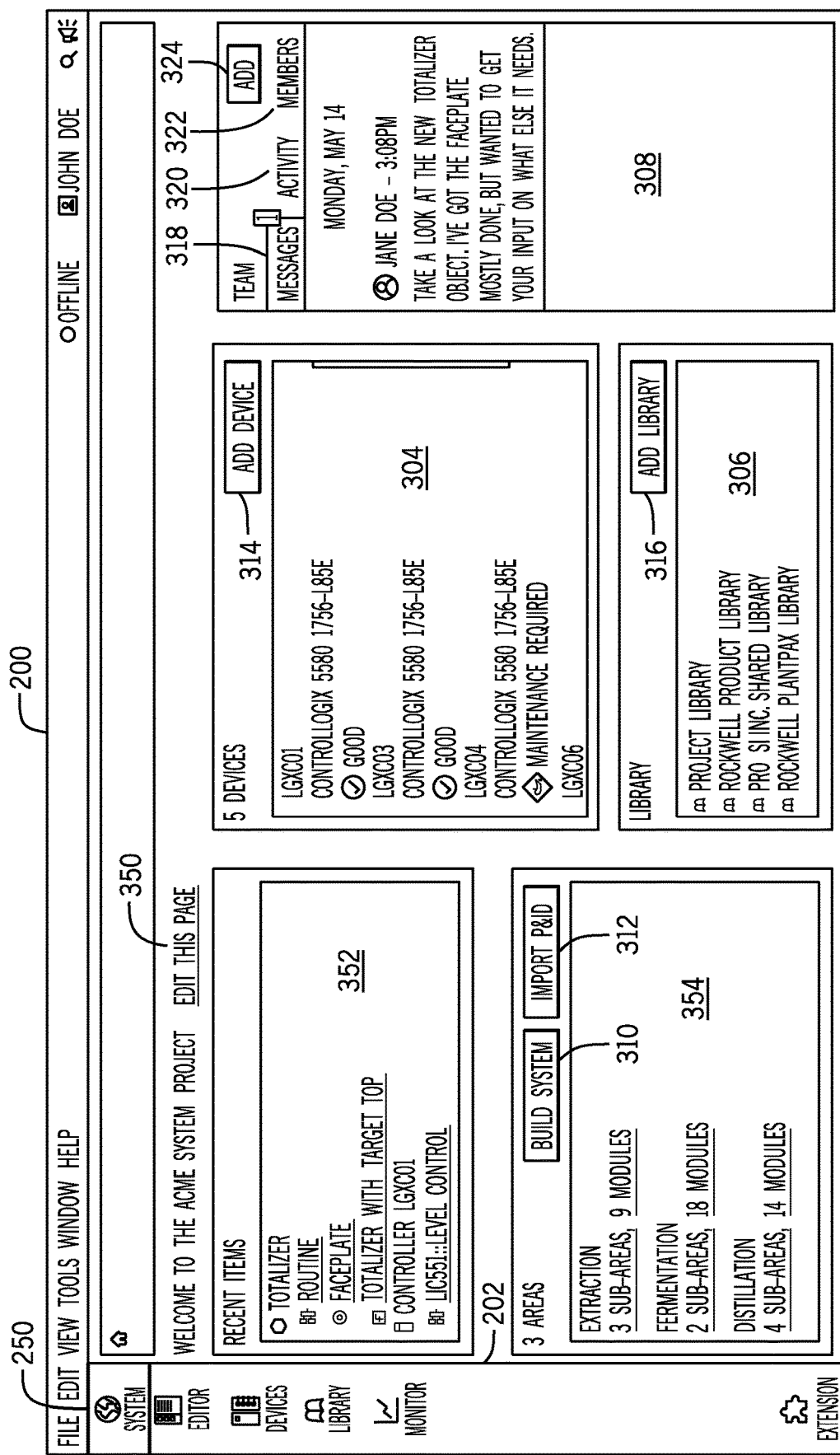
Figure 10:
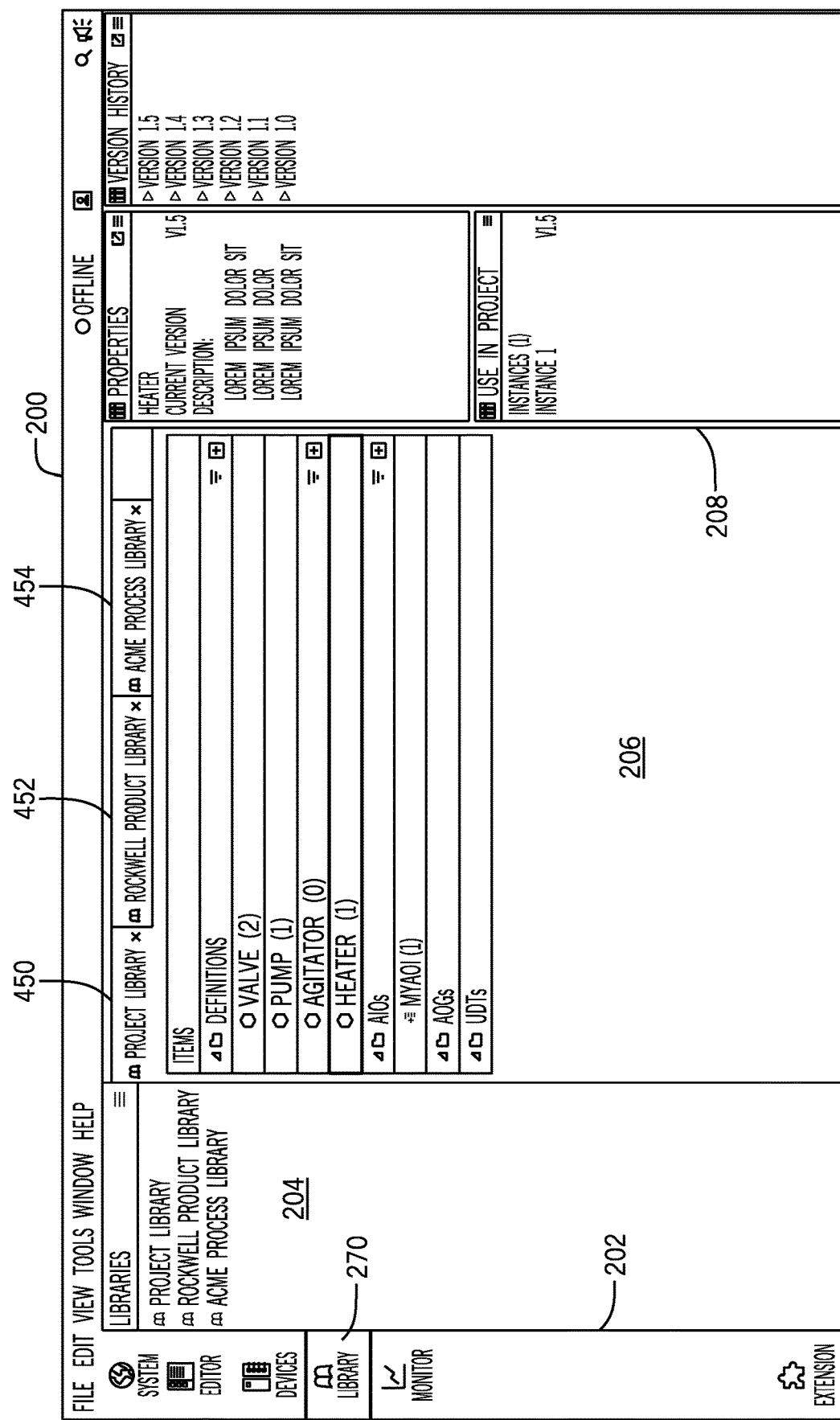
Figure 11:
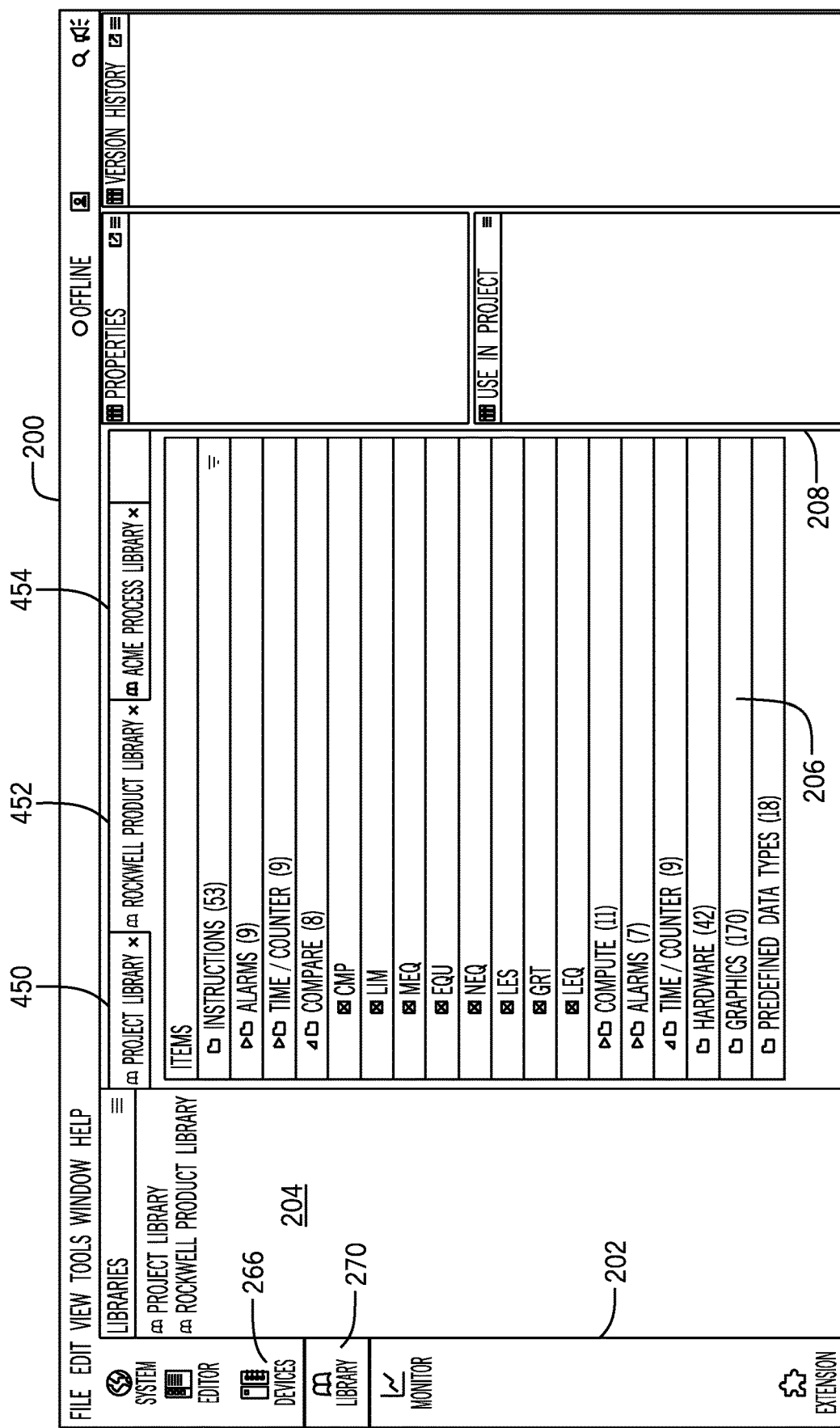
Figure 12:
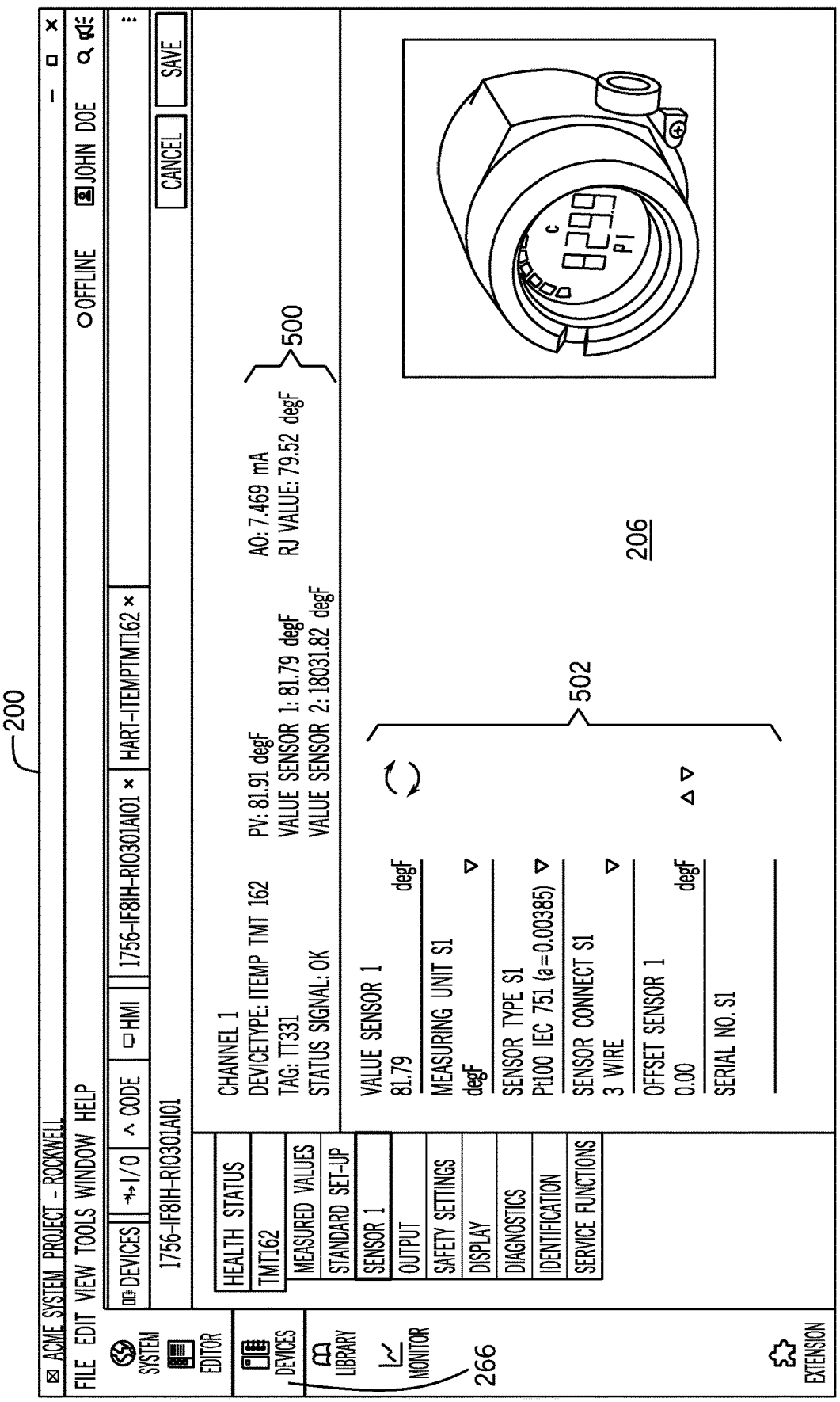
Figure 13:
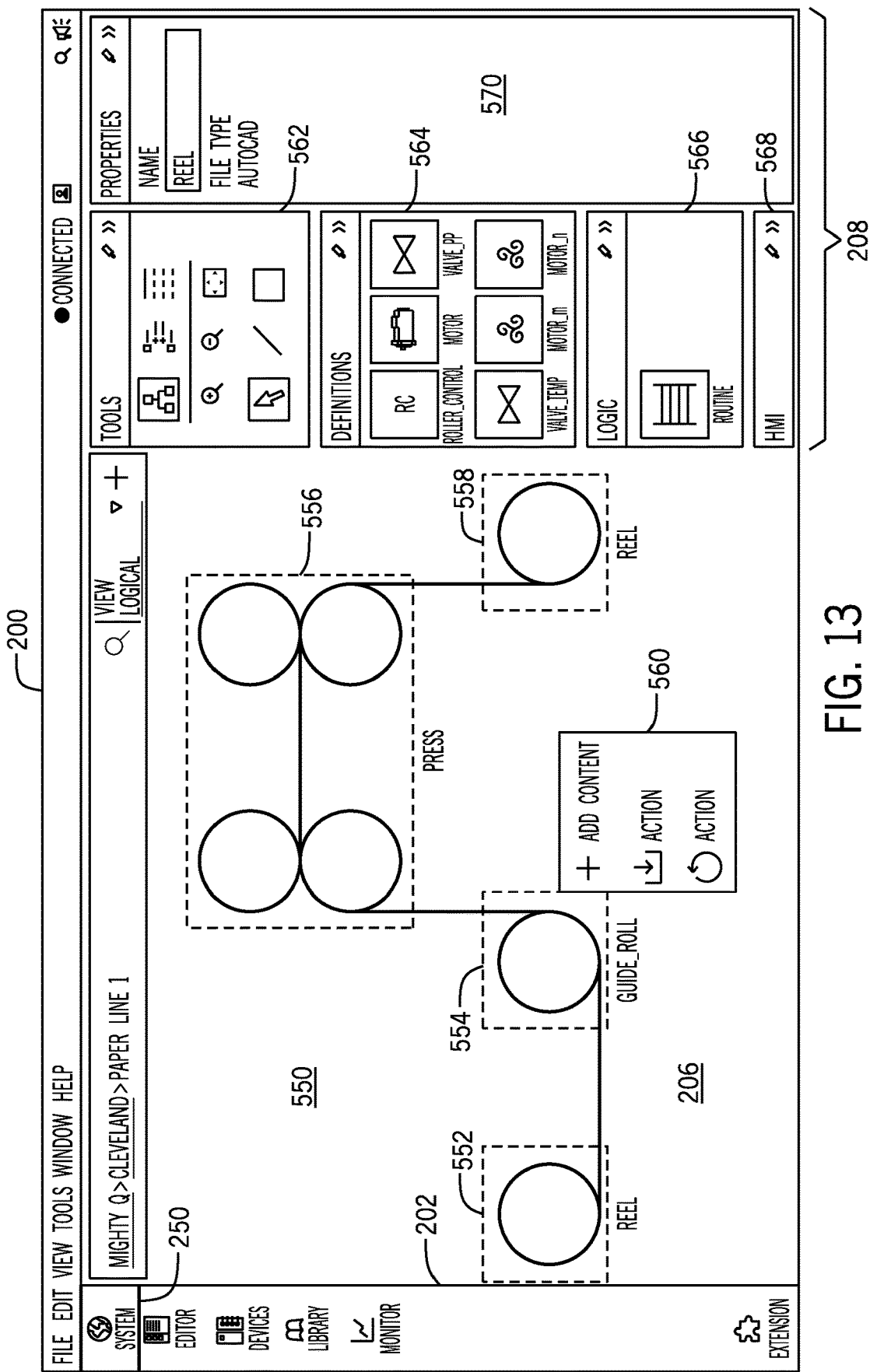
Figure 14:
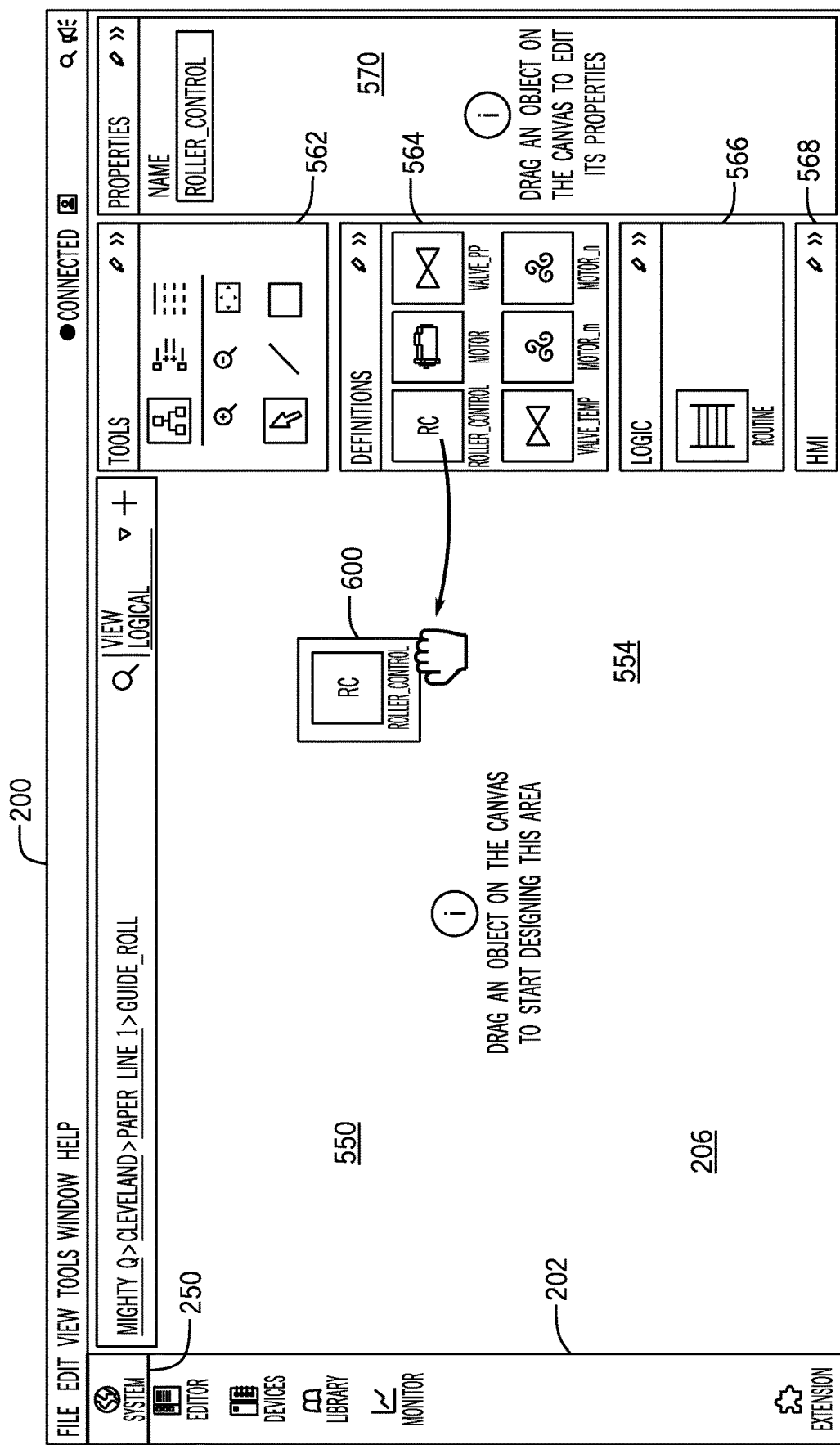
Figure 15:
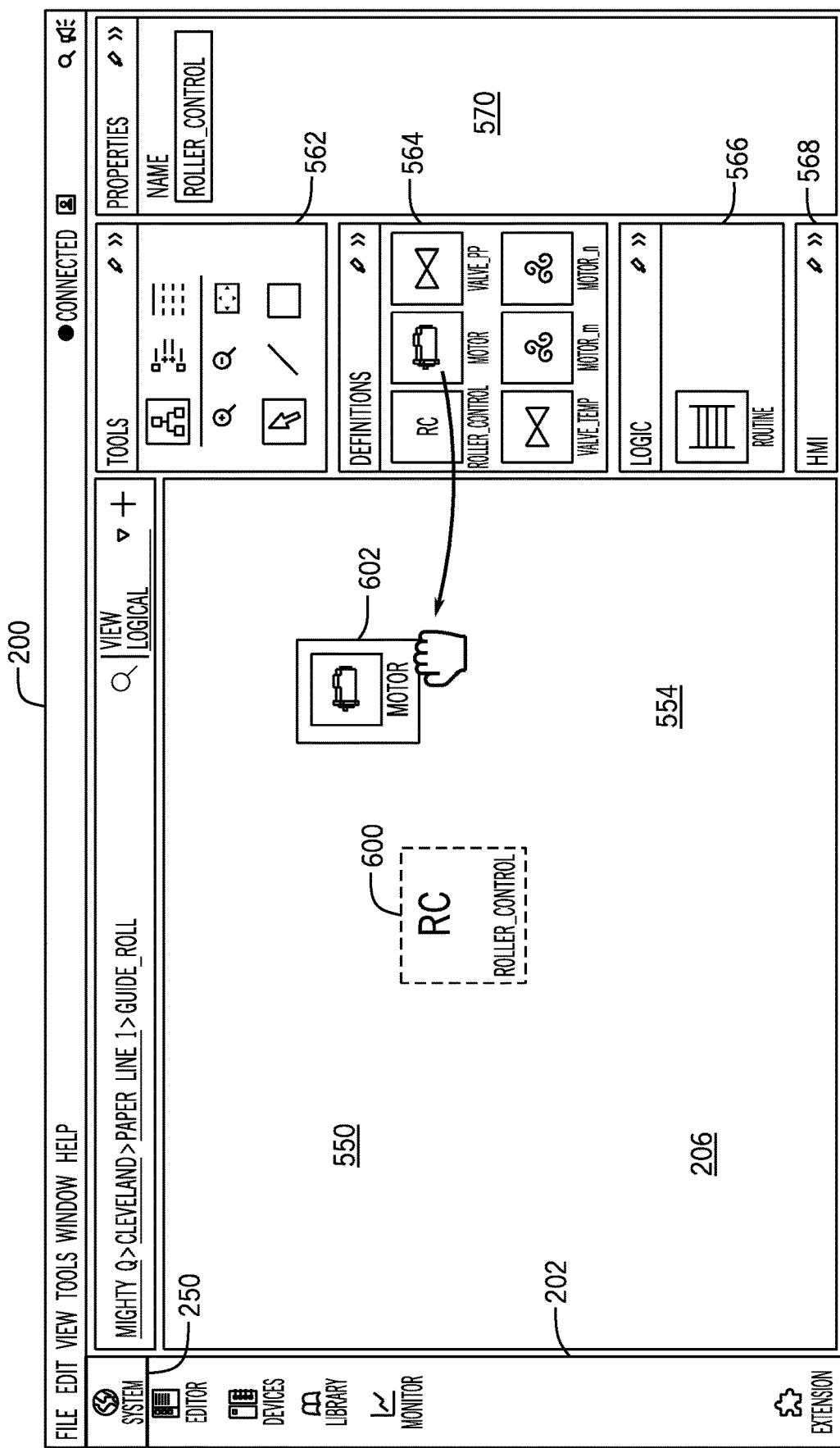
Figure 16:
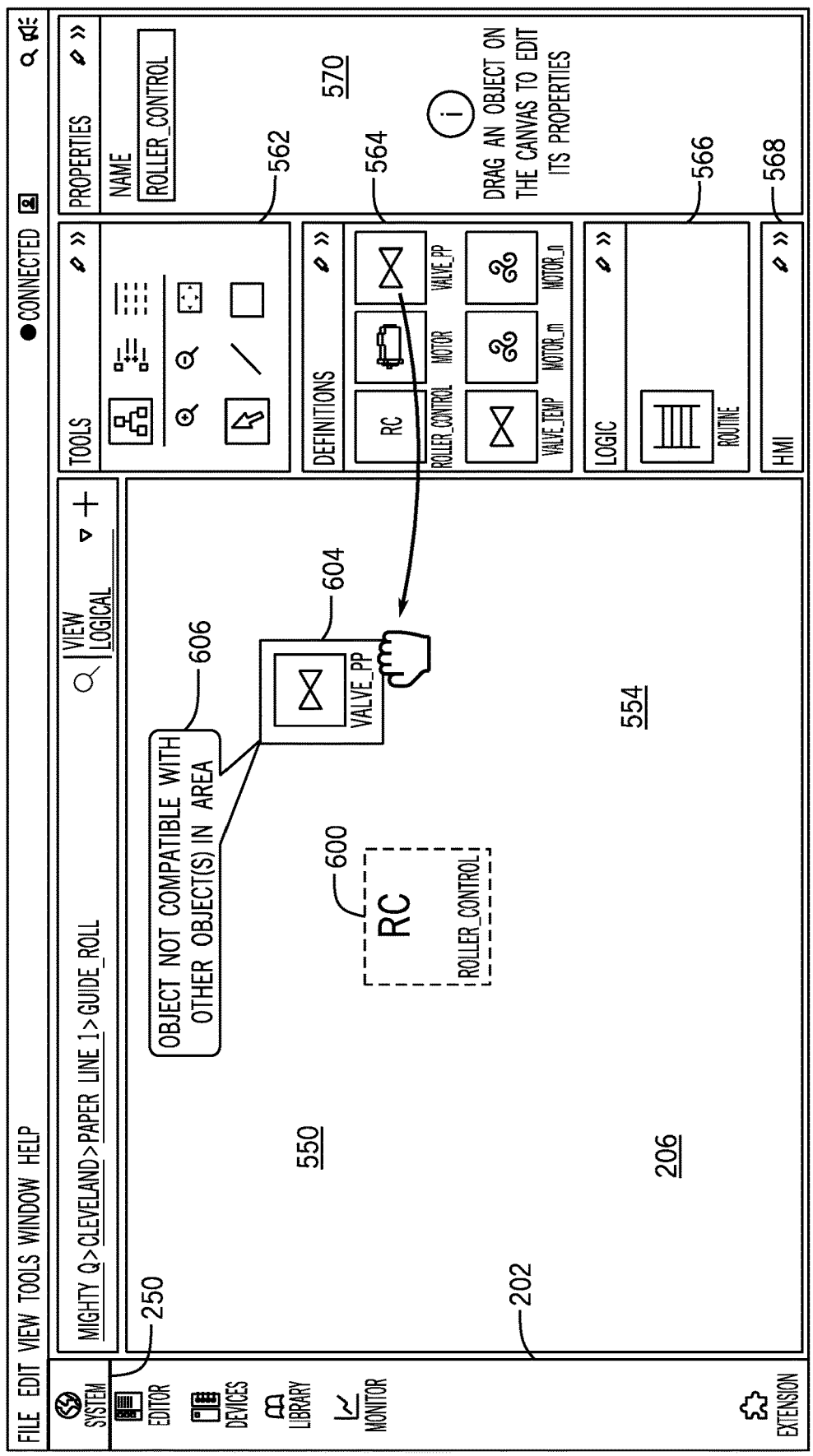
Figure 17:
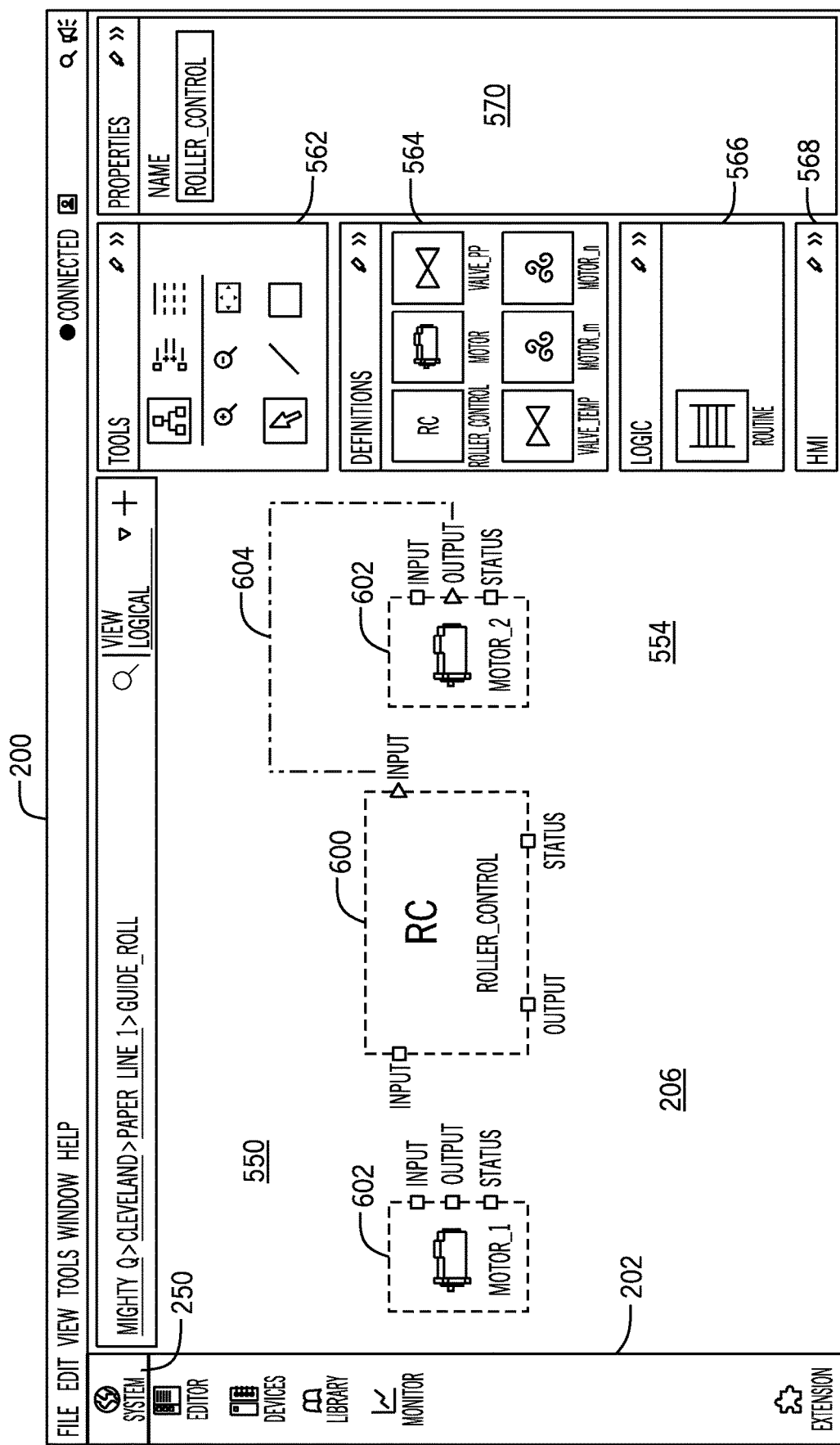
Figure 18:
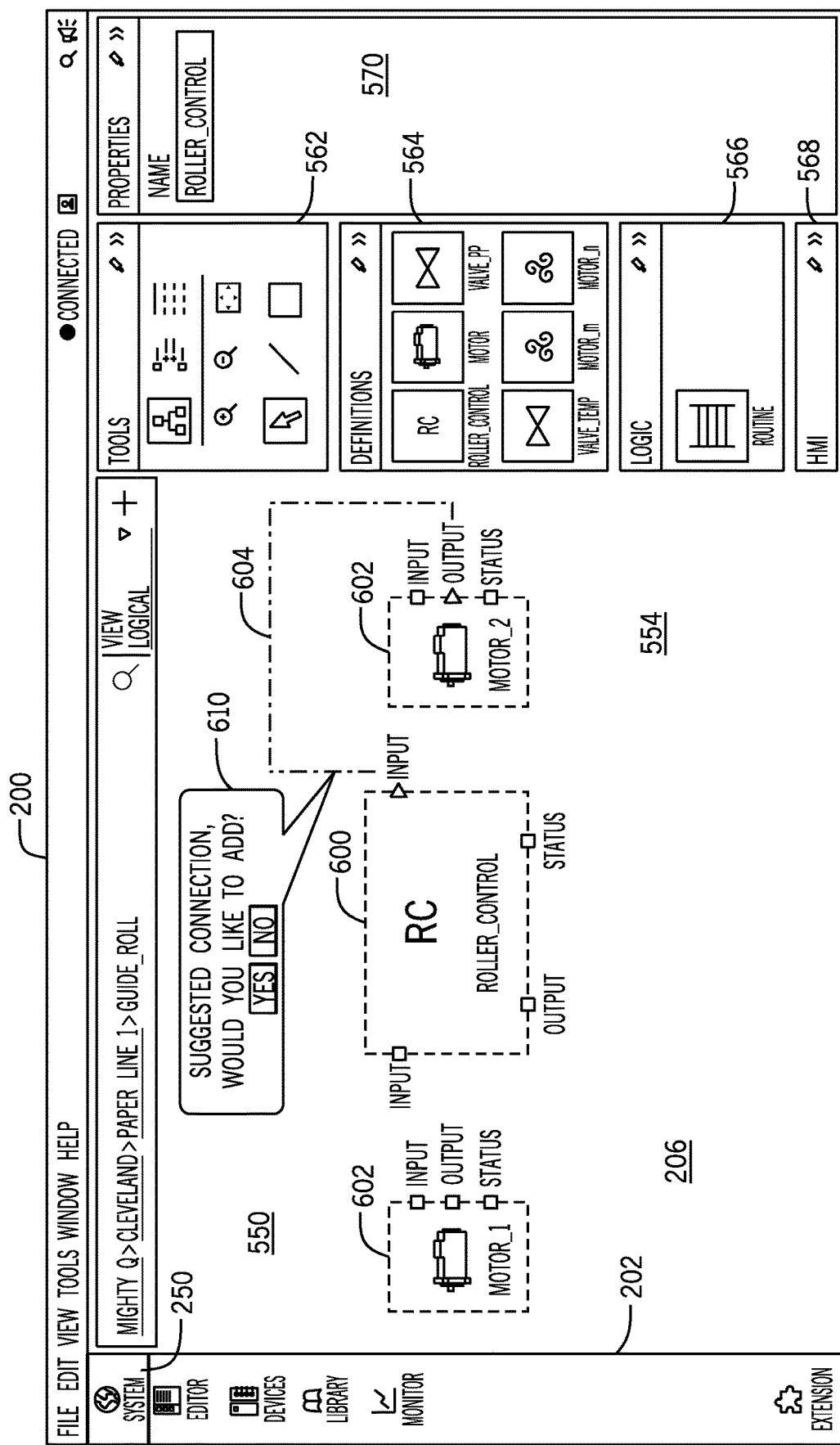
Figure 19:
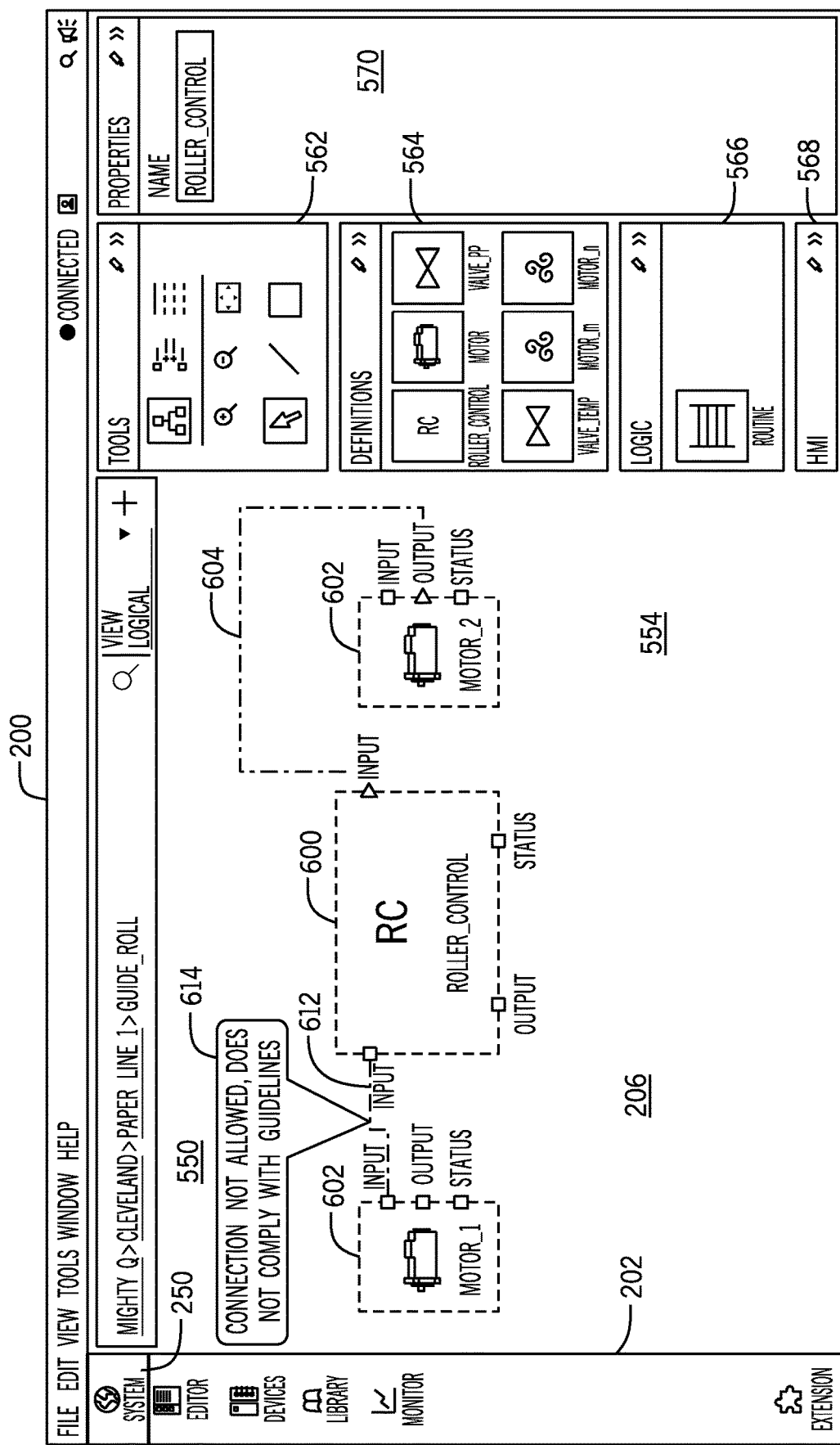
Figure 20:
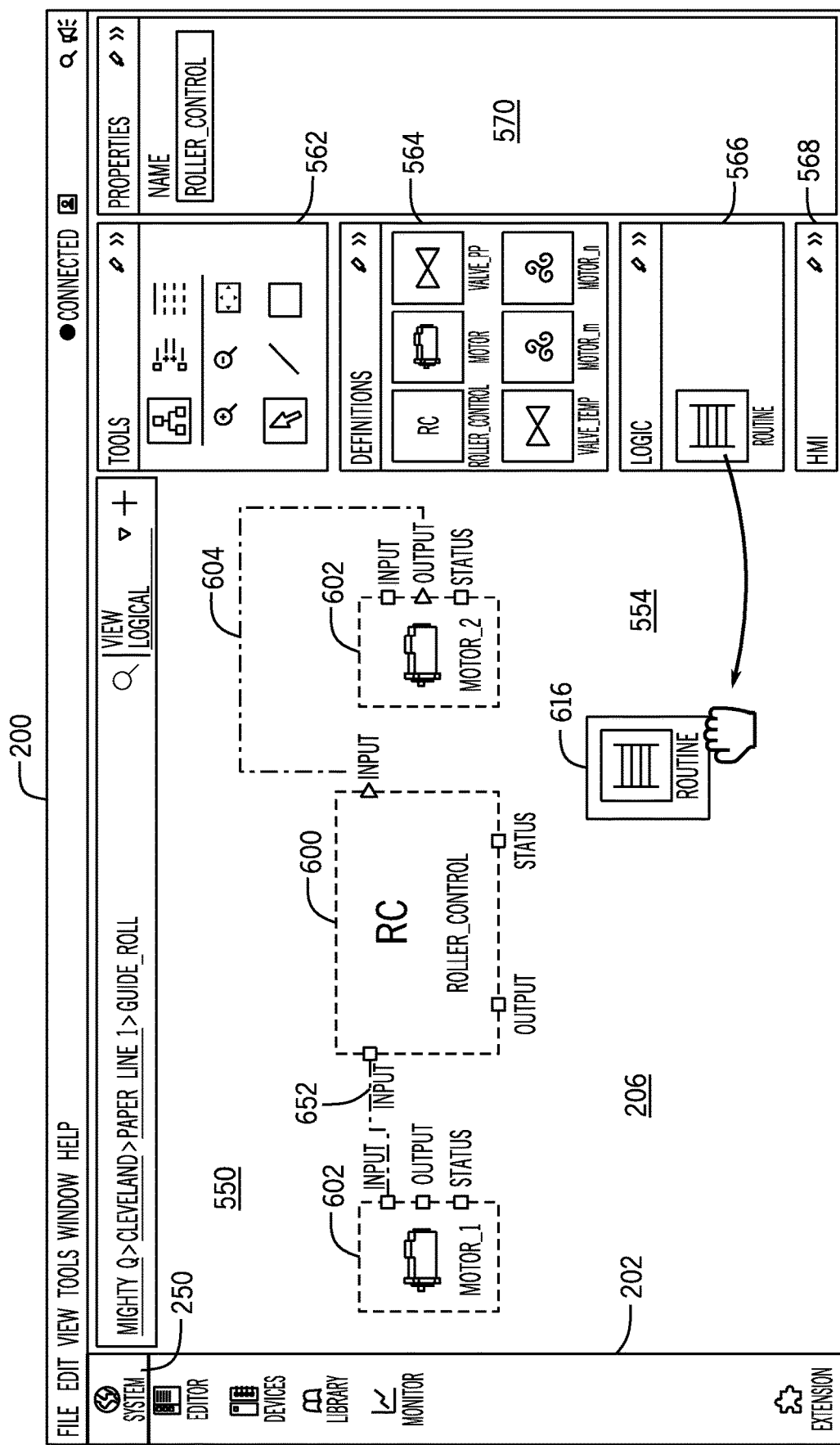
Figure 21:
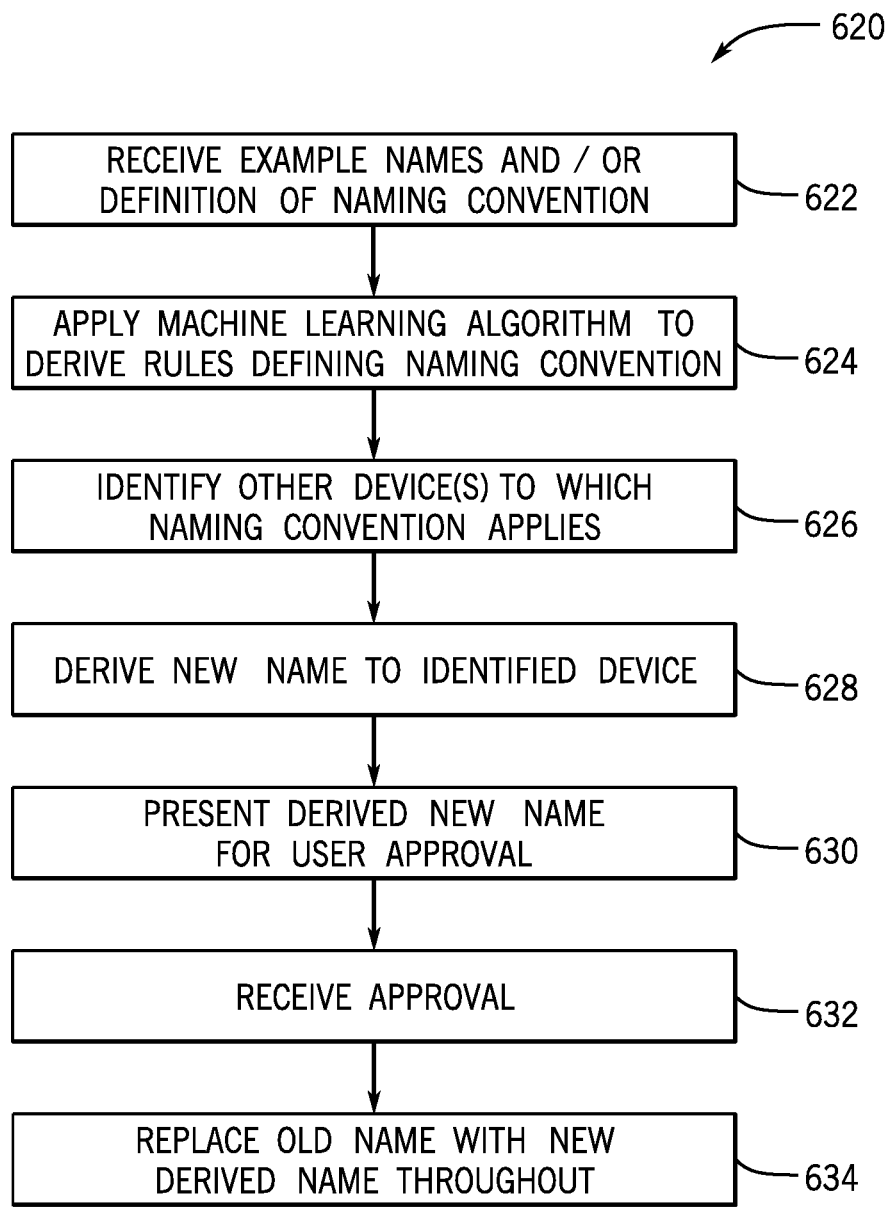
Figure 22:
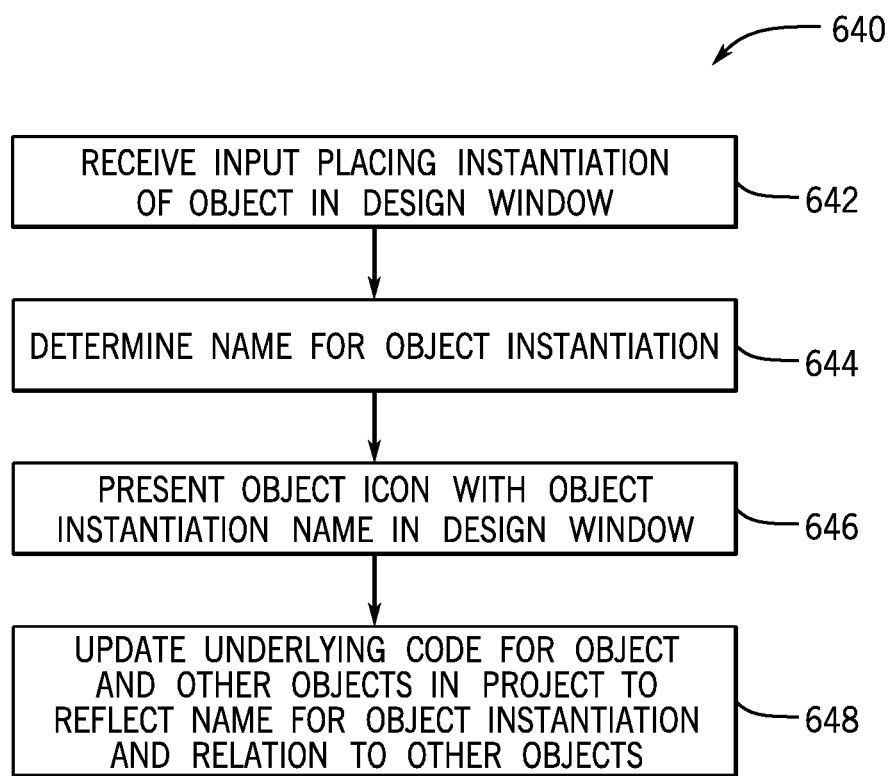
Figure 23:
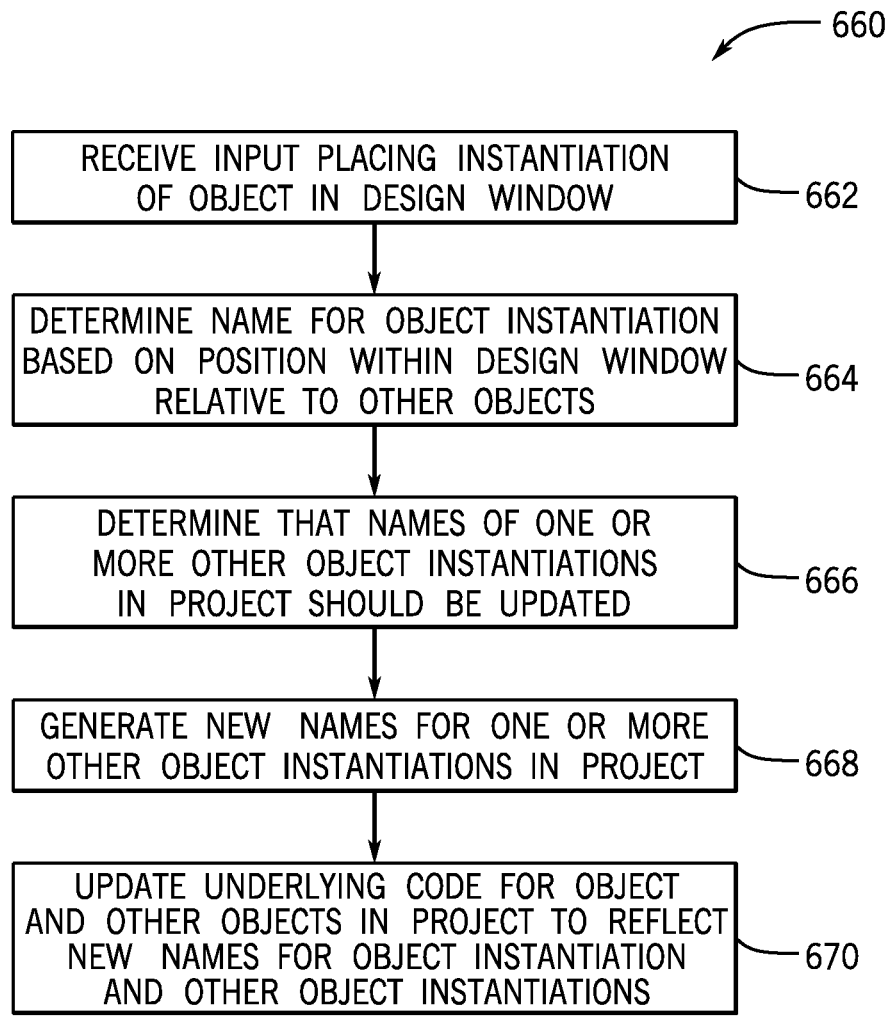
Figure 24:
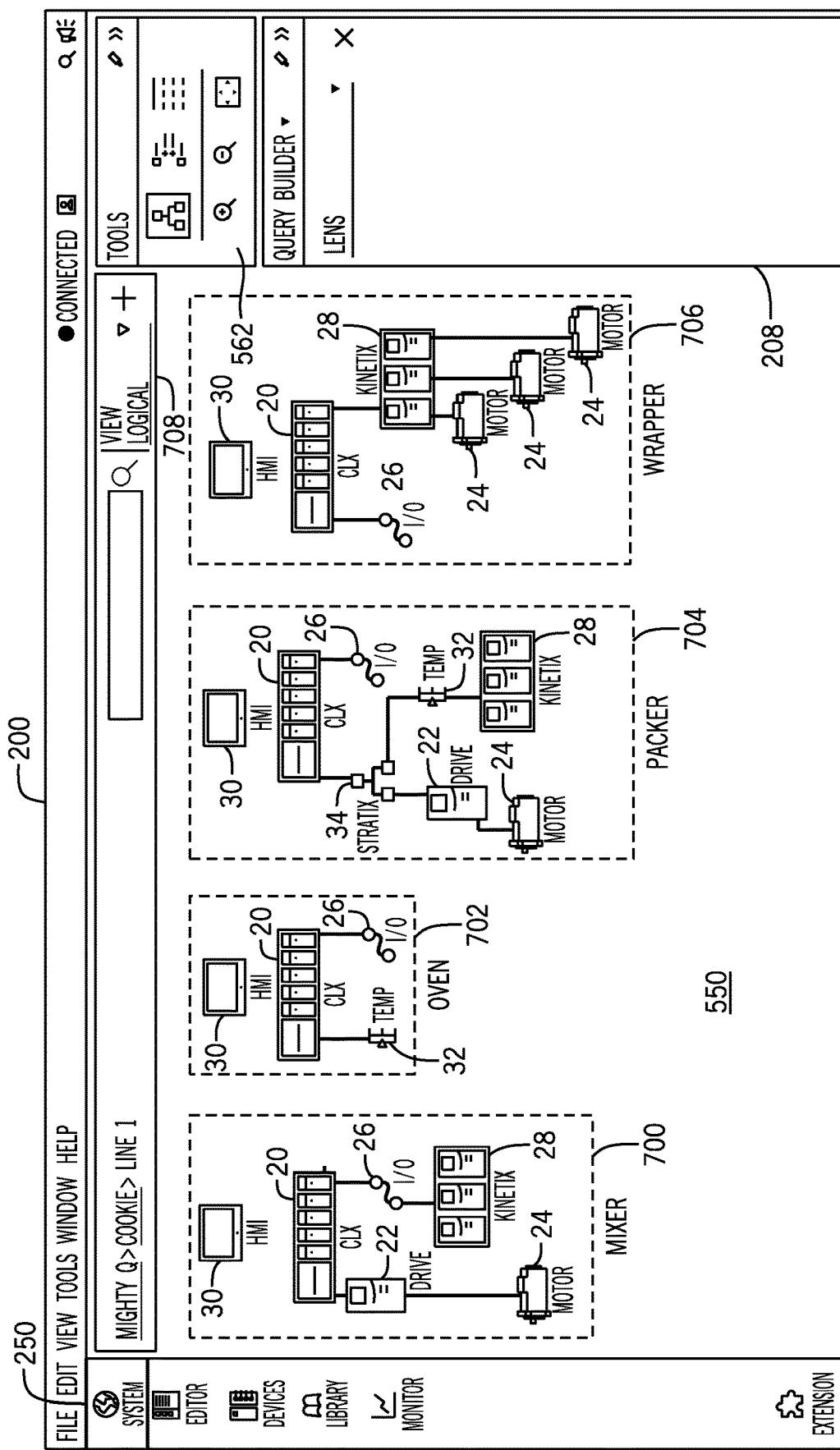
Figure 25:
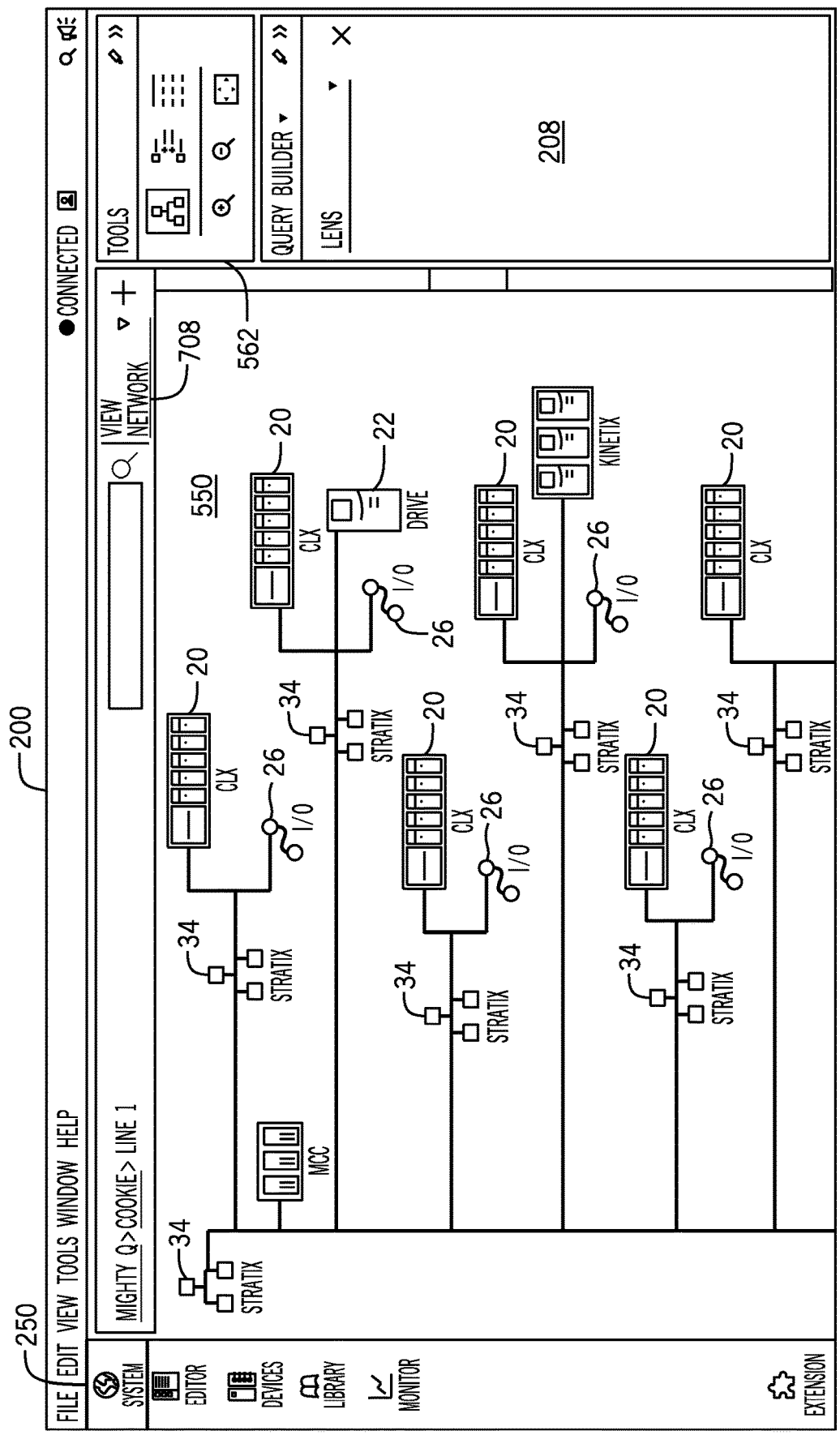
Figure 26:
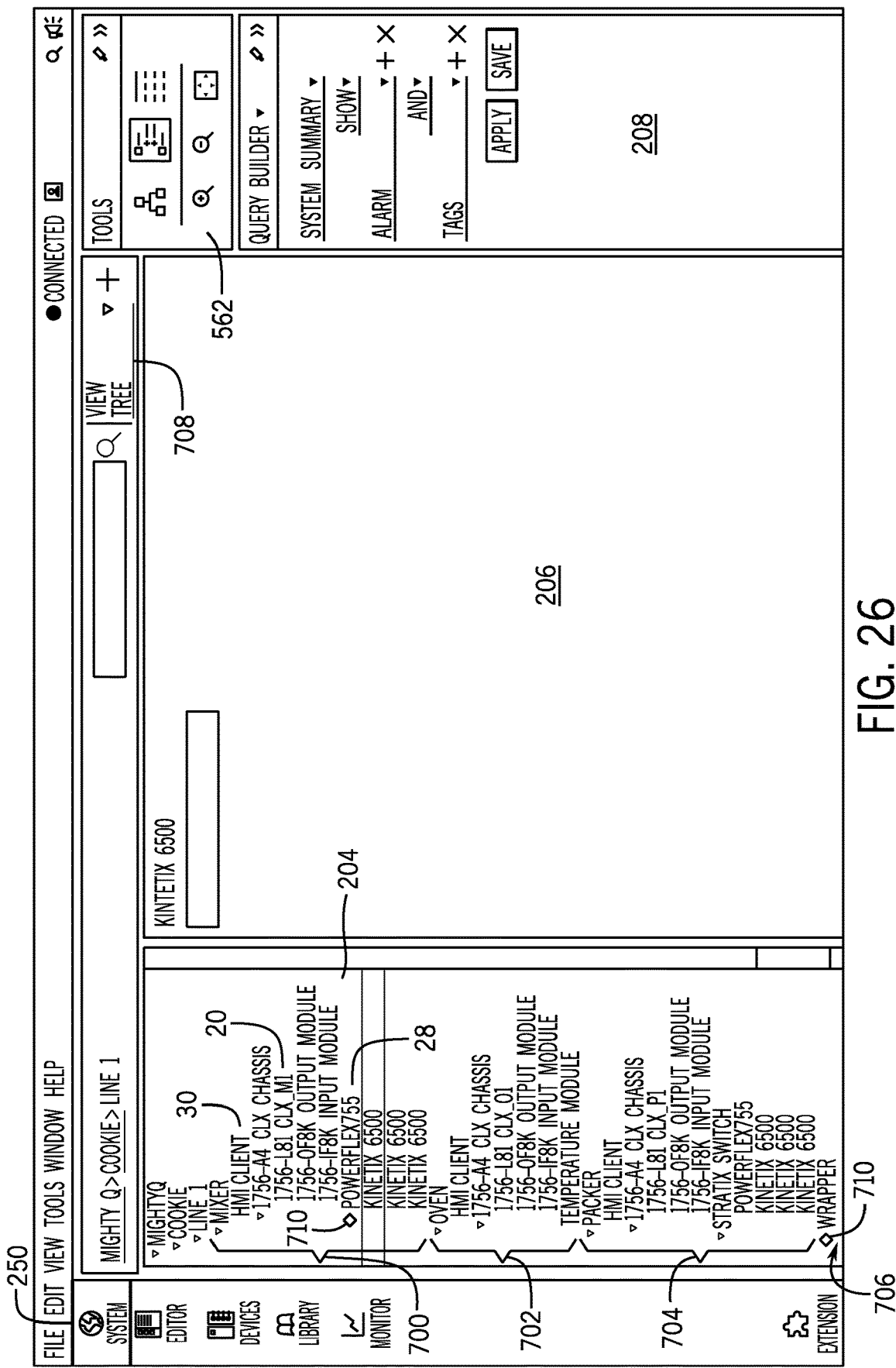
Figure 27:
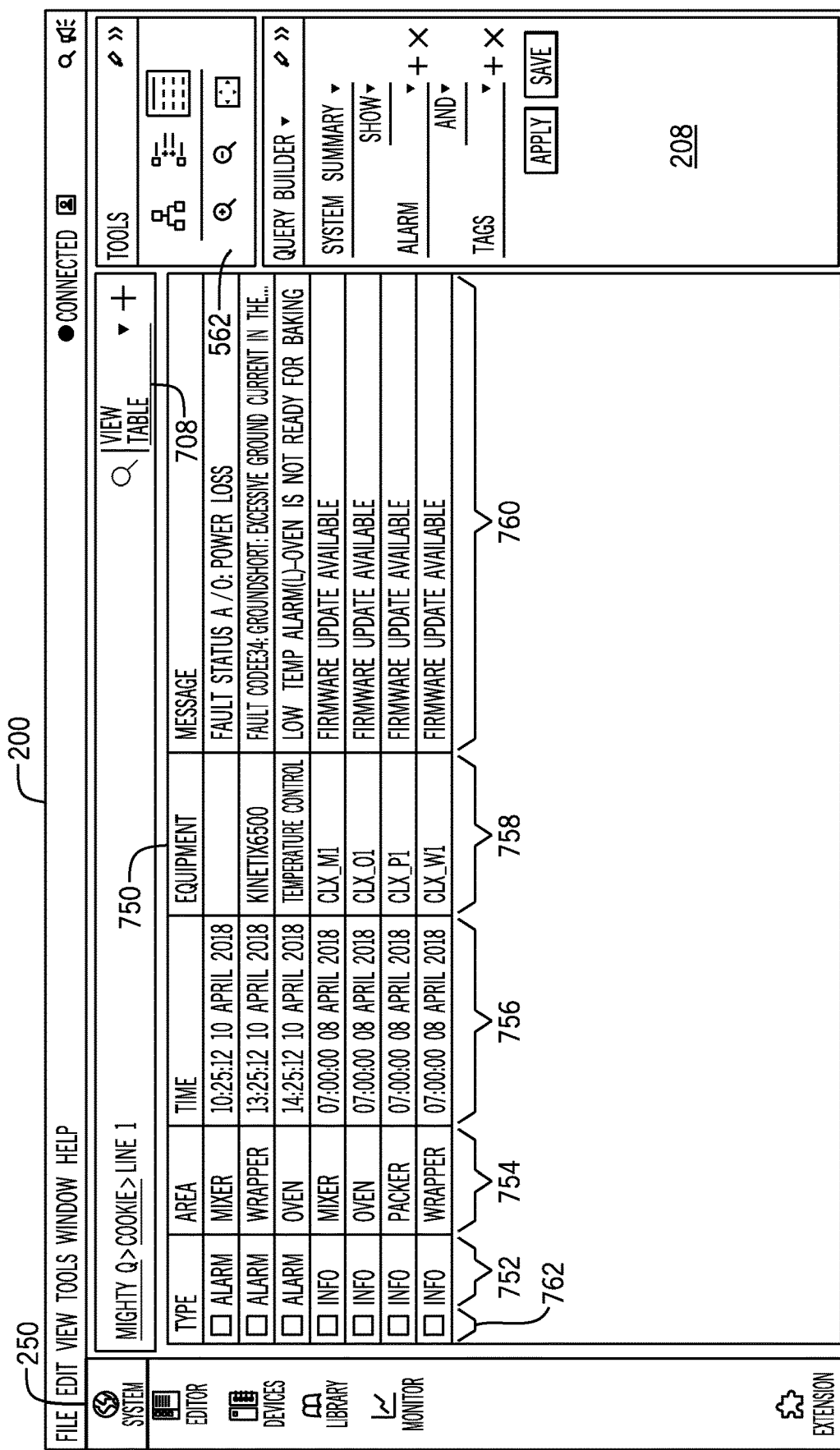
Figure 28:
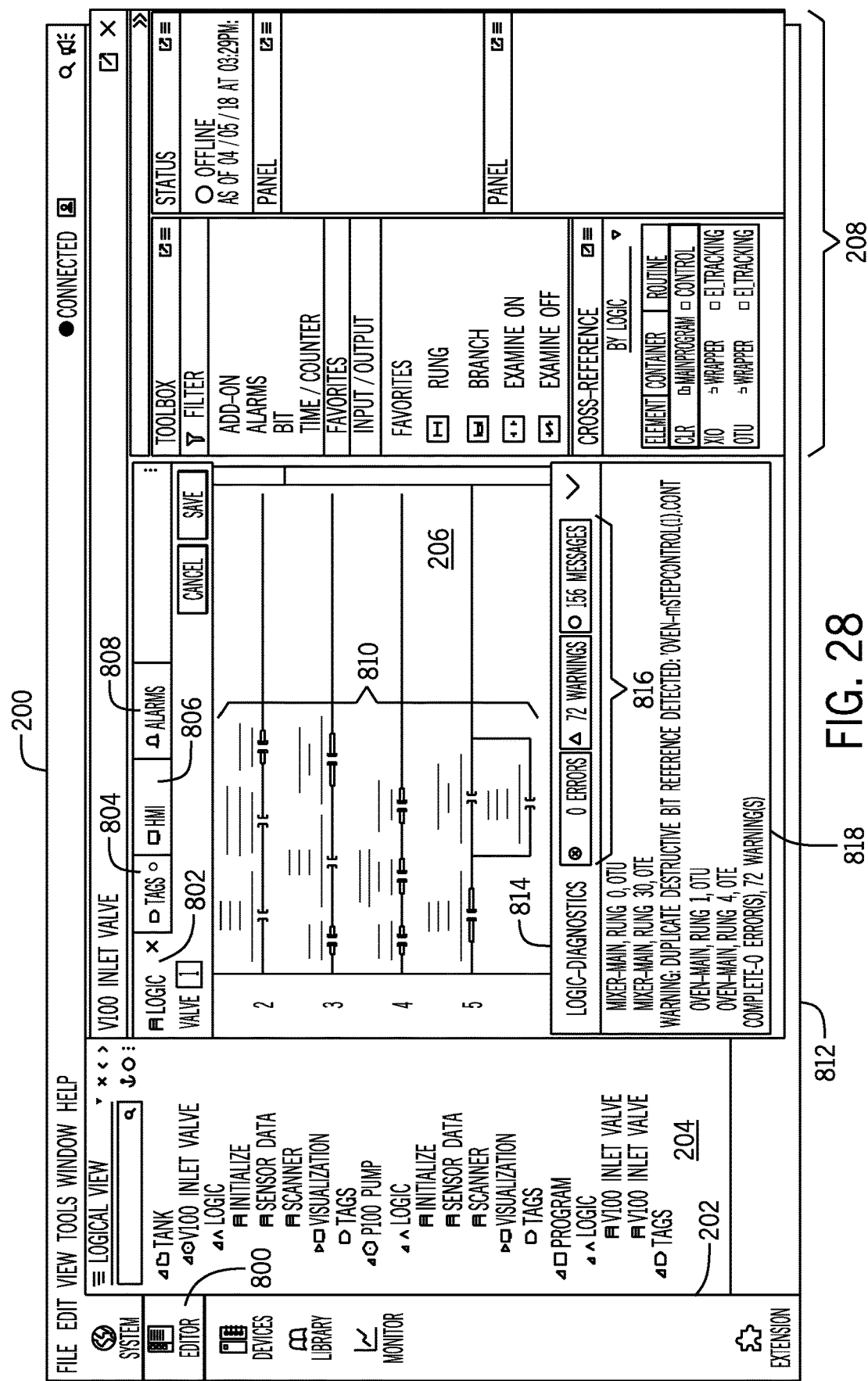
Figure 29:
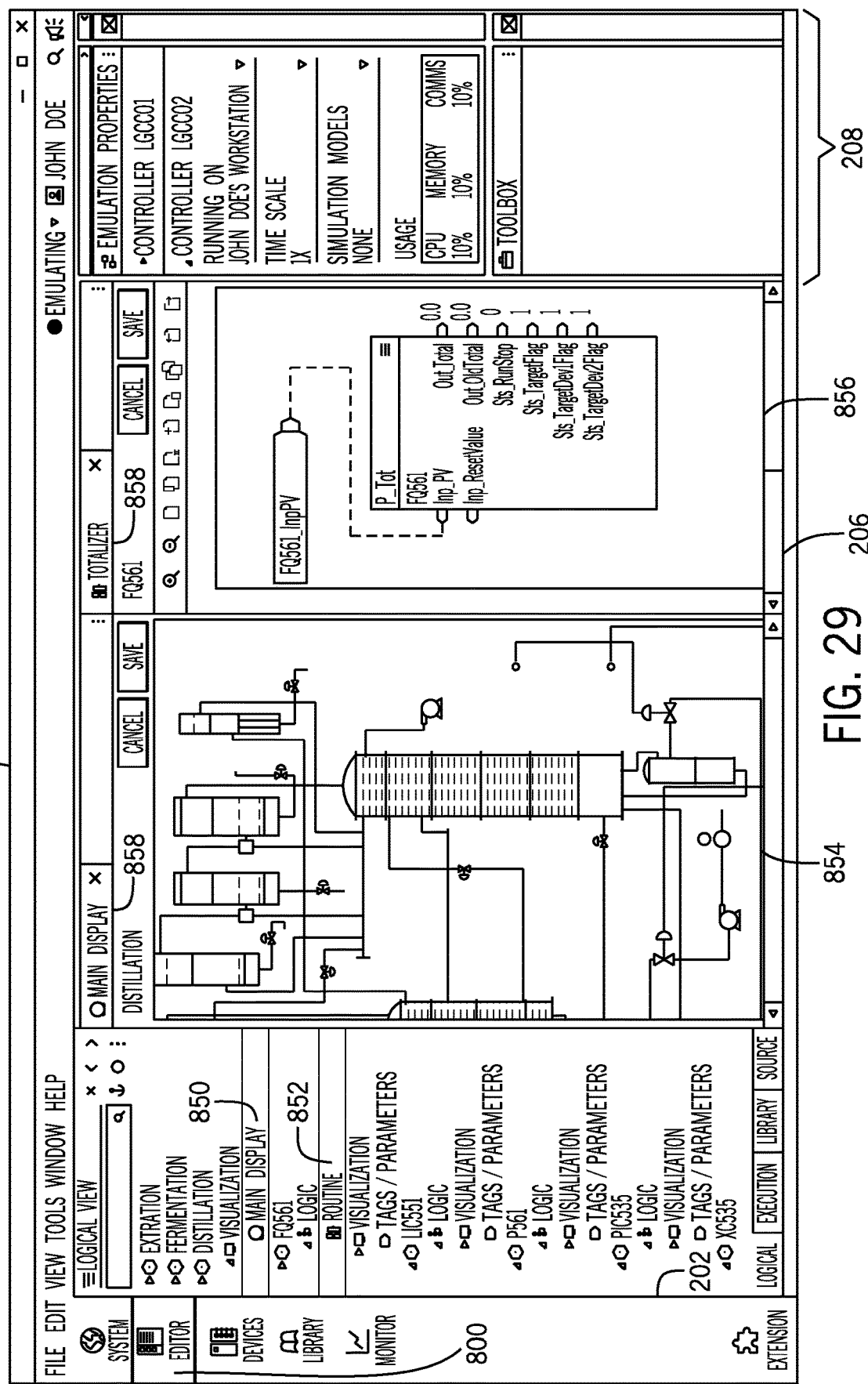
Figure 30:
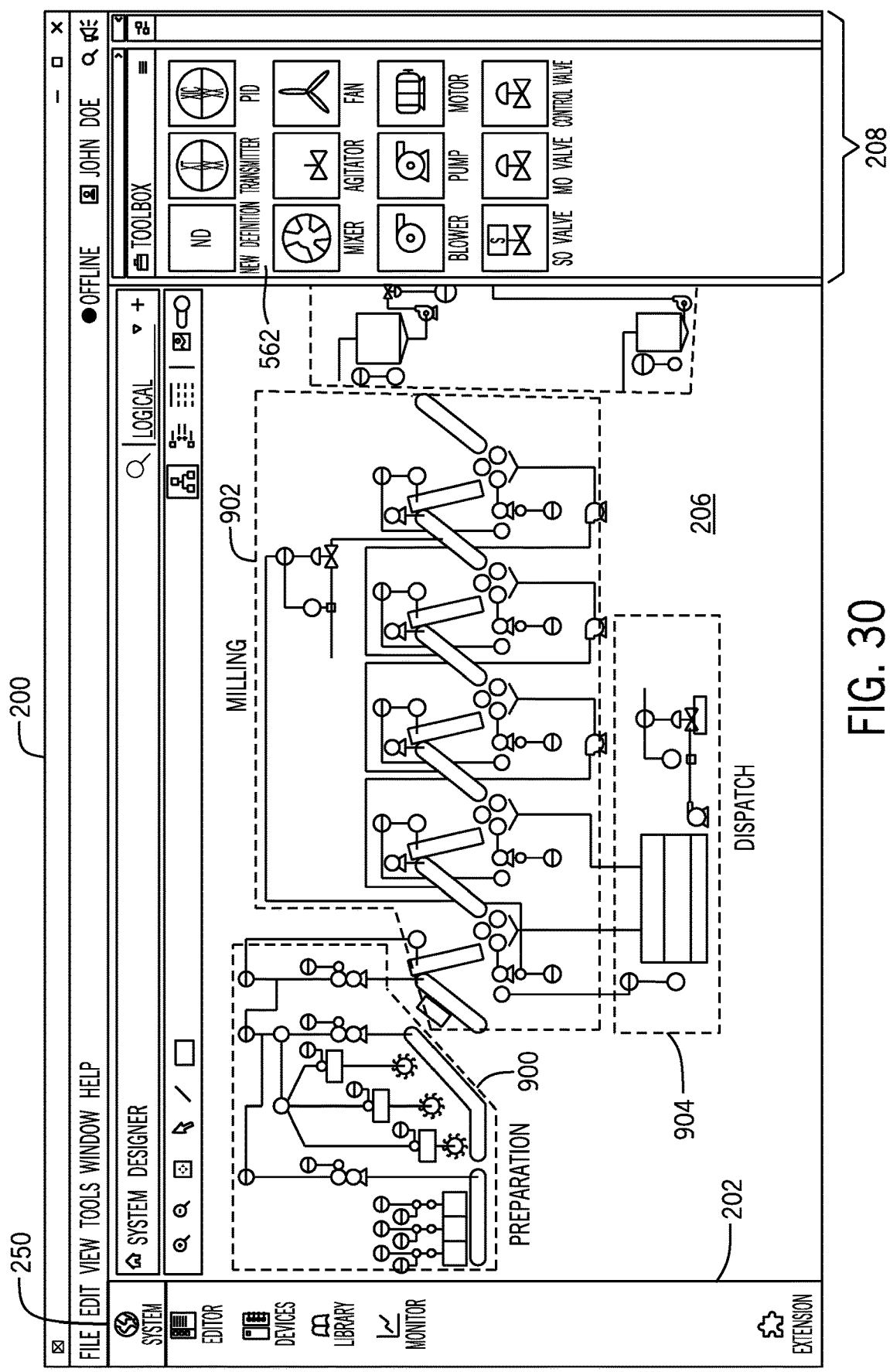
Figure 31:
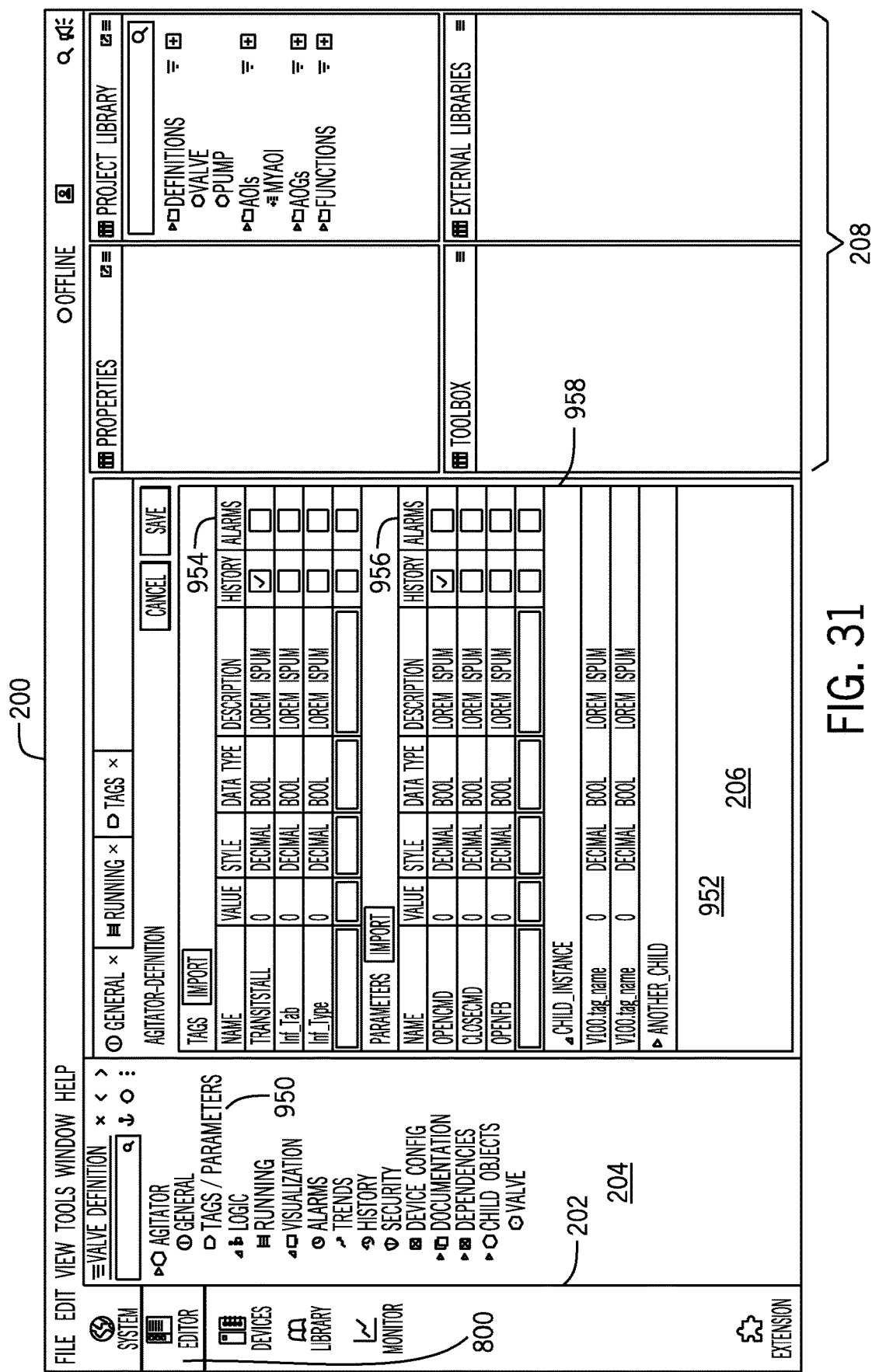
Figure 32:
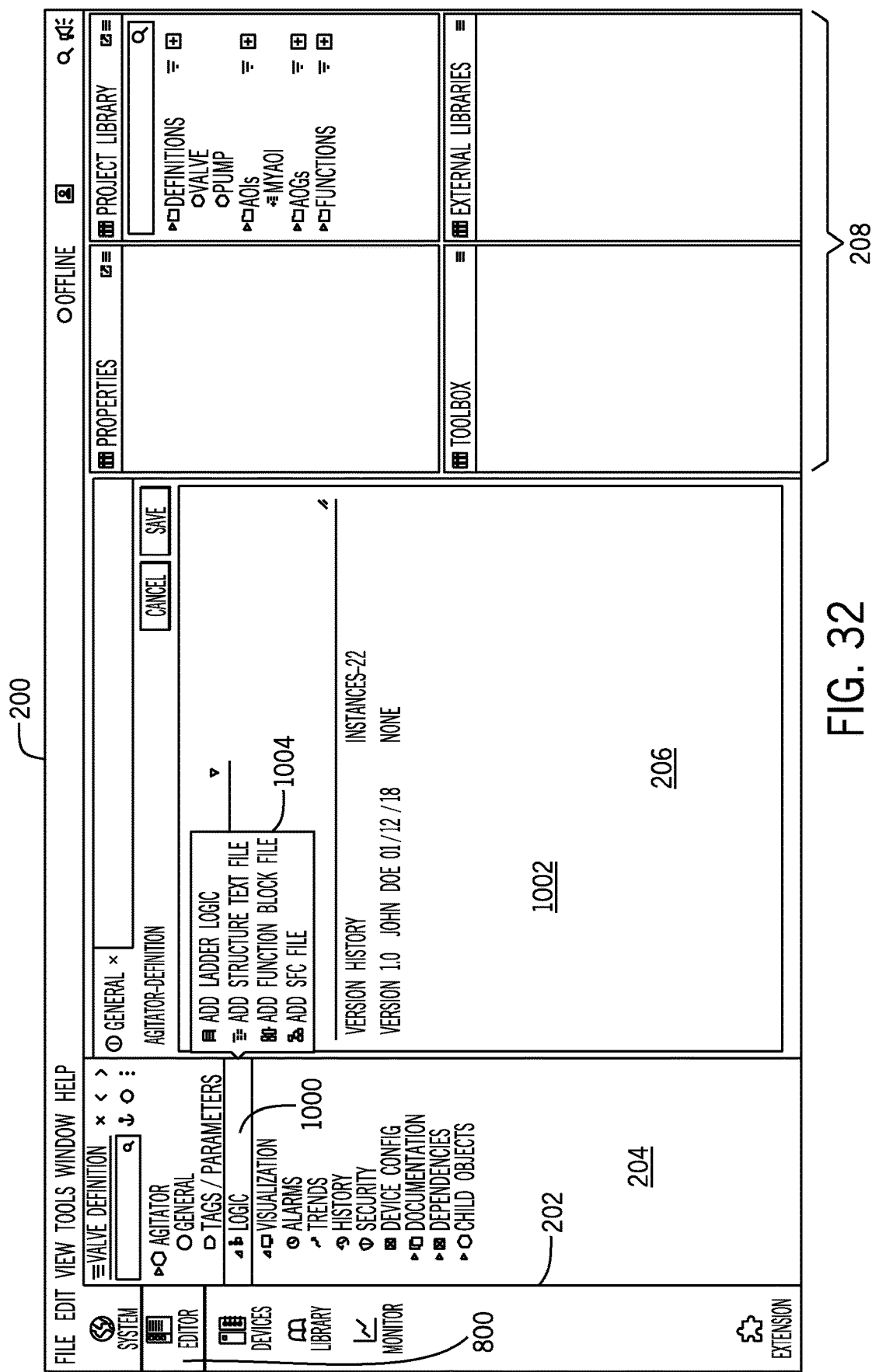
Figure 33:
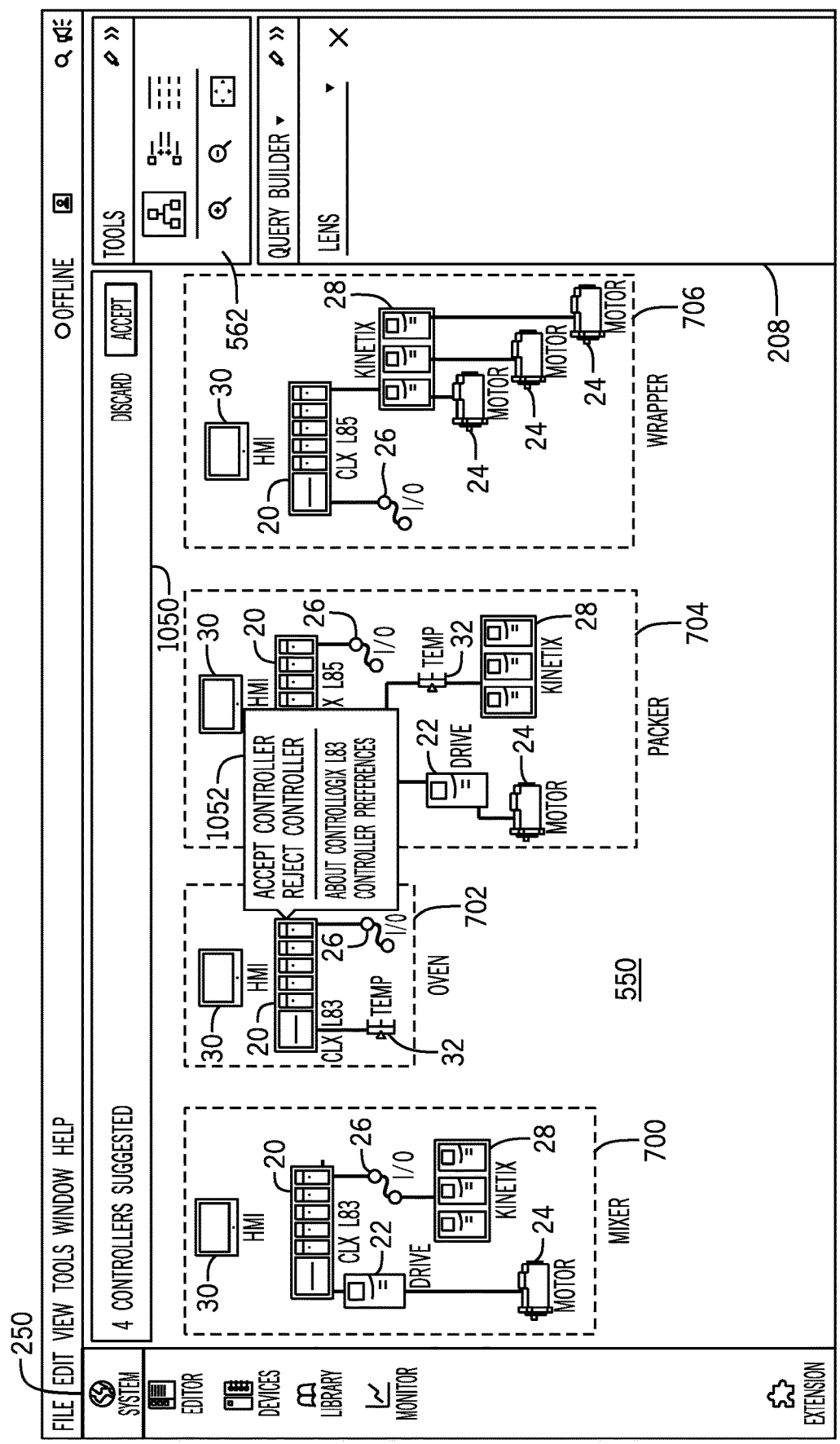
Figure 34:
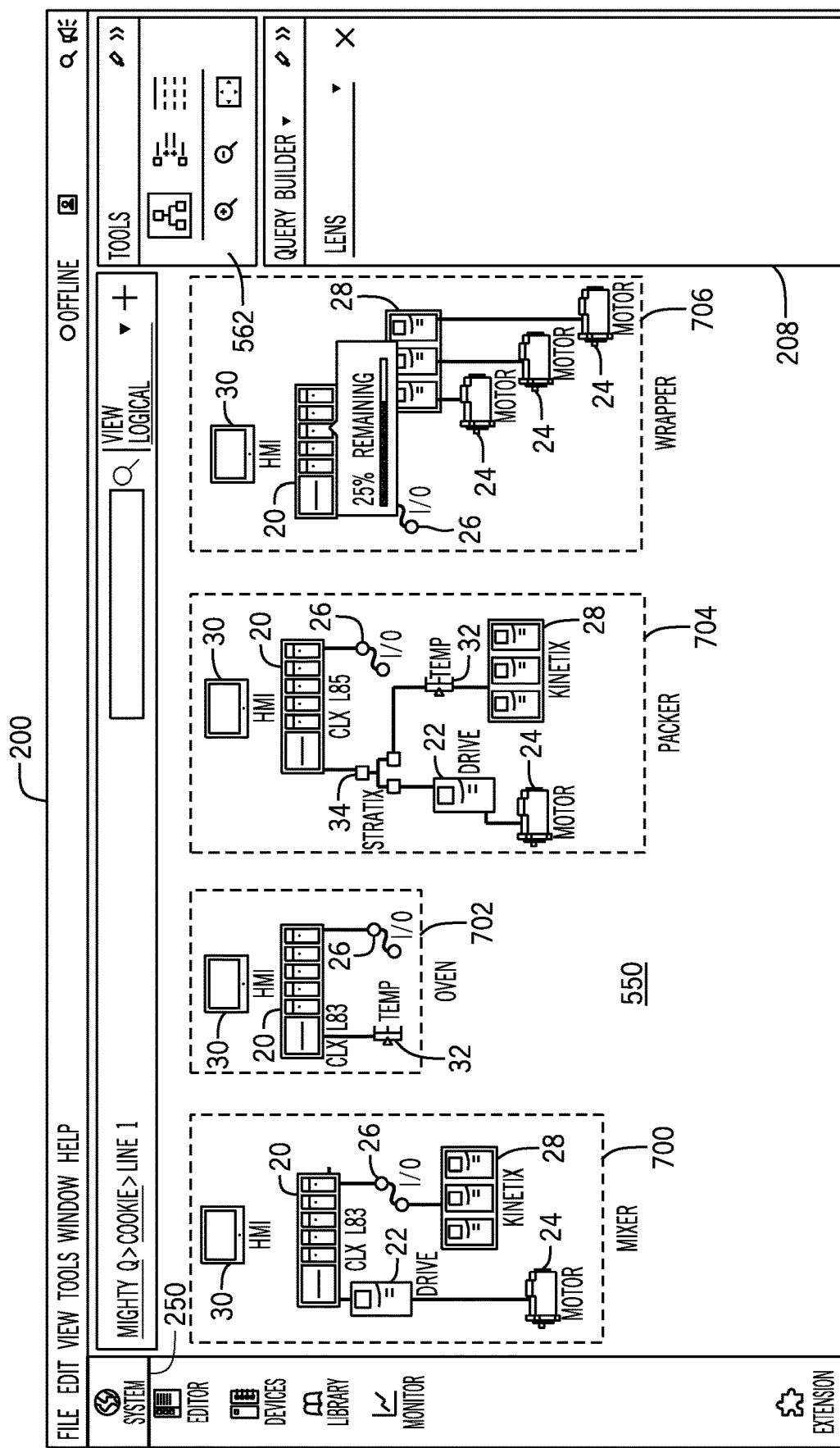
Figure 35:
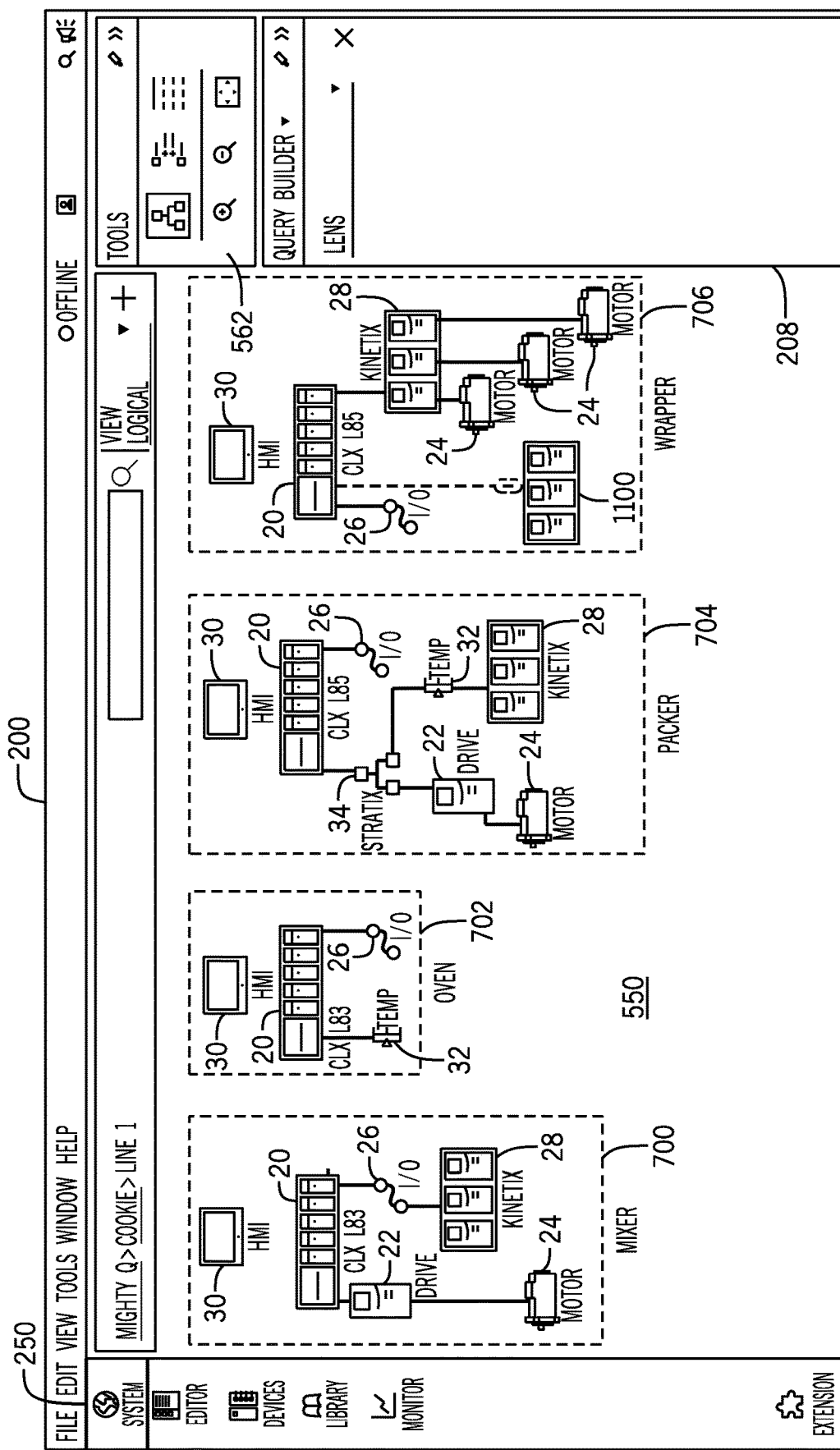
Figure 36:
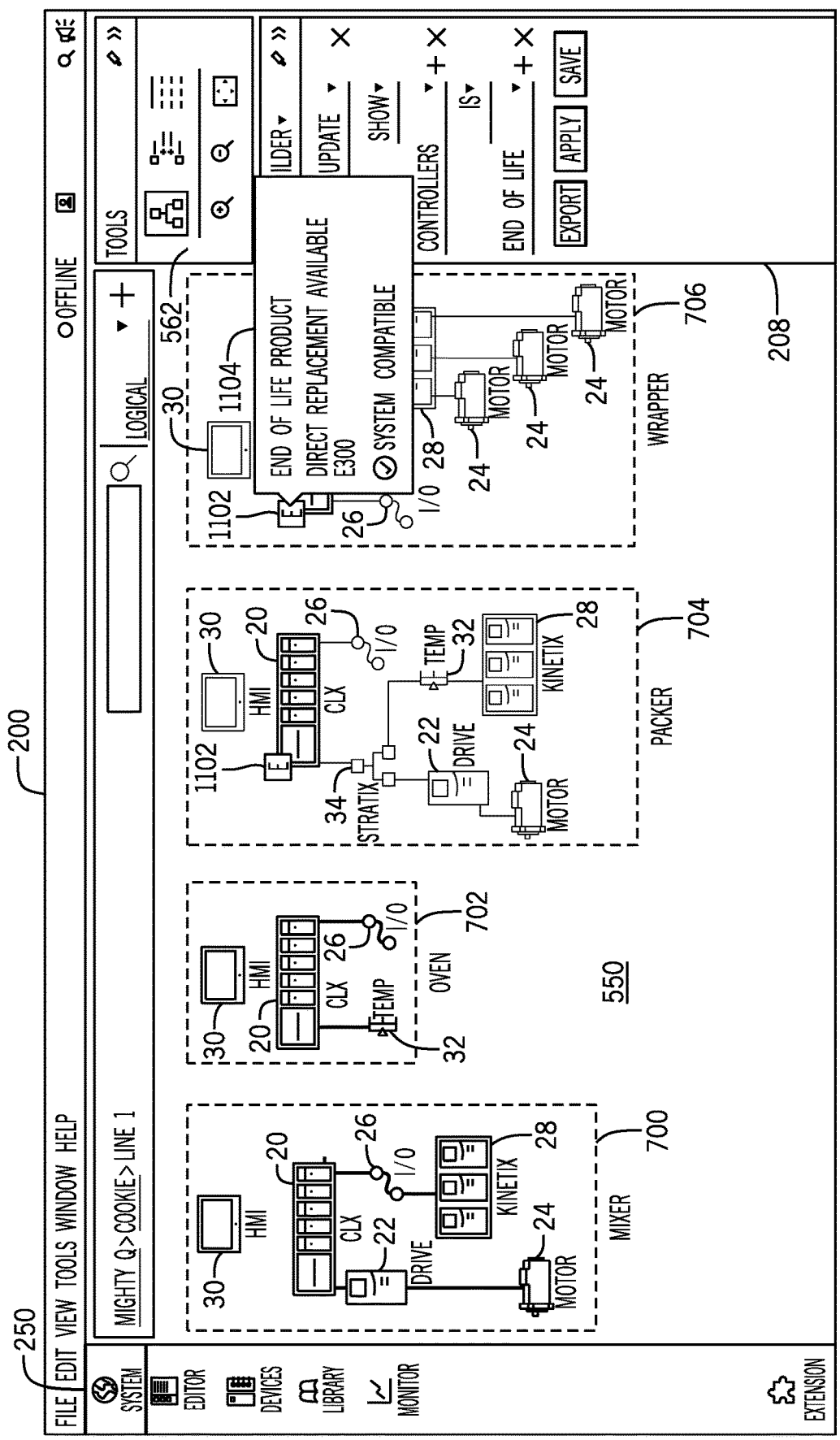
Figure 37:
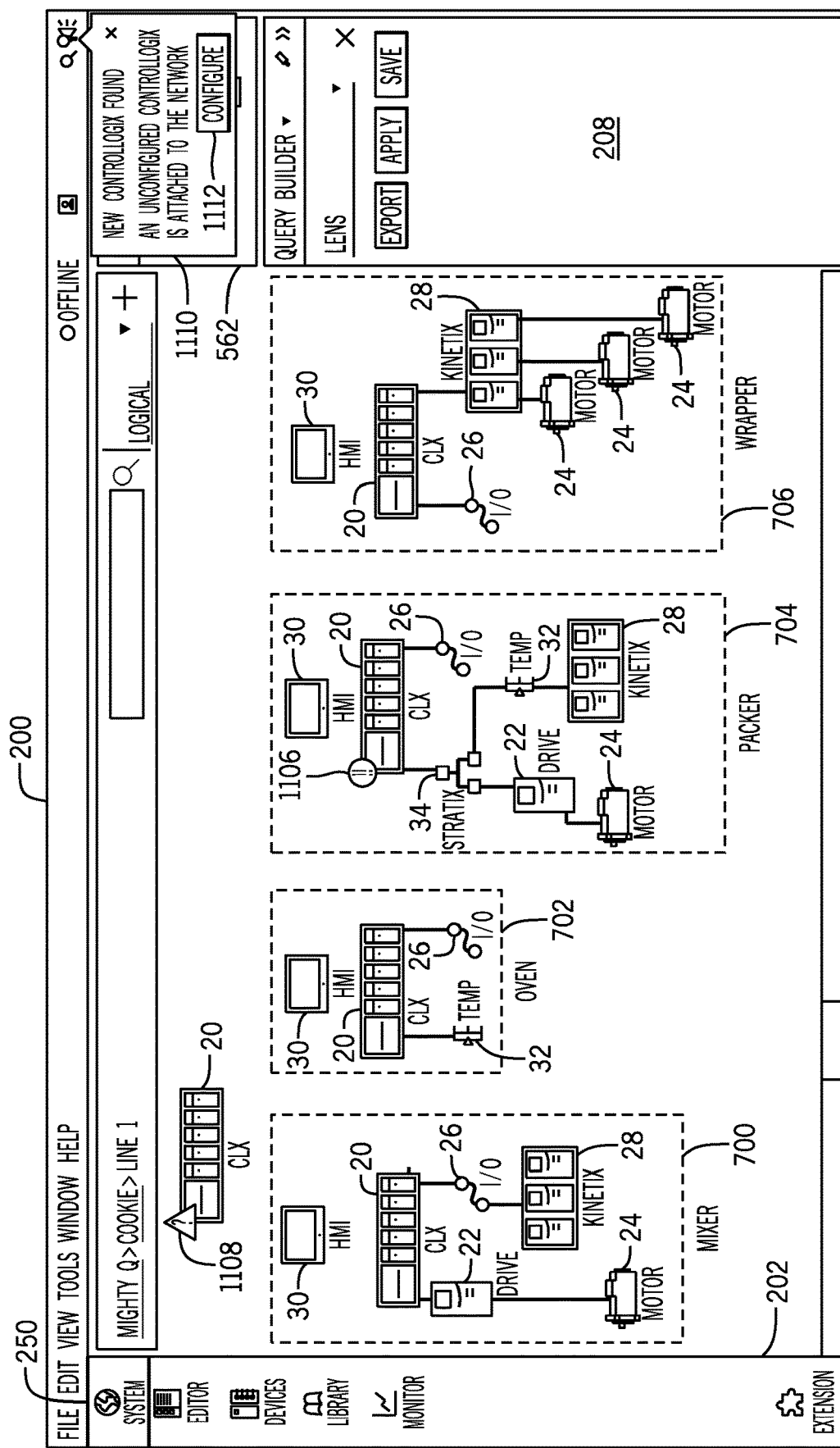
Figure 38:
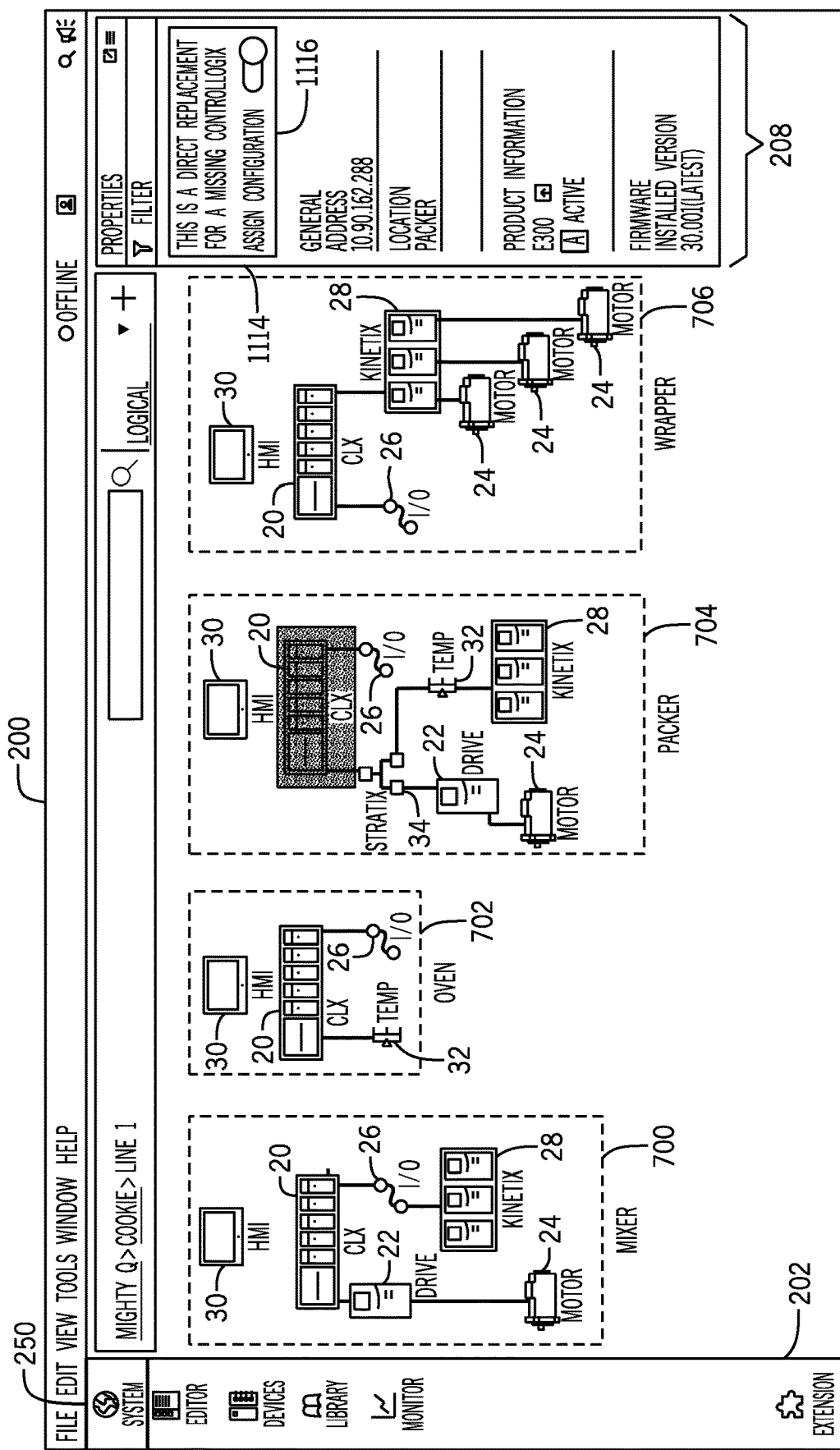
Figure 39:
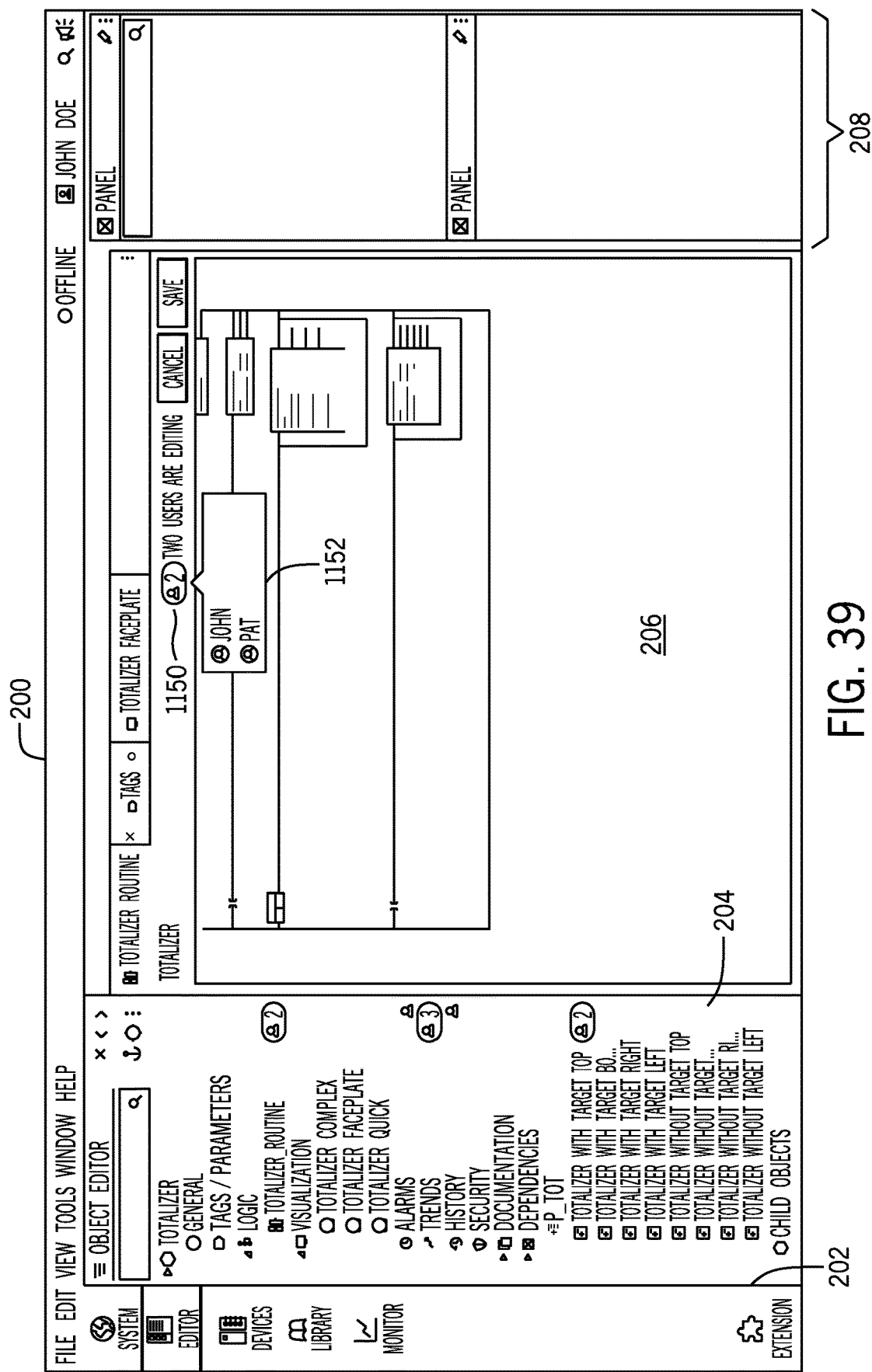
Figure 40:
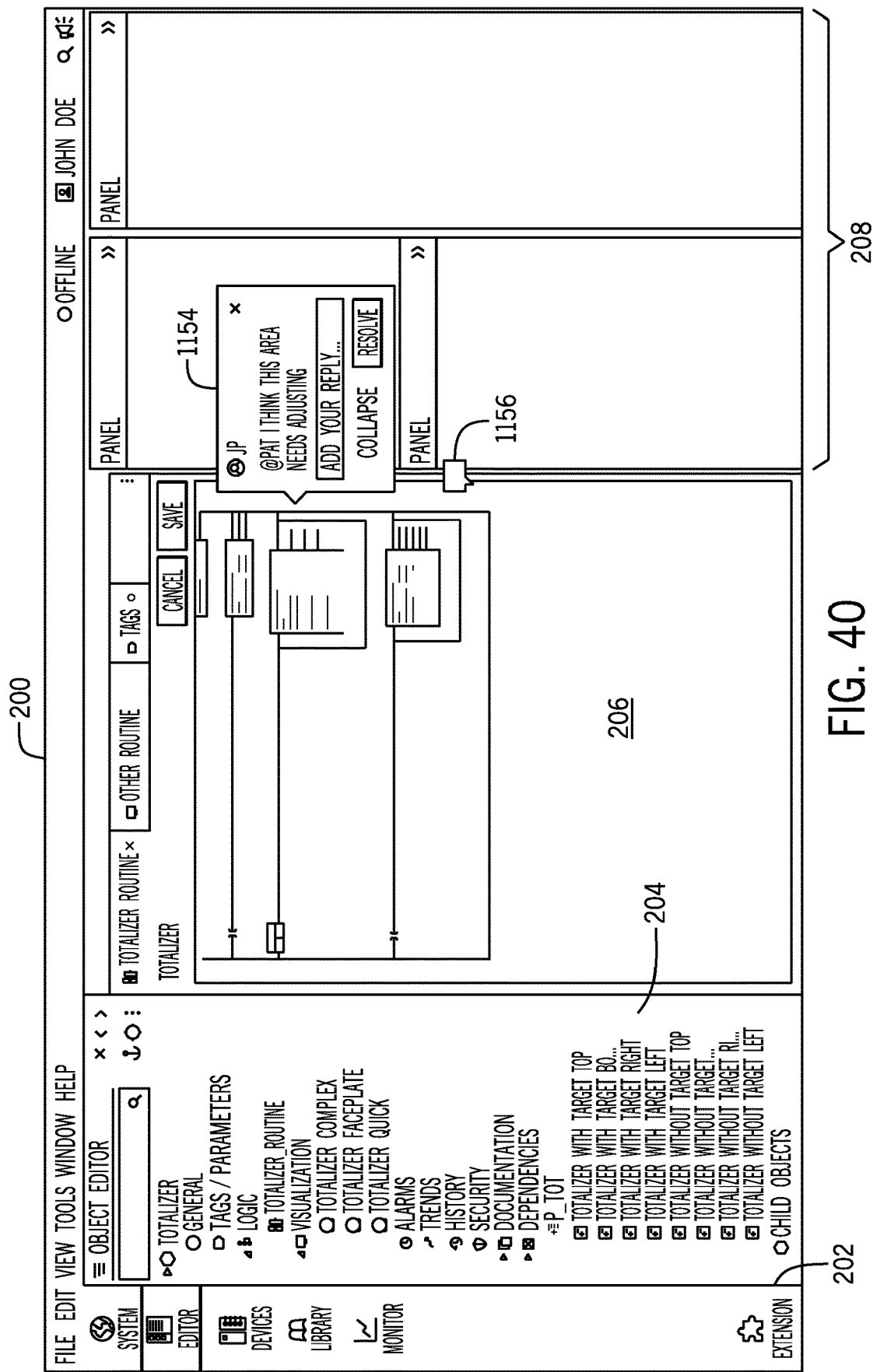
Figure 41:
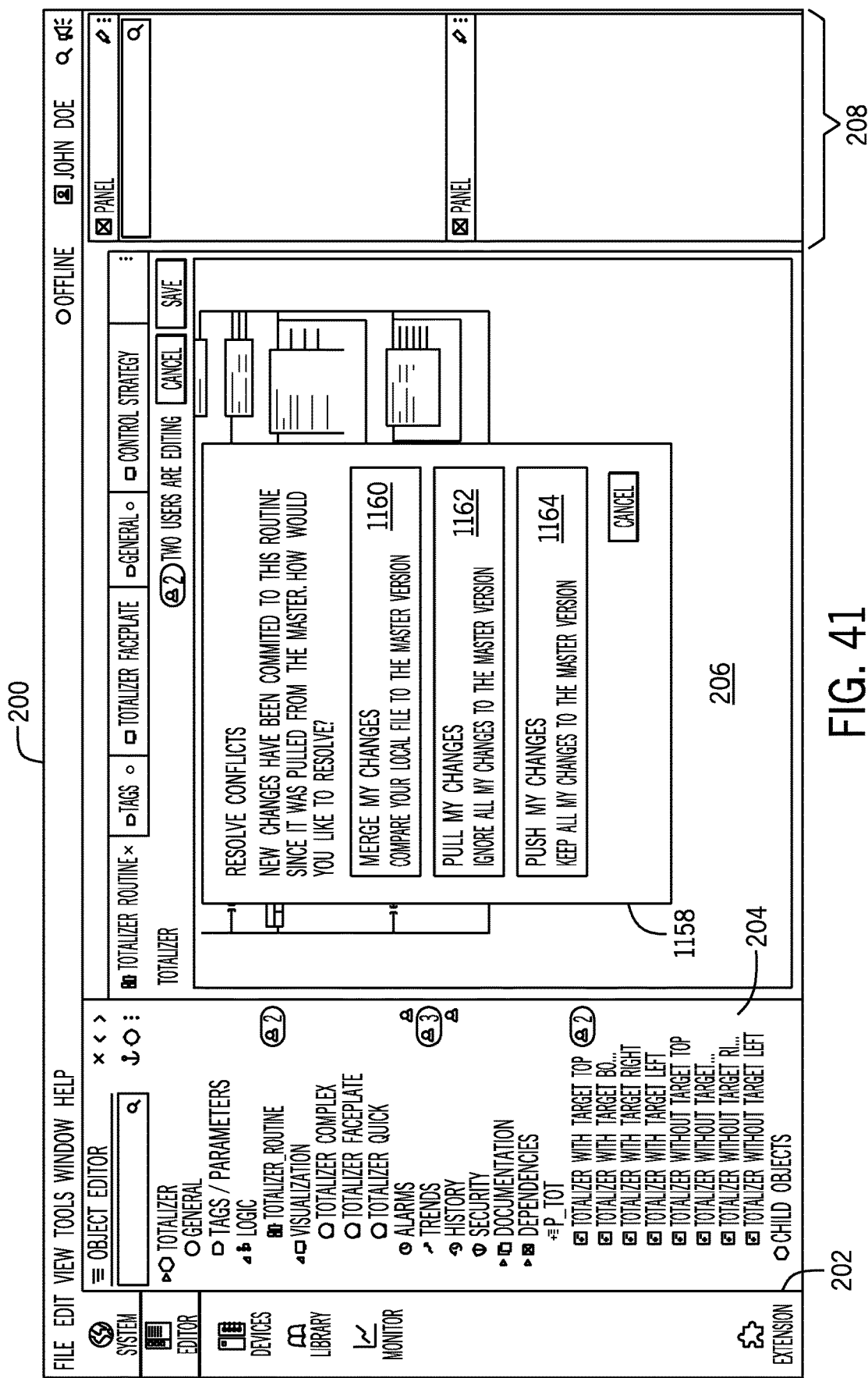
Figure 42:
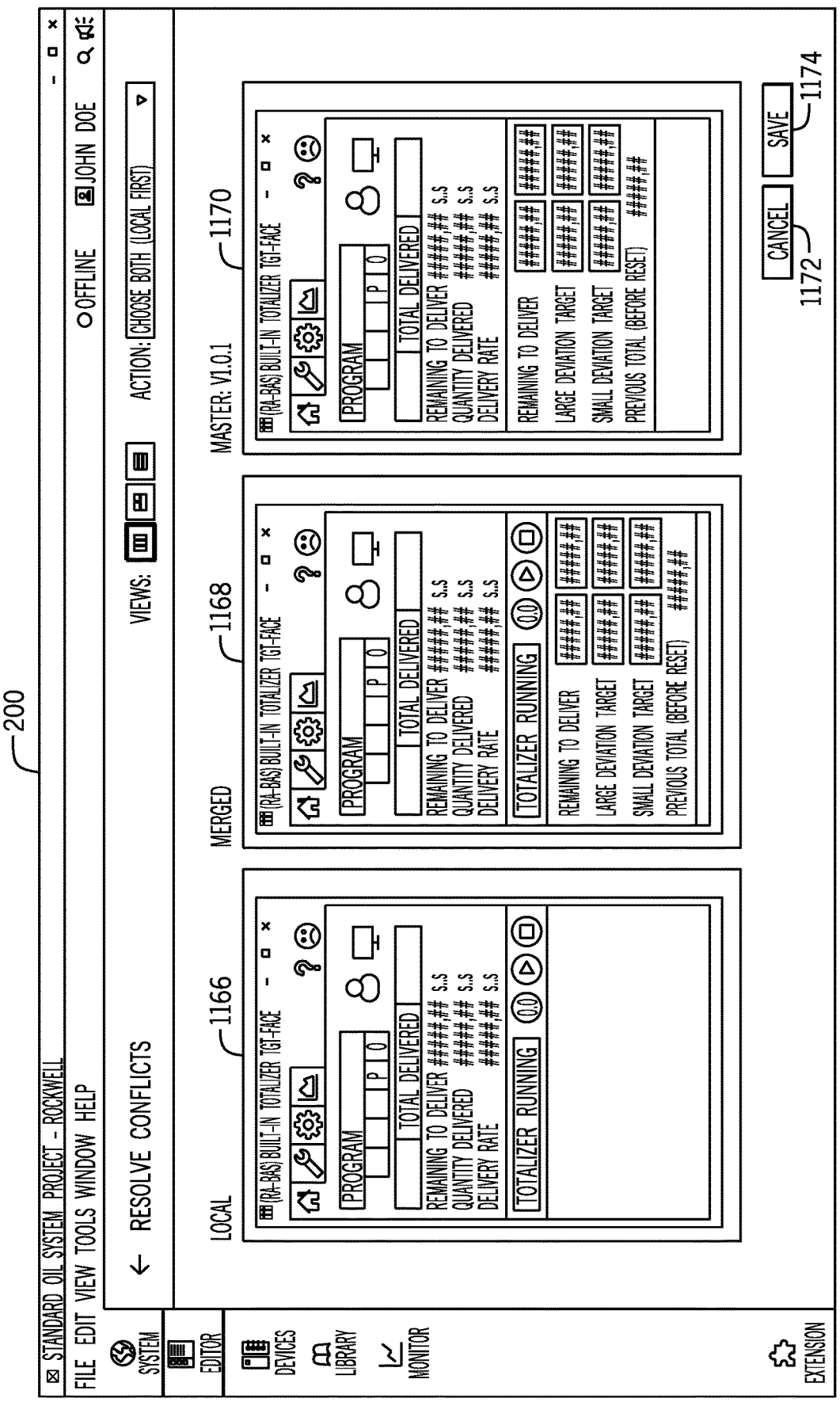
Figure 43:
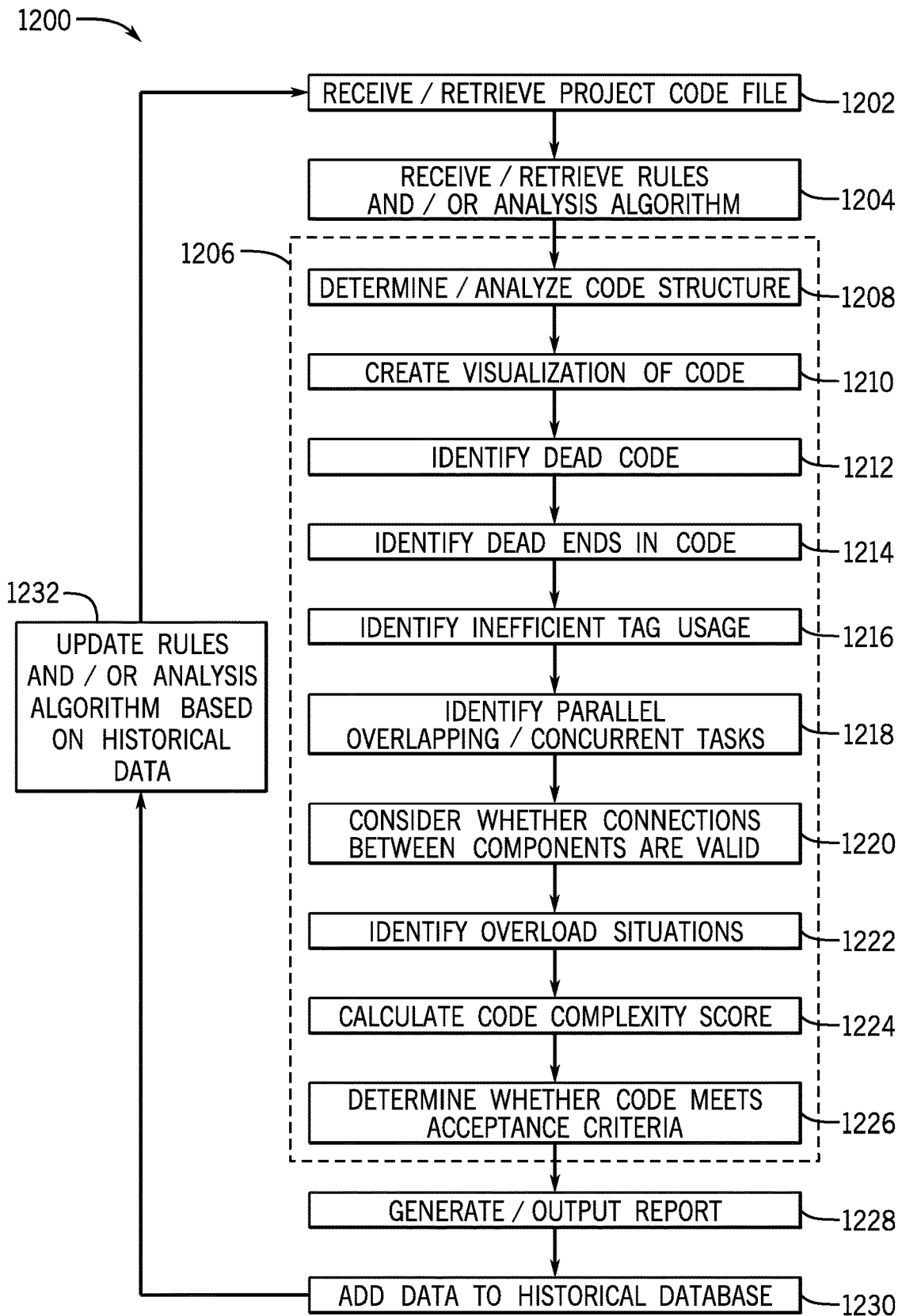
Figure 44:
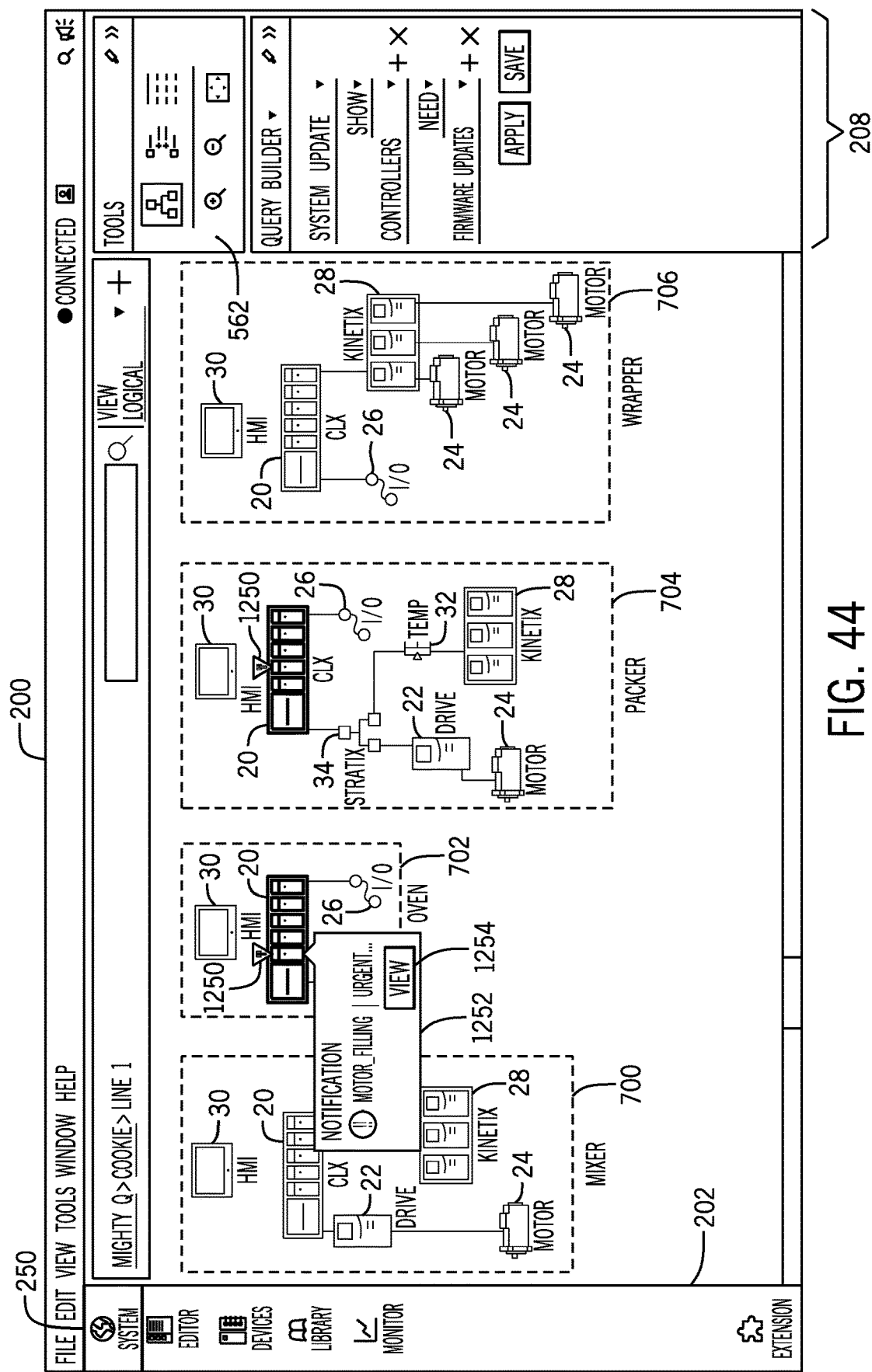
Figure 45:
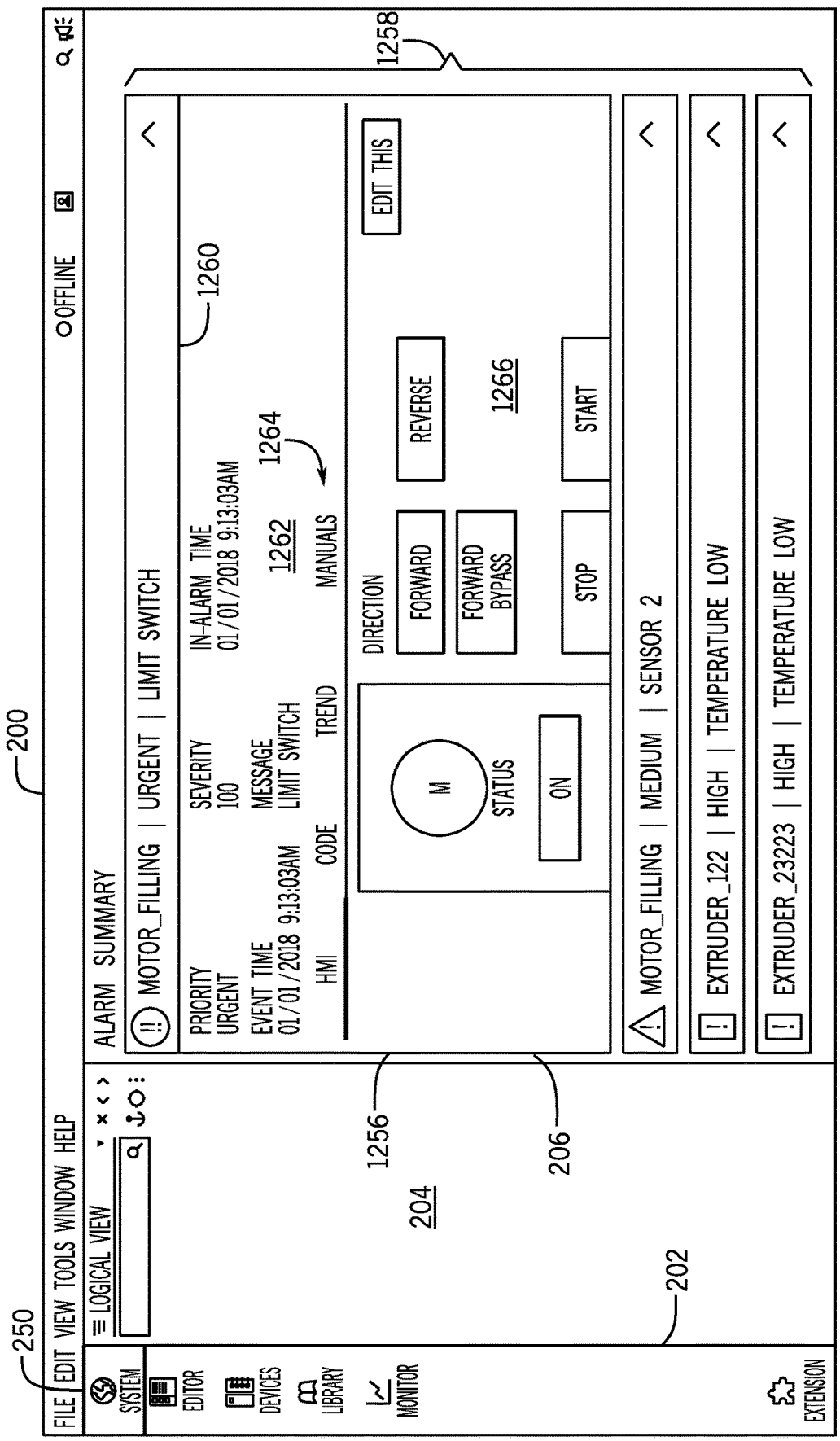
Figure 46:
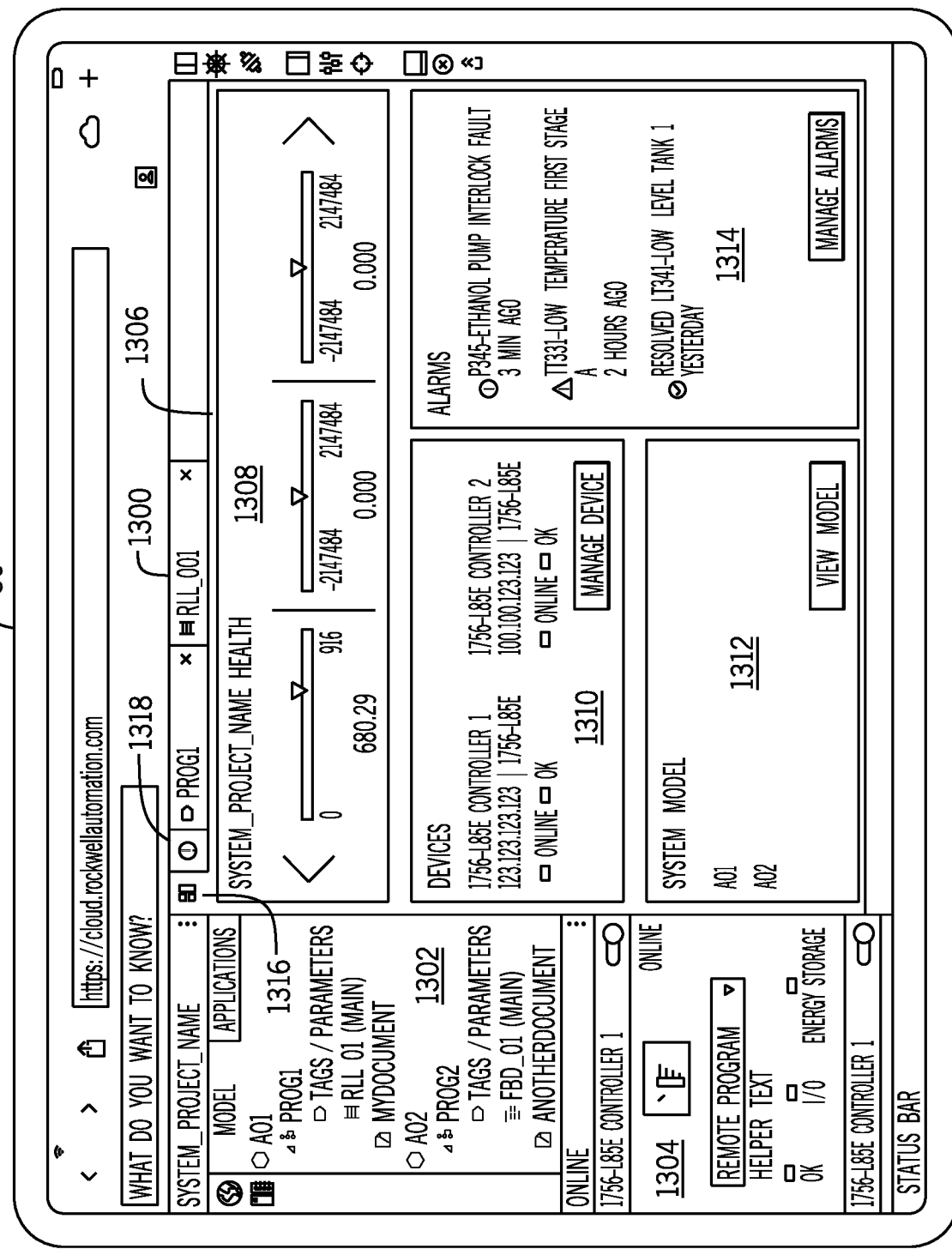
Figure 47:
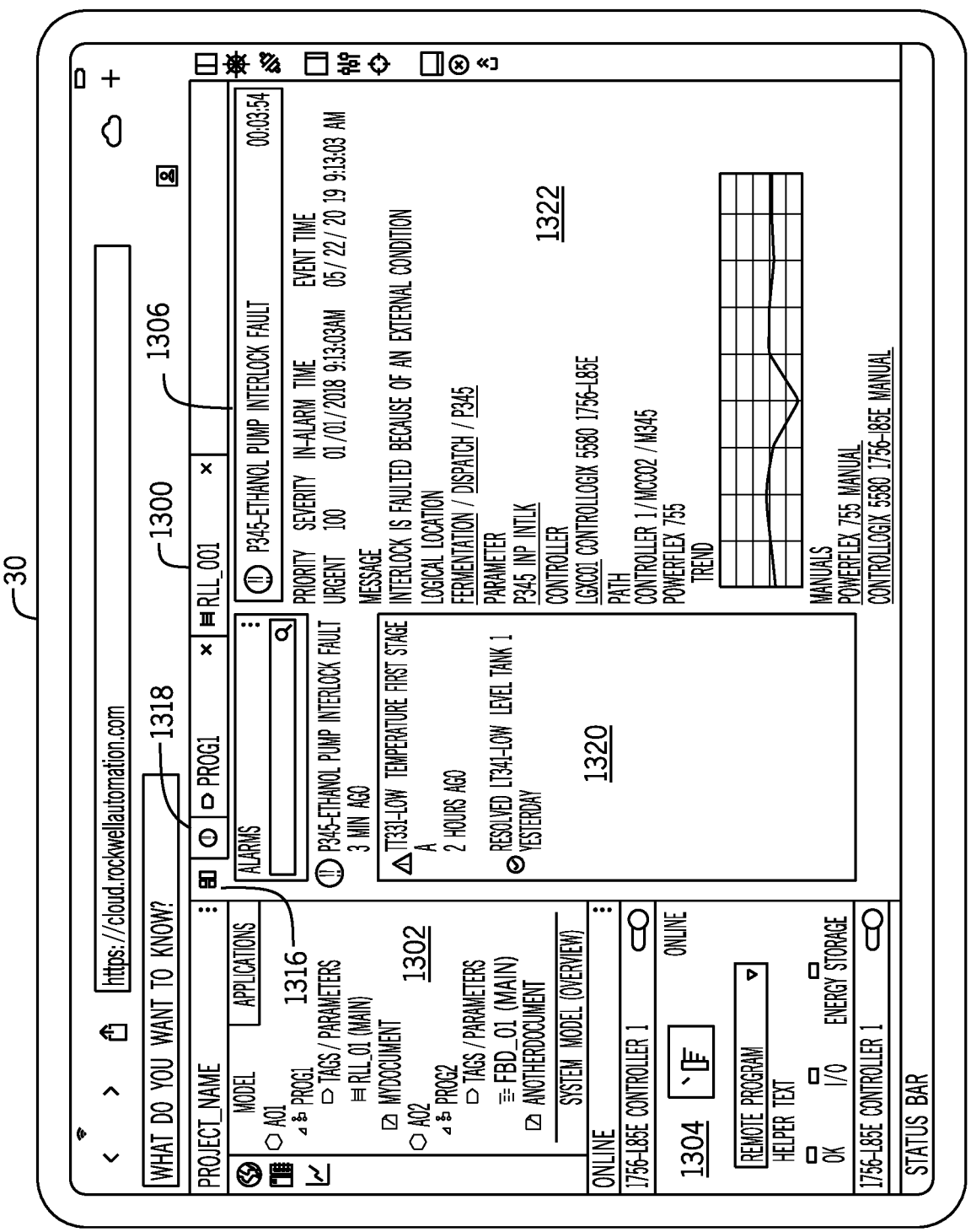
Figure 48:
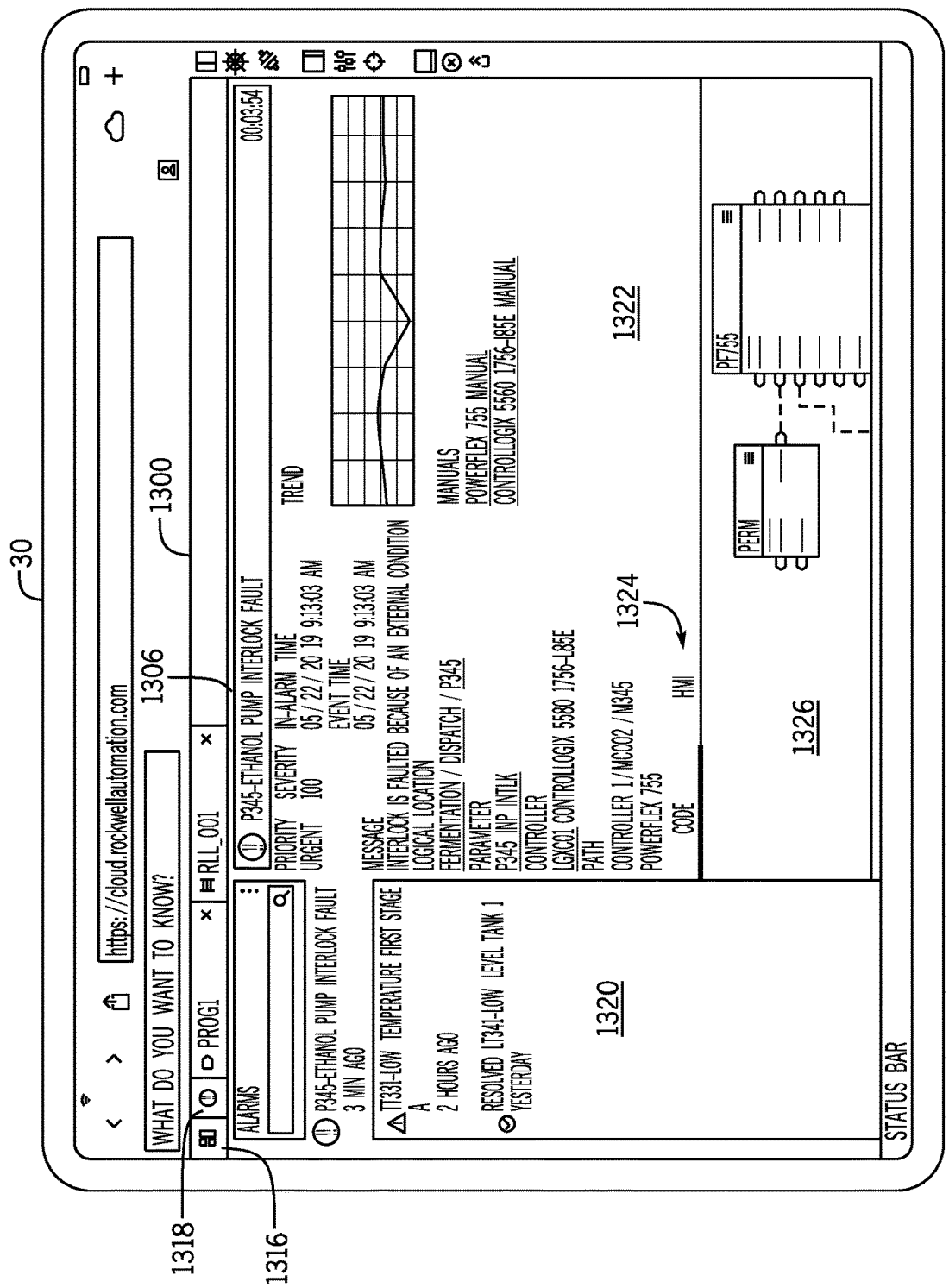

FIG. 6B is a screenshot of the explorer window 204 when the application tab 258 is selected from the vertical navigation bar 202, in accordance with embodiments presented herein;

FIG. 6C is a screenshot of the explorer window when a devices tab is selected from the vertical navigation bar, in accordance with embodiments presented herein;

FIG. 6D is a screenshot of the explorer window when a library tab is selected from the vertical navigation bar, in accordance with embodiments presented herein;

FIG. 6E is a screenshot of the explorer window when an extensions tab is selected from the vertical navigation bar, in accordance with embodiments presented herein;

FIG. 7 is a screenshot of a design-time environment dashboard when a user begins creation of a new project, in accordance with embodiments presented herein;

FIG. 8 is a screenshot of the design-time environment dashboard when a user opens an existing project, in accordance with embodiments presented herein;

FIG. 9 is a screenshot of a pop-up window that opens when a user selects an add device button within a devices window of the dashboard shown in FIG. 8, in accordance with embodiments presented herein;

FIG. 10 is a screenshot of the dashboard showing various libraries when a library tab is selected from a vertical navigation bar, in accordance with embodiments presented herein;

FIG. 11 is a screenshot of the dashboard showing a service provider library when a service provider library tab is selected, in accordance with embodiments presented herein;

FIG. 12 is a detailed item view for a temperature sensor, in accordance with embodiments presented herein;

FIG. 13 is a screenshot of the dashboard illustrating the creation of areas within the project, in accordance with embodiments presented herein;

FIG. 14 is a screenshot of the dashboard in which the user has selected a roller control object and dragged it into a guide roll area in a design window, in accordance with embodiments presented herein;

FIG. 15 is a screenshot of the dashboard in which the user has selected a motor object and dragged it into the guide roll area in the design window along with the roller control object, in accordance with embodiments presented herein;

FIG. 16 is a screenshot of the dashboard in which the user has attempted to drag an incompatible object into the guide roll area in the design window, in accordance with embodiments presented herein;

FIG. 17 is a screenshot of the dashboard in which the user has added a roller control object and two of the motor objects to the guide roll area in the design window, in accordance with embodiments presented herein;

FIG. 18 is a screenshot of the dashboard in which the system has proposed a connection to the user, in accordance with embodiments presented herein;

FIG. 19 is a screenshot of the dashboard in which the user has drawn an invalid connection, in accordance with embodiments presented herein;

FIG. 20 is a screenshot of the dashboard in which the user has selected a routine and dragged it into the guide roll area in the design window along with the roller control object 600, in accordance with embodiments presented herein;

FIG. 21 illustrates a flow chart of a process for defining a naming convention and propagating the naming convention through one or more projects and/or one or more libraries, in accordance with embodiments presented herein;

FIG. 22 illustrates a flow chart of a process for generating a name for an instantiation of on object within a project, in accordance with embodiments presented herein;

FIG. 23 illustrates a flow chart of a process for revising the names of one or more existing objects in a project based on the addition of a new object instantiation, in accordance with embodiments presented herein;

FIG. 24 illustrates an embodiment of the dashboard showing a project for a cookie making facility in the logical view style, in accordance with embodiments presented herein;

FIG. 25 illustrates an embodiment of the dashboard showing the project for the cookie making facility shown in FIG. 24 in a network view style, in accordance with embodiments presented herein;

FIG. 26 illustrates an embodiment of the dashboard showing the project for the cookie making facility shown in FIGS. 24 and 25 in a tree view style, in accordance with embodiments presented herein;

FIG. 27 illustrates an embodiment of the dashboard showing the project for the cookie making facility shown in FIGS. 24-26 in a table view style, in accordance with embodiments presented herein;

FIG. 28 illustrates an embodiment of the dashboard showing the project for the cookie making facility shown in FIGS. 24-27 in a logic view style, in accordance with embodiments presented herein;

FIG. 29 is a screenshot of the dashboard in a split screen view, in accordance with embodiments presented herein;

FIG. 30 is a screenshot of the dashboard that illustrates the creation of areas for an existing project, in accordance with embodiments presented herein;

FIG. 31 is a screenshot of the dashboard in a tag editing mode, in accordance with embodiments presented herein;

FIG. 32 is a screenshot of the dashboard in a logic editing mode, in accordance with embodiments presented herein;

FIG. 33 is a screenshot of the dashboard in which the system is suggesting controllers for the cookie making project of FIGS. 24-27, in accordance with embodiments presented herein;

FIG. 34 is a screenshot of the dashboard in which the controller suggestions have been accepted (e.g., via user input) and the controllers are being added to the project, in accordance with embodiments presented herein;

FIG. 35 is a screenshot of the dashboard in which an additional motion control module has been suggested for the wrapper area, in accordance with embodiments presented herein;

FIG. 36 is a screenshot of the dashboard displaying an end of life notification, in accordance with embodiments presented herein;

FIG. 37 is a screenshot of the dashboard showing a disconnected component and a new unconfigured component, in accordance with embodiments presented herein;

FIG. 38 illustrates a new replacement CLX controller in the packer area in place of the old CLX controller, in accordance with embodiments presented herein;

FIG. 39 is a screenshot of the dashboard showing multiple people editing a totalizer routine simultaneously, in accordance with embodiments presented herein;

FIG. 40 is a screenshot of the dashboard illustrating users sending messages to each other, in accordance with embodiments presented herein;

FIG. 41 is a screenshot of the dashboard in which a user has been prompted as to how they would like to resolve conflicts, in accordance with embodiments presented herein;

FIG. 42 is a screenshot of the dashboard displaying three mockups, in accordance with embodiments presented herein;

FIG. 43 illustrates a flow chart of a process for analyzing a project code file, in accordance with embodiments presented herein;

FIG. 44 is a screenshot of the dashboard displaying an alarm notification and an alarm pop-up window, in accordance with embodiments presented herein;

FIG. 45 is a screenshot of the dashboard displaying an alarm summary screen, in accordance with embodiments presented herein;

FIG. 46 illustrates a home screen of a light engineering client dashboard as displayed on an HMI, in accordance with embodiments presented herein;

FIG. 47 is a screenshot of the light engineering client dashboard when an alarm tab has been selected, in accordance with embodiments presented herein; and FIG. 48 is a screenshot of the light engineering client dashboard when the explorer window and the connected devices window have been minimized, in accordance with embodiments presented herein.

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," "the," and "said" are intended to mean that there are one or more of the elements. The terms "comprising," "including," and "having" are intended to be inclusive and mean that there may be additional elements other than the listed elements.

Figure 1:
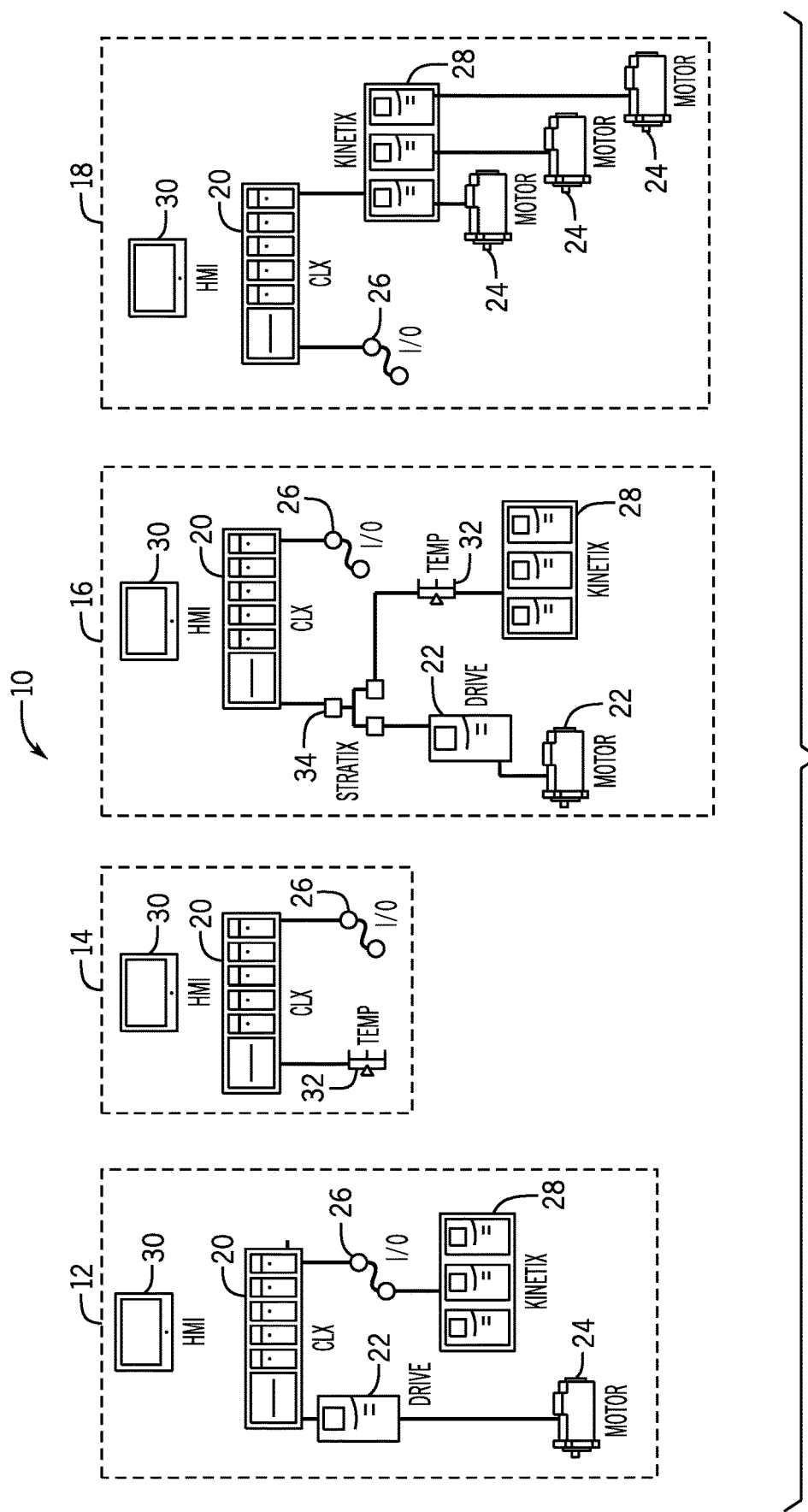
FIG. 1 is a schematic of an industrial system, in accordance with embodiments presented herein.

FIG. 1 is schematic of an industrial system 10, which may be displayed, for example, in a graphical user interface (GUI), such as a dashboard, viewable on a workstation, a desktop computer, a laptop computer, a tablet, a smartphone, a human machine interface (HMI), some other mobile device, or any other computing device. The industrial system 10 may be part of an industrial automation environment, such as an automobile manufacturing facility, a food processing facility, a drilling operation, a semiconductor or microprocessor fabrication facility, or some other type of industrial facility. As shown, the industrial system 10 may include one or more subsystems 12, 14, 16, 18, or areas, which may work in concert to perform one or more industrial processes. For example, in a food processing application, the first subsystem 12 may be a mixing system, the second subsystem 14 may be an oven or heating system, the third subsystem 16 may be a packing system, and the fourth subsystem 18 may be a wrapping system.

As shown, each subsystem may include one or more combinations of components, referred to as modules. For example, the first industrial subsystem 12 shown in FIG. 1 includes an industrial controller 20, a drive 22, a motor 24, an input/output (I/O) device 26, a motion control system 28, and an HMI 30. The second industrial subsystem 14 shown in FIG. 1 includes an industrial controller 20, a temperature sensor 32, an I/O device 26, and an HMI 30. The third industrial subsystem 16 shown in FIG. 1 includes an industrial controller 20, an industrially managed Ethernet switch 34, a drive 22, a motor 24, a temperature sensor 32, a motion control system 28, and an HMI 30. The fourth industrial subsystem 18 shown in FIG. 1 includes an industrial controller 20, an I/O device 26, a motion control system 28, three motors 24, and an HMI 30. It should be understood, however, that the particular combinations of components shown in FIG. 1 are merely examples and that many other combinations of components are envisaged. Further, it should be understood that the scope of possible industrial automation components is not intended to be limited to those shown in FIG. 1. For example, other industrial automation components may include pumps, actuators, filters, robots, drills, mills, printers, fabrication machinery, brew kettles, reserves of materials and/or resources, and so forth.

Figure 2:
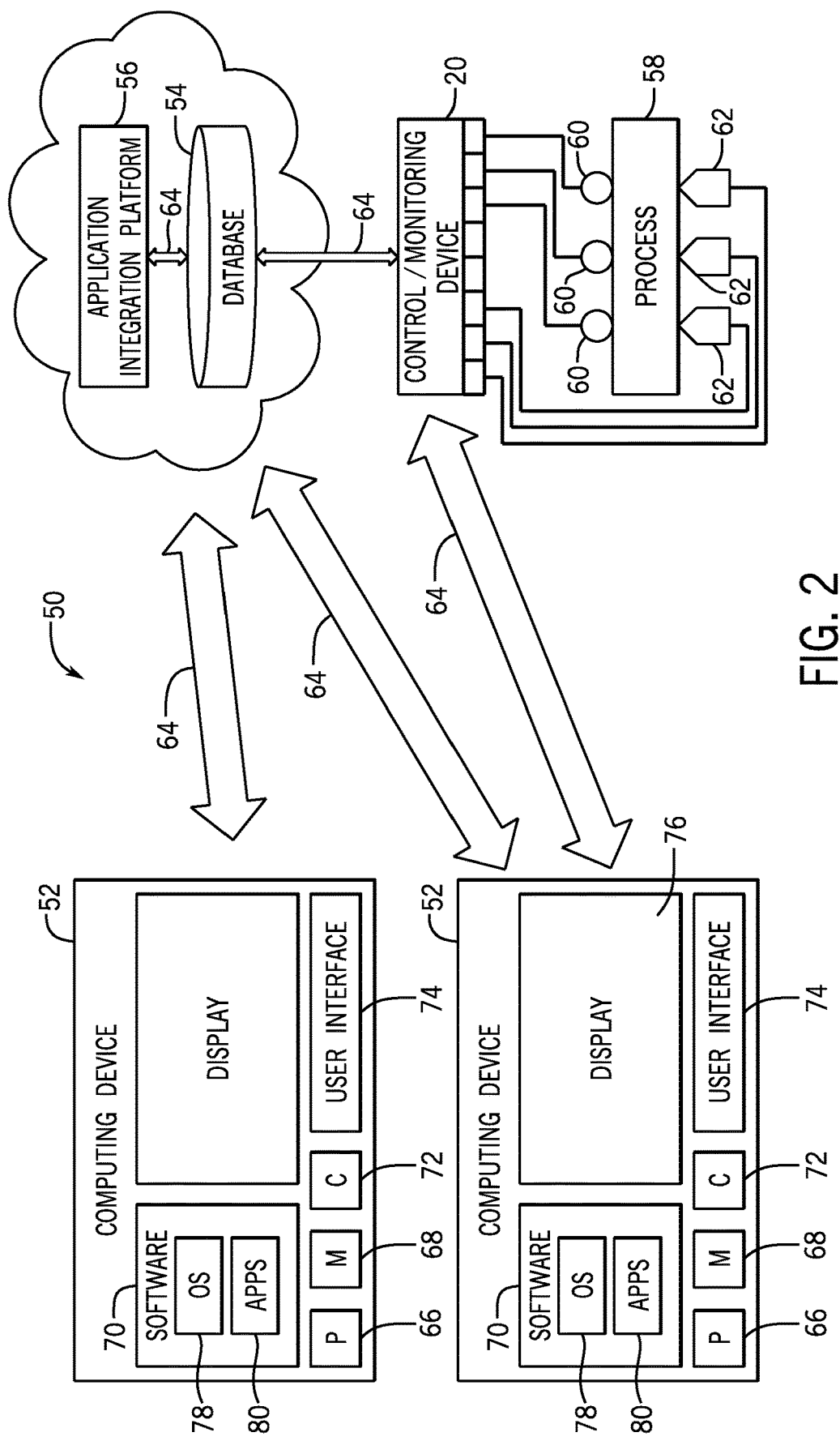
FIG. 2 illustrates an embodiment of an industrial automation environment, in accordance with embodiments presented herein.

The schematic of the industrial system 10 may be displayed to a user within a dashboard on a display of a computing device (e.g., a HMI, a programming terminal, a desktop computer, a tablet, a mobile device, a smartphone, etc.) that may allow a user to design, configure, modify, monitor, and/or troubleshoot the industrial system 10 or one or more of the industrial subsystems 12, 14, 16, 18 of the industrial system 10. FIG. 2 illustrates an embodiment of an industrial automation environment 50. The industrial automation environment 50 provides an example of an industrial automation environment 50 that may be utilized to design, configure, modify, monitor, and/or troubleshoot the industrial system 10, but other environments are also envisaged. The industrial automation environment 50 includes one or more computing devices 52, the industrial system 10, a database 54, and an application integration platform 56. The computing devices may be equipped with software that allows a user to design and/or configure aspects of the industrial system 10, monitor the industrial system 10 during operation, and troubleshoot the industrial system 10 when the industrial system 10 encounters a problem.

The industrial system 10 may be configured to run a process 58. For example, the process 58 may include a compressor station, an oil refinery, a batch operation for making food items, a mechanized assembly line, and so forth. Accordingly, the process 58 may include a variety of operational components, such as electric motors, valves, actuators, sensors, or a myriad of manufacturing, processing, material handling, and other applications. Further, the process 58 may include control and monitoring equipment (e.g., an industrial controller 20) for regulating process variables through automation and/or observation. The control/monitoring device 20 may include, for example, automation controllers, programmable logic controllers (PLCs), programmable automation controllers (PACs), or any other controllers used in automation control. The illustrated process 58 may include one or more sensors 60 and/or one or more actuators 62. The sensors 60 may include any number of devices adapted to provide information regarding process conditions, such as temperature sensors, pressure sensors, position sensors, motion sensors, accelerometers, flow sensors, chemical sensors, and so forth. Similarly, the actuators 62 may include any number of devices adapted to perform a mechanical action in response to an input signal (e.g., linear motors, servos, electric motors, pumps, etc.).

As illustrated, the sensors 60 and actuators 62 are in communication with the control/monitoring device 20 (e.g., industrial automation controller) and may be assigned a particular address in the control/monitoring device 20 that is accessible by the computing devices 52, via the application integration platform 56 and database 54. In some embodiments, the sensors 60 and actuators 62 may be in communication with one or more of the computing devices (e.g., an HMI), via the control/monitoring device 20, to operate equipment associated with the process 58. Indeed, the sensors 60 and actuators 62 may be utilized within process loops that are monitored and controlled by the control/monitoring device 20 and/or one or more of the computing devices 52 (e.g., an HMI). Such a process loop may be activated based on process inputs (e.g., input from a sensor 60) or direct inputs (e.g., operator input received through the computing device 52).

The control/monitoring device 20 and the database 54 may be in communication via a communication link 64, the database 54 and the application integration platform 56 may be in communication via a communication link 64, and the application integration platform 56 and the computing devices 52 may be in communication via communication links 64. Note that, as shown and described with regard to FIG. 1, there may be multiple processes 58, multiple control/monitoring devices 20, and many more sensors 60 and actuators 62 in an industrial system 10 than are shown in FIG. 2, but the number of components within the industrial system 10 has been reduced for clarity. Similarly, it should be understood that the industrial system 10 may be part of an automobile manufacturing factory, a food processing plant, an oil drilling operation, a microprocessor fabrication facility, or some other type of industrial enterprise. Further, the industrial system 10 may include drives, pumps, filters, drills, motors, robots, fabrication machinery, mills, printers, a brew kettle, or any other pieces industrial automation equipment.

As the process 58 operates, the sensors 60 and actuators 62 acquire/produce operational data over time, such that the operational data is provided to the control/monitoring device 20. The operational data indicates the current status of the sensors 60 and actuators 62, such as parameters, pressure, temperature, speed, energy usage, operational equipment effectiveness (OEE), mean time between failure (MTBF), mean time to repair (MTTR), voltage, throughput volumes, times, tank levels, or any other performance status metrics. In some embodiments, the operational data may include dynamic charts or trends, real-time video, or some other graphical content. The control/monitoring device 20 is capable of transferring the operational data over the communication link 64 to the database 54, the application integration platform 56, and/or the computing devices 52, typically via a communication links 64, which make up a communication network. The database 54 may be stored on one or more memory devices on premises, on a remote server, or in the cloud (e.g., public cloud, private cloud, etc.). Accordingly, the database 54 may reside in a single device or may be distributed among multiple memory devices.

The application integration platform 56 may include a processing system, a communication transceiver, a router, a server, a data storage system, and a power supply, or some combination thereof. As with the database 54, the application integration platform 56 may reside in a single device or may be distributed across multiple devices. The application integration platform 56 may be a discrete system or may be integrated within other systems, including other systems within industrial automation environment 50. In some examples, the application integration platform 56 could comprise a FACTORYTALK VANTAGEPOINT server system provided by Rockwell Automation, Inc.

The communication links 64 over which data is exchanged between the process 58, the sensors 60, the actuators 62, the control/monitoring device 20, the database 54, the application integration platform 56, and the computing devices 52 could utilize metal, air, space, optical fiber such as glass or plastic, or some other material as the transport medium, including combinations thereof. Further, the communication links 64 could include one or more network elements such as routers, gateways, telecommunication switches, servers, processing systems, or other communication equipment and systems for providing communication and data services. These communication links 64 may use various communication protocols, such as time-division multiplexing (TDM), Internet Protocol (IP), Ethernet, telephony, optical networking, packet networks, wireless mesh networks (WMN), local area networks (LAN), metropolitan area networks (MAN), wide area networks (WAN), hybrid fiber coax (HFC), communication signaling, wireless protocols, communication signaling, peer-to-peer networking over Bluetooth, Bluetooth low energy, Wi-Fi Direct, near field communication (NFC), or some other communication format, including combinations thereof. The communication links 64 could be direct links or may include intermediate networks, systems, or devices.

The computing devices 52 may be representative of any computing apparatus, system, or systems on which the disclosed techniques for designing, configuring, modifying, monitoring, and/or troubleshooting industrial automation systems 10 may be suitably implemented. The computing devices 52 provide may be used as either servers or client devices in some implementations, although such devices could have alternative configurations. The computing devices 52 could include, for example, mobile computing devices, such as cell phones, tablet computers, laptop computers, notebook computers, and gaming devices, as well as any other type of mobile computing devices and any combination or variation thereof, whether designed specifically for industrial automation applications (e.g., HMI), or not. The computing devices 52 may also include desktop computers, server computers, and virtual machines, as well as any other type of computing systems, variations, or combinations thereof. In some implementations, the computing devices 52 could include a mobile device capable of operating in a server-like fashion which, among other uses, could be utilized in a wireless mesh network.

As shown in FIG. 2, each of the computing devices 52 includes a processor 66, a memory device 68, software 70, a communication interface 74, a user interface 74, and a display 76, which may or may not be combined with the user interface 74 (e.g., a touch screen that also accepts user inputs via touches on its surface). The processor 66 is communicatively coupled to the memory device 68, the communication interface 72, the user interface 74, and the display 76. The processor 66 loads and executes software 70 from the memory device 68. The processor 66 may be implemented within a single processing device but may also be distributed across multiple processing devices or subsystems that cooperate in executing program instructions. Examples of processors 66 include general purpose central processing units, application specific processors, and logic devices, as well as any other type of processing device, combinations, or variations thereof.

The memory device 68 may include any computer-readable storage media capable of storing software 70 and readable by processor 66. The memory device 68 may include volatile and nonvolatile, removable and non-removable media implemented in any method or technology for storage of information, such as computer-readable instructions, data structures, program modules, or other data. The memory device 68 may be implemented as a single storage device but may also be implemented across multiple storage devices or subsystems co-located or distributed relative to each other. The memory device 68 may include additional elements, such as a controller, capable of communicating with the processor 66. Examples of storage media include random-access memory, read-only memory, magnetic disks, optical disks, flash memory, virtual memory and non-virtual memory, magnetic cassettes, magnetic tape, magnetic disk storage or other magnetic storage devices, or any other medium which can be used to store the desired information and that may be accessed by an instruction execution system, as well as any combination or variation thereof, or any other type of storage media.

In operation, in conjunction with the user interface 74 and the display 76, the processor loads and executes portions of software 70 to render a graphical user interface for one or more applications 80 for display by display 76. The software 70 may be implemented in program instructions and among other functions may, when executed by the processor 66, cause an HMI associated with the industrial automation system to display a plurality of graphical elements that represent one or more industrial devices. The software 70 may include, for example, an operating system 78 and one or more applications 80. For example, the computing devices 52 may include one or more applications 80 for designing, configuring, modifying, monitoring, and/or troubleshooting the industrial system 10. Examples of operating systems include Windows, iOS, and Android, as well as any other suitable operating system. The software 70 may also include firmware or some other form of machine-readable processing instructions (e.g., non-transitory) executable by processor 66. In general, the software 70 may, when loaded into the processor 66 and executed, transform the computing device 52 from a general-purpose computing device into a special-purpose computing system customized to facilitate designing, configuring, modifying, monitoring, and/or troubleshooting industrial automation systems 10. For example, encoding software 70 on the memory device 68 may transform the physical structure of the storage media of the memory device 68. The specific transformation of the physical structure may depend on various factors in different implementations of this description. Examples of such factors may include, but are not limited to, the technology used to implement the storage media of the memory device and whether the computer-storage media are characterized as primary or secondary storage.

In some examples, if the computer-storage media are implemented as semiconductor-based memory, software 70 may transform the physical state of the semiconductor memory when the program is encoded therein. For example, software 70 may transform the state of transistors, capacitors, or other discrete circuit elements constituting the semiconductor memory. A similar transformation may occur with respect to magnetic or optical media. Other transformations of physical media are possible without departing from the scope of the present description, with the foregoing examples provided only to facilitate this discussion.

It should be understood that the computing device 52 is generally intended to represent a computing system with which software 70 is deployed and executed in order to implement applications 80 for designing, configuring, modifying, monitoring, and/or troubleshooting industrial automation systems 10. Further, the application integration platform 56 may run on one or more computing devices 52, and computing devices 52 may store and maintain the database 52. However, the computing system 52 may also represent any computing system on which software 70 may be staged and from which software 70 may be distributed, transported, downloaded, or otherwise provided to yet another computing device 52 for deployment and execution, or yet additional distribution. For example, computing device 52 could be configured to deploy software 70 over the internet to one or more client computing systems for execution thereon, such as in a cloud-based deployment scenario.

The communication interface 72 may include communication connections and devices that allow for communication between the computing devices 52 or services, over a communication network or a collection of networks. In some implementations, the communication interface 72 receives dynamic data over the communication network via one or more communication links 64. Examples of connections and devices that together allow for inter-system communication may include network interface cards, antennas, power amplifiers, RF circuitry, transceivers, and other communication circuitry, and so forth.

The user interface 74, which may or may not include the display 76, may include a voice input device, a touch input device for receiving a gesture from a user, a motion input device for detecting non-touch gestures and other motions by a user, and other comparable input devices and associated processing elements capable of receiving user input from a user. Output devices such as the display 76, speakers, haptic devices, and other types of output devices may also be included in the user interface 74. The user interface 74 may also include associated user interface software executable by processor 66 in support of the various user input and output devices discussed above. Separately or in conjunction with each other and other hardware and software elements, the user interface software and devices may provide a graphical user interface, a natural user interface, or any other kind of user interface. The user interface 74 may be omitted in some implementations. Along these lines, the computing devices 52 may also include additional devices, features, or functionality not discussed here for purposes of brevity.

Design-Time, Run-Time, and Light Engineering Client Environments

Figure 3:
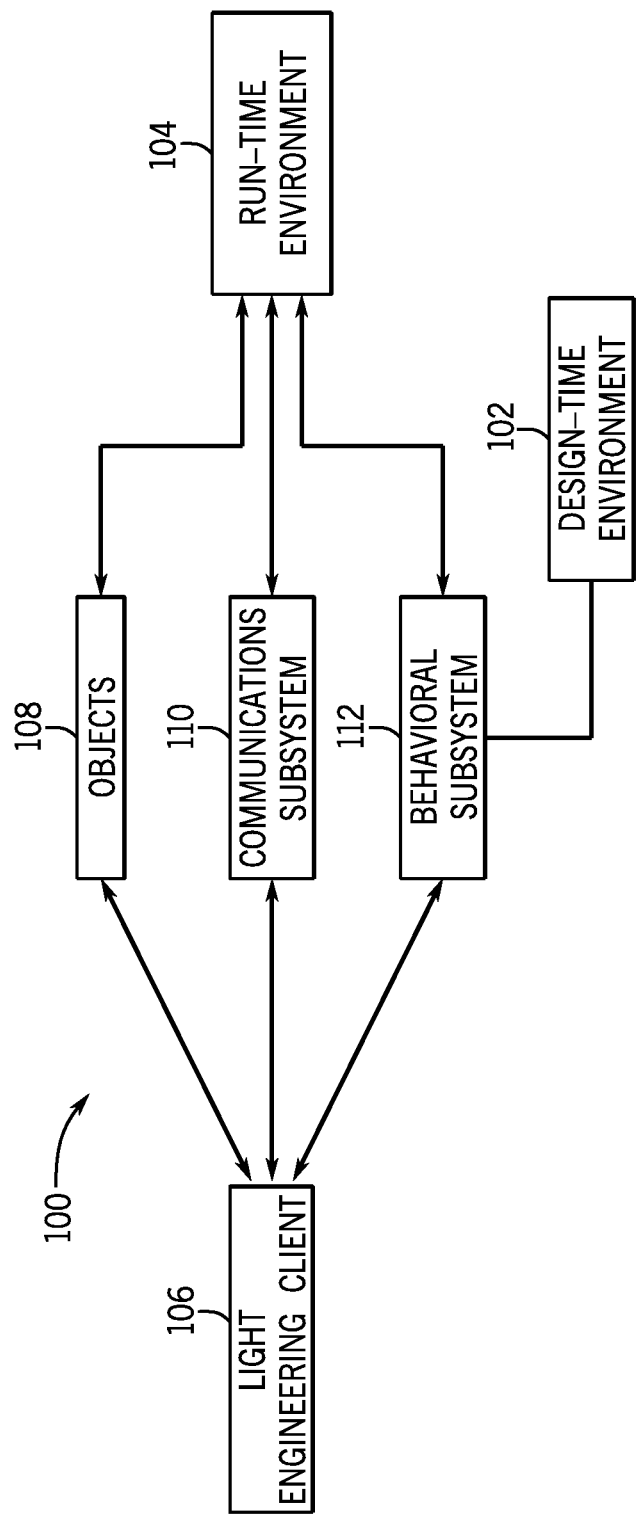
FIG. 3 is a diagrammatical representation of a control and monitoring software framework illustrating how a design-time environment, a run-time environment, and a light engineering client environment interact with one another, in accordance with embodiments presented herein.

The computing devices 52 may include applications 80 that enable a user to design, configure, modify, monitor, and/or troubleshoot industrial automation systems 10. The computing devices 52 may run (e.g., execute) a single application 80 or multiple applications 80 that provide a design-time environment for designing, configuring, modifying, and making major changes to the industrial automation systems 10, a run-time environment for monitoring the operations of one or more components within the industrial automation systems 10, and a light engineering client environment for troubleshooting, or otherwise making minor changes (e.g., relative to the changes made in the design-time environment) to the industrial automation systems 10. FIG. 3 is a diagrammatical representation of a control and monitoring software framework 100 illustrating how the design-time environment, the run-time environment, and the light engineering client environment interact with one another.

The framework 50 includes three interrelated software environments that can reside on a single system (e.g., computing device), or be distributed among multiple computing devices. Specifically, a design-time environment 102 permits a designer (e.g., a human user) to design, configure, and make modifications to the industrial automation systems. A run-time environment 104 enables an operator (e.g., a human user) to interact with an application, such as a process during run-time (e.g., during use of the interface, typically during interaction with or observance of a process in operation). For example, an industrial automation system may be graphically represented with run-time information to an operator via the run-time environment 104 on a display (e.g., computing device or interface device screen). A light engineering client 106 enables an operator to troubleshoot and/or make limited adjustments to the process in operation when a problem is encountered during operation or the operator wishes to make adjustments to the system without shifting to the design-time environment 102. The environments interact as described below, in innovative ways to provide greatly enhanced programming via a computing device, such that the operation of the computing device itself is more efficient.

The run-time environment 104 includes or provides access to objects 108. The objects 108 are software components that may include any accessible or configurable element in a software environment. For example, the objects 108 may include software components that are managed by the run-time environment 104. Accordingly, it should be understood that "objects" may include any components or self-sufficient programs that can be run as quasi-independent elements. Objects generally include four features: properties, methods, connections (or connection points) and communications interfaces. Properties, in this context, are attributes that can be adjusted, such as to define an image or representation of the element in a screen view, as well as its location on the screen, and so forth. In this context, a method is an executable function (sometimes referred to herein as the element's "functionality" or "state engine"), and defines an operation performed by execution of the element. A connection, in this context, is a link between elements, and can be used to cause data (read from a memory or written to a memory) to be sent to another element.

Specific examples of objects 108 may include software pushbuttons, timers, gauges, PLC communication servers, visualizations (such as screens that illustrate state of components within the automation control and monitoring system), and applications. In general, virtually any identifiable function may be configured as such an element. For example, such elements may include controllers, input/output (I/O) modules, motor control centers, motors, human machine interfaces (HMIs), operator interfaces, contactors, starters, sensors, drives, relays, protection devices, switchgear, compressors, network switches (e.g., Ethernet switches, modular-managed, fixed-managed, service-router, industrial, unmanaged, etc.), scanners, gauges, valves, flow meters, and the like. Moreover, as discussed below, such elements may communicate with one another to perform a wide range of display, monitoring operations and control functions. It should be noted that objects 108 do not require special limitations for supporting a design mode. Also, while elements associated with an image are quite useful, particularly for visualizations, many elements may not have a visual representation, but may perform functions within an HMI or other computing device, such as calculations, or even management and data exchange between other elements.

The run-time environment 104 typically operates using a communications subsystem 110 adapted to interconnect the objects 108. In practice, the communications subsystem 110 may be thought of as including the connections of the objects 108. However, it may include a range of software, hardware and firmware that send data to and receive data from external circuits, such as automation controllers, other computers, networks, satellites, sensors, actuators, and so forth.

The run-time environment 104 typically operates using a behavioral subsystem 112, which is adapted to manage the behavior of the objects 108. For example, responsibilities of the behavioral subsystem 112 may include place and move objects, modify objects, group objects on interchangeable screens, save and restore screen layouts, manage security, save and restore connection lists, and supply remote access to the run-time environment 104. Such behaviors may be defined as part of the profile (i.e., the "method" or "state engine") of each object.

The design-time environment 102 includes an advanced implementation of the behavioral subsystem 112 that facilitates direct or indirect manipulation of the run-time environment 104, without impeding or compromising the behavior of the run-time environment 104. That is, design and reconfiguration of the objects 108 can be done while an interface is operating. In some instances, the behavioral subsystem 112 may extend access to the run-time environment 104 via remote provision of the design-time environment 102, such as in a conventional browser or an application run on a computing device. The behavioral subsystem 112 allows a designer to interact with and change aspects of the run-time environment 104 of an HMI via a separate computing device (e.g., a remote programming terminal) by serving the design-time environment 102 or aspects thereof to the programming terminal from the HMI. For example, an HMI communicatively coupled to a laptop via a wired or wireless network connection may provide a user with configuration capabilities by serving up a specific design-time environment 102 to the laptop via the network.

By facilitating changes to objects 108, the design-time environment 102 allows the designer to make interchangeable design-time models or specialized implementations of the behavioral subsystem 112. A specific example of a design-time implementation of the behavioral subsystem 112 includes a Web-based or application-based design-time environment 102, which extends access to a run-time environment 104 on an HMI or other computing device via a wired or wireless connection between the HMI and a remote device. The Web-based or application-based design-time environment 102 facilitates management of the objects without compromising run-time performance or security. In one implementation, the behavioral subsystem 112 gives designers the ability to manipulate aspects of the run-time environment 104 using a Web browser or application that is capable of accessing a related interface or HMI.

As described in more detail below, the light engineering client environment 106 may bring aspects of the design-time environment 102 into an environment that has more in common with the run-time environment 104 than the design-time environment 102. As previously described, the design-time environment 102 is primarily used by a designer to design, configure, and/or modify the industrial automation system. After the industrial automation system has been configured, the designer likely moves on to other projects. In contrast, the run-time environment 104 is primarily used by an operator within an industrial automation environment to monitor the industrial automation system as a process runs. Use of the design-time environment 102 may involve the writing and/or manipulation of computer code, which may be largely absent from the run-time environment 104. As such, the design-time environment 102 and the run-time environment 104 may be designed for different users having different skillsets and different capabilities. However, if a problem arises during operation of the industrial automation system 10 that is relatively simple to resolve, it may not be an efficient use of resources to stop the operation of the industrial automation system 10, exit the run-time environment 104, and have a designer or engineer diagnose the problem and resolve the problem using the design-time environment 102. Accordingly, if a problem arises, the light engineering client environment 106 may be available to the operator to troubleshoot the problem, attempt to diagnose the problem, and use the more limited design capabilities of the light engineering client environment 106 to address the problem and resume operations with minimal downtime. If the operator is unable to resolve the problem via the light engineering client environment 106, a designer, engineer, or service technician may be brought in to diagnose and resolve the issue via the design-time environment 104 or the like.

Figure 4:
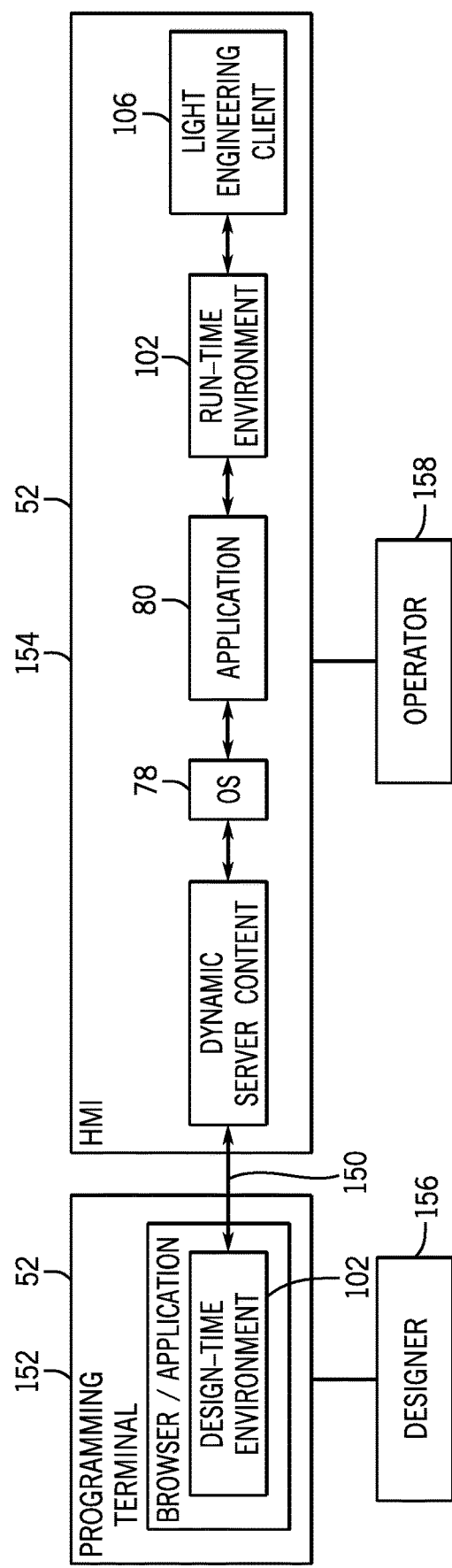
FIG. 4 illustrates how the design-time environment interacts with an operating system, an application, the run-time environment, and the light engineering client environment, in accordance with embodiments presented herein.

FIG. 4 represents, at a high level, how the design-time environment 102 interacts with the operating system 78, the application 80, the run-time environment 102, and the light engineering client environment 106. The arrow 150 represents dynamic exchange of content between an HMI 152 (i.e., a first computing device 52) and a programming terminal 154 (i.e., a second computing device 52). As previously described, interaction with the design-time environment 102 is generally the task of a designer 156, who initially configures the industrial automation system. The run-time environment 102 and light engineering client environment 106 are generally interacted with by an operator 158 directly via the HMI 154, or some other computing device 52 within the industrial automation environment. It should be noted that while the design-time environment 102 operates according to certain parameters, in a current embodiment, the parameters may depend on the operating system 78, the application 80, the run-time environment 102, and the light engineering client environment 106. The design-time environment 102, the run-time environment 102, and the light engineering client environment 106 may utilize certain base technologies (e.g., DHTML, HTML, HTTP, dynamic server content, JavaScript, Web browser) to operate respectively. While, in the illustrated embodiment, the design-time environment 102 resides on a separate platform from the run-time environment 102 and the light engineering client environment 106, in some embodiments, they may reside on the same platform. For example, the design-time platform, run-time platform, and the light engineering client platform may be configured as or considered a single platform.

Design-Time Environment Dashboard

Figure 5:
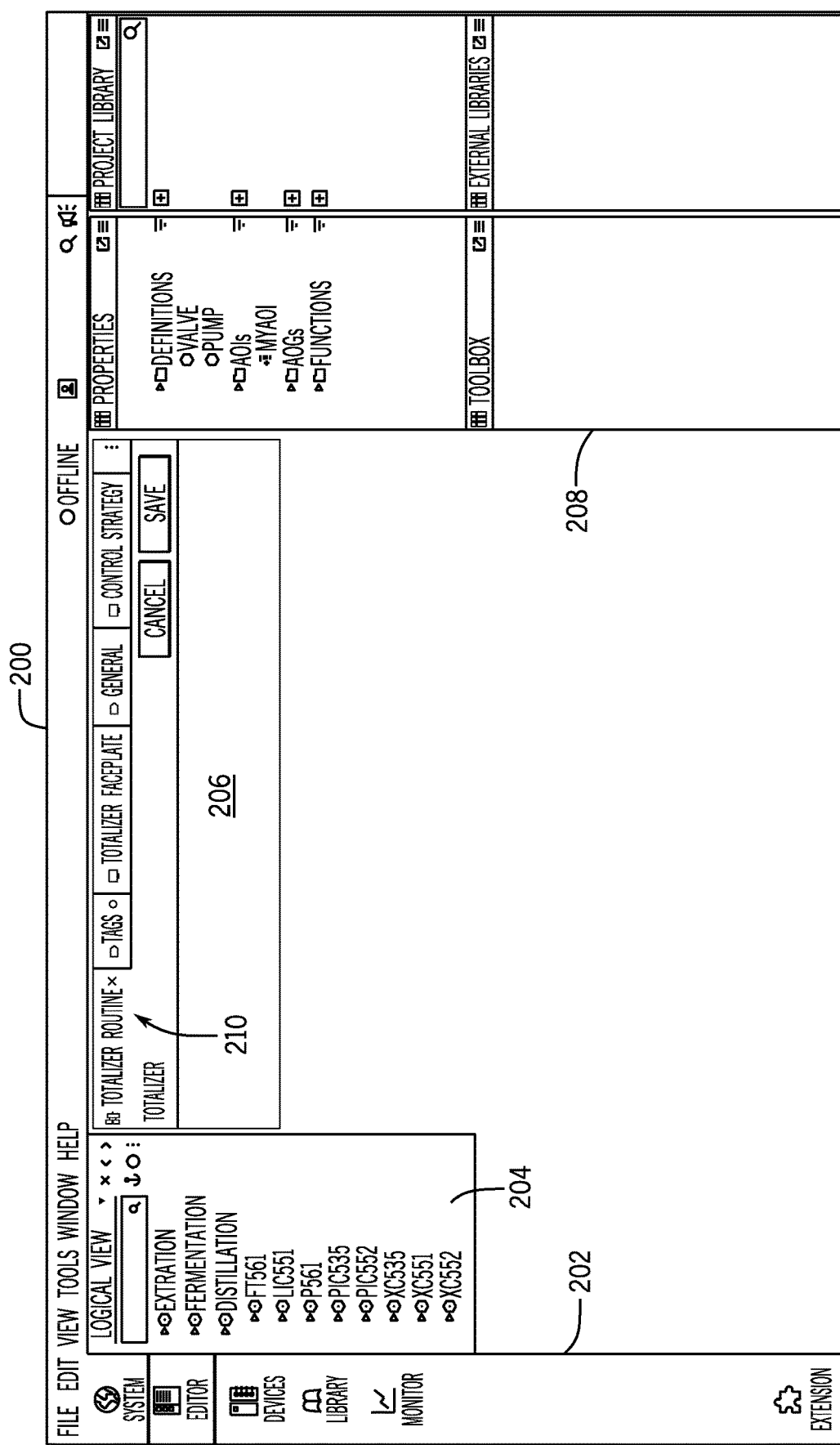
FIG. 5 is a screenshot of a dashboard of an industrial automation software package, accessible via a web browser or a running as a native application, within which the design-time, run-time, and light engineering client environments operate, in accordance with embodiments presented herein.

FIG. 5 is a screenshot of a dashboard 200 of an industrial automation software package, accessible via a web browser or a running as a native application, within which the design-time, run-time, and light engineering client environments operate (e.g., run). The dashboard 200 includes a vertical navigation bar 202, an explorer window 204, a primary window 206, and one or more accessory windows 208. As shown, the vertical navigation bar 202 includes a system tab, an editor tab, a devices tab, a library tab, a monitor tab, and an extensions tab, which may be displayed separate from the other tabs of the vertical navigation bar 202. Though not shown in FIG. 5, in some embodiments, the vertical navigation bar 202 may include an application tab. While other aspects of the dashboard 200 may change as different tabs within the vertical navigation bar 202 are selected, the vertical navigation bar 202 remains mostly constant during use of the dashboard 200. As described in more detail below with regard to FIG. 6, when various tabs within the vertical navigation bar 202 are selected, the visualizations depicted within the explorer window 204 changes.

The information displayed within the primary window 206 is dependent upon which of a plurality of tabs 210 extending along a top edge of the primary window 206 is selected, as well as selections within the explorer window 204. As shown in FIG. 5, the tabs across the top of the primary window 206 may include, for example, a selected routine, tags, a faceplate associated with the selected routing, general information, control strategy, etc. The accessory windows 208 may be configurable by a user to display other related information, such as properties of a selected component, a project library, a toolbox, one or more external libraries, and so forth.

FIGS. 6A-6E illustrate how selection of tabs within the vertical navigation bar 202 control what is displayed within the explorer window 204. FIG. 6A is a screenshot of the explorer window 204 when the system tab 250 is selected from the vertical navigation bar 202. As shown, when the system tab 250 is selected from the vertical navigation bar 202, the explorer window 204 displays a system explorer tab 252 and a views explorer tab 25. When the system explorer tab 252 is selected, the explorer window 204 displays a list 256 of components within the selected system or subsystem. As shown, the list 256 of components can selectively collapse and expand based on inputs from a user. When a selected component or subcomponent is expanded, the explorer window 204 may display selectable options for programs, processes, or routines performed by the selected component, tags associated with the selected component, portions of code associated with the selected component, documents associated with the selected component, subcomponents of the selected component, relationships and/or dependencies with other components, and so forth. As items are selected within the explorer window 204, the primary window of the dashboard may be updated to display data associated with the selected item. Though not shown in FIG. 6A, when the view explorer tab 254 is selected, the explorer window 204 is updated to display options for various alternative views of the components shown in the explorer window 204.

FIG. 6B is a screenshot of the explorer window 204 when the application tab 258 is selected from the vertical navigation bar 202. As shown, when the application tab 258 is selected, the explorer window 204 displays a controller tab 260 and an HMI tab 262. When the controller tab 260 is selected, the explorer window 204 displays a list 264 of controllers within the selected system or subsystem. As shown, each controller within the list 264 may be selectively collapsed and expanded based on inputs from a user. When a selected controller is expanded, the explorer window 204 may display tags associated with the selected controller, a controller fault handler, a controller power up handler, tasks performed by the controller, time periods, alarms, programs and/or routines, tags and/or parameters associated with the selected task, related documentation, and so forth. As items are selected within the explorer window 204, the primary window of the dashboard may be updated to display data associated with the selected item. Though not shown in FIG. 6B, when the HMI tab 262 is selected, the explorer window 204 is updated to display similar information for various HMIs within the system.

FIG. 6C is a screenshot of the explorer window when the devices tab 266 is selected from the vertical navigation bar 202. As shown, the when the devices tab 266 is selected, the explorer window 204 displays a list 256 of devices that have been added to the selected system or subsystem. The list 268 of components can selectively collapse and expand based on inputs from a user. As shown, devices may be initially categorized (e.g., all devices, test devices, emulation devices, etc.), and then further categorized into multiple subcategories (e.g., controllers, drives, MCC, etc.).

FIG. 6D is a screenshot of the explorer window 204 when the library tab 270 is selected from the vertical navigation bar 202. As shown, when the library tab 270 is selected, the explorer window 204 displays tabs for various connected libraries. For example, in the embodiment shown in FIG. 6D, the tabs include a project library tab 272, a service provider library tab 274, and an external library tab 276. When each tab is selected, the explorer window 204 displays a list 278 of various available components within the selected library. In some embodiments, as shown in FIG. 6D, the components within the library may be grouped by category. In the embodiment illustrated in FIG. 6D, the project library may be a library of components that have been approved for use in the project in question. The service provider library may include components that have been configured by a service provider and may be compatible with the instant project. The external library may be populated up by a third party and may include components that have been configured for a certain purpose, so be compatible with specific other components, and so forth.

FIG. 6E is a screenshot of the explorer window when the extensions tab 280 is selected from the vertical navigation bar 202. As shown, the when the extensions tab 280 is selected, the explorer window 204 displays a list 282 of available extensions that may be added and/or utilized during a project.

Creating New Projects and Editing Existing Projects in the Design-Time Environment FIG. 7 is a screenshot of the design-time environment dashboard 200 when a user begins creation of a new project. In the instant embodiment, the user has created a new project called "ACME System Project" and the system tab 250 has been selected from the vertical navigation bar 202. As shown in FIG. 7, the dashboard 200 includes a start window 300, a system status window 302, a devices window 304, a library window 306, and a team window 308.

The start window 300 provides a user with shortcuts to build out the project. In the embodiment shown in FIG. 7, the start window 300 includes a build system button 310 and an import piping and instrumentation diagram (P&ID) button 312. When the build system 310 button is selected, the dashboard 200 may guide a user through basic layout of a project and selection of one or more components to add to the system. When the import P&ID button 312 is selected, the dashboard 200 may open an explorer window that allows a user to locate a P&ID file to import. The imported P&ID may then provide a framework for the new project.

The system status window 302 displays one or more system status indicators of the system. Because the project is new and does not yet have any components, the system status window 302 does not display a system status. Similarly, because the project is new and no devices or libraries have been added to the project, the device window 304 and library window 306 do not display any devices or libraries, respectively. The device window 304 displays an add device button 314 that, when selected, allows the user to select devices to add to the project. Similarly, the library window 306 displays an add library button 316 that, when selected, allows the user to select one or more libraries to add to the project.

The team window 308 facilitates communication between members of a team that are working on the project. As shown, the team window 308 includes a messages tab 318, an activity tab 320, and a members tab 322. The information displayed in the team window 308 is controlled by which tab is selected. In the screenshot shown in FIG. 7, the members tab 322 has been selected. When the members tab 322 is selected, the team window 308 displays members of the team with access to the project. Because the project is new, the list of team members only includes a single user profile. However, the user may select the add team member button 324 to add other uses to the team. Selection of the messages tab 318 causes the team window 308 to display messages sent between members of the team. Selection of the activity tab 320 causes the team window 308 to display recent activity by team members within the project.

Though FIG. 7 shows the dashboard 200 for creation of a new project, in many instances, the user will open an existing project rather than opening a new project. FIG. 8 is a screenshot of the design-time environment dashboard 200 when a user opens an existing project. It should be noted that some of the windows of the dashboard 200 in FIG. 8 are different from the windows of the dashboard 200 shown in FIG. 7. Some of the differences may be attributable to the dashboard in FIG. 7 displaying a new project, while the dashboard in FIG. 8 displays an existing project. However, some of the differences in windows may be attributable to the dashboard 200 being customizable by the user. For example, the dashboard 200 shown in FIG. 8 includes an edit this page button 350 that, when selected, allows a user to control which windows are displayed on the dashboard 200 and how the selected windows are arranged.

The dashboard 200 shown in FIG. 8 includes, in addition to the devices window 304, the library window 306, and the team window 308 shown and described with regard to FIG. 7, a recent items window 352, and a project areas summary window 354. The recent items window 352 displays a list of the most recently viewed items. Selecting an item from within the recent items window 352 may open the item in a new window, allowing a user to return to editing the selected item. The project areas summary window 354 displays the various areas of the project, which may be expandable to display subareas and modules within the area. Each project may be divided into multiple areas, which may correspond to different processes within the project. In the embodiment shown in FIG. 8, the project is a chemical processing project including three areas: extraction, fermentation, and distillation. Each area may or may not be further subdivided into one or more sub-areas. Additionally, each area may include one or more groups of components, called modules, that act in concert to perform some action or set of actions. As shown in FIG. 8, the project areas window displays the number sub-areas within each area, as well as the number of modules within each area. As with the start window 300 shown in FIG. 7, the project areas summary window 354 includes the build system button 310 and the import P&ID button 312.

The devices window 304 displays a scrollable list of devices within the project. Each device listing may include a name given to the device, a model name, a status, and so forth. As shown, the top of the devices window 304 may display the total number of devices within the project, as well as the add device button 314, allowing a user to add devices to the project. Selection of a device within the devices window 304 may display more detailed information about the selected device.

The library window 306 displays one or more libraries of components that have been imported or otherwise linked to the project. For example, the libraries may include libraries created for the project by the customer, public and/or private libraries created by a service provider, and public and/or private libraries created by a third party. The add library button 316, allows a user to add libraries to the project. Selection of a library within the library window 306 may display more detailed information about the selected library.

In the embodiment shown in FIG. 8, the messages tab 318 has been selected within the team window 308. The messages tab 318 includes a number indicating the number of unread messages. Similar functionality may be utilized for the activity tab 320 (e.g., reflecting the number of notifications for new activities) and for the members tab 322 (e.g., reflecting the number of notifications for members, or requests to add new members). Because the messages tab 318 has been selected, the team window 308 displays a message from a user named Jane Doe requesting review/feedback on a new object.

FIG. 9 is a screenshot of a pop-up window 400 that opens when a user selects the add device button 314 within the devices window 304 of the dashboard 200 shown in FIG. 8. In the instant embodiment, the user has identified a file called "Ethanol Plant", so the pop-up window 400 has been populated with various components referred to in the identified file. Each component referenced in the identified file is given a row within the pop-up window 400. Columns are then generated for fields associated with data within the identified file. For example, in the embodiment shown in FIG. 9, the columns include data for tag, device type, model number, remote I/O rack tag, channel, controller, task, HMI server, HMI screen, etc. From the pop-up window 400 shown in FIG. 9, the user may select one or more devices to import, or import all of the devices. After the devices have been imported, the devices may be part of a library. A similar process may be used to add a library to the project.

FIG. 10 is a screenshot of the dashboard 200 showing various libraries when the library tab 270 is selected from the vertical navigation bar 202. As shown, the project library, the service provider library (e.g., "Rockwell Product Library"), and the customer process library (e.g., "ACME process library) appear in the explorer window 204. Upon selection of one of the libraries in the explorer window 204, the selected library is displayed in the primary window 206. As shown in FIG. 10, the primary window 206 may also include a row of tabs (e.g., project library tab 450, service provider tab 452, and customer process library tab 454) that allow a user to toggle between the various available libraries. In the embodiment shown in FIG. 10 the project library has been selected and is being displayed in the primary window 206. As a project is worked on, members of the team may populate a library of items, which may appear in the primary window 206 as a collapsible/expandable list. The items may include, for example, hardware (e.g., controllers, actuators, valves, pumps, agitators, heaters, sensors, etc.), definitions, routines, programs, instructions, calculations, alarms, etc.

In the instant embodiment, the library is grouped by definitions, add on instructions (AOIs), add on graphics (AOGs) and user-defined data types (UDTs). As a user navigates the library and selects and item, the primary window 206 may update to display more information about the selected item. It should be understood, however, that the specific contents of the library shown in FIG. 10 are merely an example and that libraries having different contents are also envisaged. As is described in more detail below, each object in the library has a corresponding file or script of computer code, or a portion of computer code that defines the object and how the object interacts with other objects. The computer code for the various objects in the library may be stored in a database. Upon execution by a processor, the code causes an industrial automation control component to perform some action. Accordingly, as an entity (e.g., designing, customer, service provider, $3^{rd}$ party vendor, etc.) builds out a library, how the various objects within the library interact with one another may be considered. For example, the database on which the library is stored may include compatibility data that specifies with which objects within the library a given object in the library is compatible, and how those objects interact with each other (e.g., what are the inputs and outputs?).

Historical data may also be referenced for determining compatibility and/or interaction between objects. Accordingly, when a user selects a set of commonly combined objects for a project, the library may anticipate how those objects are going to interact with each other and may as far as generating or retrieving code that defines the operation of the objects and the interaction between the objects so the designer does not have to write the code from scratch. In some embodiments, the automatically generated or retrieved code may be accessible by the designer for editing to fine tune the code to the intended use.

Because populating a library for a complex project from scratch is a substantial undertaking for the team working on the project, in some embodiments, a service provider may populate a library of items to be used by its customers. FIG. 11 is a screenshot of the dashboard 200 showing the service provider library when the service provider library tab 452 is selected. When the service provider provides a component, system, service, or the like to a customer, the service provider may have provided a similar system, service, or the like to a different customer for use in a similar application. Accordingly, to reduce the resources expended by its customers and to reduce redundancies in designing projects for similar applications, the service provider may provide a library that is accessible by the customer. In some embodiments, the library may be a public library that is available (e.g., accessible for download) to public or to customers of the service provider (e.g., with user login credentials). In other embodiments, the service provider may create a library specifically for a customer and limit access to the library to individuals associated with the customer or to the team working on the project in question. As shown, the library includes folders for instructions, hardware, graphics, and predefined data types. The instructions folder may include, for example, subfolders for alarms, time/counter, compare, compute, etc., each of which may include one or more library items and/or additional subfolders. It should be understood, however, that the specific contents of the library shown in FIG. 11 are merely an examples and that libraries having different contents are also envisaged.

Additionally, the customer may populate libraries intended to be used across multiple projects. For example, an oil and gas company, a food processing company, or any other entity may design and build multiple facilities that perform the same or similar functions in different geographical locations. Accordingly, selection of the customer process library tab 454 may cause the primary window 206 to display a navigable library (e.g., expandable/collapsible listing) populated by the customer to be used in multiple projects and linked to by the current project.

As previously described, a user may navigate through the various libraries (e.g., the project library, the service provider library, the customer process library, etc.) to arrive at a specific item, or find the specific item via the devices tab 266. Upon selection of the item, the primary window updates to display more details information about the selected item. For example, FIG. 12 is a detailed item view for a temperature sensor. As shown, a top portion of the primary window 206 includes a listing 500 of various information about the selected temperature sensor. A bottom portion of the primary window 206 includes a listing 502 of settings and/or outputs from the selected temperature sensor.

Drag and Drop Design Interface

In the design-time environment, the dashboard 200 utilizes a drag-and-drop style interface that allows a user to drag items from a library into a design window. Previously, to configure a group of items to work with one another, a user would open a programming window for each item in the group and individually write programming code specifying operation of the item and how the item interacts with other items in the group (e.g., inputs, outputs, settings, algorithms, routines, and so forth). Though such a system may work well for users that are proficient in programming and are looking to program an item or a group of items to perform a somewhat uncommon task, for other users, such a system is challenging, time consuming, inefficient, and prone to human error. FIGS. 13-20 illustrate designing a project in the design-time environment using the drag-and-drop features. FIG. 13 is a screenshot of the dashboard 200 illustrating the creation of areas within the project. A user may draw dotted lines in a design window 550, which is displayed within the primary window 206, to define areas within the project. In the instant embodiment, the project is for a paper line, so the areas include a first reel area 552, a guide roll area 554, a press area 556, and a second reel area 558. It should be understood, however, that the areas shown in FIG. 13 are merely an example and that many other areas and combinations of areas are also envisaged. Each area includes one or more components that work in concert to perform a function. In some embodiments, the components within an area may be further grouped into sub-areas and/or modules. Though the areas 552, 554, 556, 558 shown in FIG. 13 are defined by squares and rectangles, a user may draw dotted lines or identify points that define any closed shape or polygon within the design window 550. After an area boundary has been drawn, the user may type in a name for the area, or select the area name from a list.

As shown in FIG. 13, the dashboard 200 includes a pop-up window 560 that provides a user with options to add content to the design window, save the last action performed, and/or repeat the last action performed. Further, the accessory windows 208 may be populated with tools that a user may utilize to build the project. For example, the in the instant embodiment, the accessory windows include a tools window 562, a definitions window 564, a logic window 566, an HMI window 568, and a properties window 570. The tools window 562 includes tools that allow a user to manipulate the project within the design window 550. For example, the tools window 562 may include tools for zoom in, zoom out, select, draw line, draw shape, change view, and so forth. The definitions window 564, the logic window 566, and the HMI window 568 may include icons representing objects that a user can drag and drop into the design window 550 to add to the project. In some embodiments, the accessory windows 208 may be scrollable to reveal additional windows with icons that can be dragged into the design window 550. Accordingly, the accessory windows 208 shown in FIG. 13 are not intended to be limiting. The properties window 570 may display properties of a selected item or may allow a user to search for items within the project or the various connected libraries having specific properties.

After an area has been selected, the design window 550 updates to show only the selected area. In the instant embodiment, the user has selected the guide roll area 554, so the design window 550 has been updated to show the guide roll area 554. FIG. 14 is a screenshot of the dashboard 200 in which the user has selected a roller control object 600 and dragged it into the guide roll area 554 in the design window 550. Because the guide roll area 554 does not have any components attached thereto, the design window 550 includes text inviting the user to drag (e.g., move) an object into the design window 550 to start designing the guide roll area 554. As shown in FIG. 14, the user has selected a roller control object 600 and dragged it into the guide roll area 554 in the design window 550.

After the roller control object 600 has been placed in the design window 500, other objects may be selected and dragged into the design window 500 to join the roller control object 600 in the guide roll area 554. FIG. 15 is a screenshot of the dashboard 200 in which the user has selected a motor object 602 and dragged it into the guide roll area 554 in the design window 550 along with the roller control object 600. In some embodiments, the system may reference compatibility data and/or rules to determine whether or not an object the user drags into the design window 550 is compatible with the other objects that are already in the area. The rules may consists of guidelines that define and/or dictate relationships between industrial automation devices or components. FIG. 16 is a screenshot of the dashboard 200 in which the user has attempted to drag an incompatible object (e.g., a valve object 604) into the guide roll area 554 in the design window 550 along with the roller control object 600. As shown, the user has attempted to add the valve object 604 to the guide roll area 554. However, the system has referenced compatibility data and/or rules (e.g., stored in a database) and determined that the valve object 604 is not compatible with the roller control object 600. Accordingly, a warning message 606 has been displayed warning the user that the valve object 604 is not compatible with the other objects in the design area. In some embodiments, the system may prevent the user from placing incompatible objects in the design window 550, whereas in other embodiments, the user may be capable of overriding the system. Further, whether the user has authority to override the system may be dependent upon permissions granted to the user, the user's rank, the user's department, the user credentials, etc.

After multiple objects have been placed in an area, the inputs, outputs, statuses, and other interface elements of the object may be identified and displayed. FIG. 17 is a screenshot of the dashboard 200 in which the user has added the roller control object 600 and two of the motor objects 602 to the guide roll area 554 in the design window 550. After multiple objects have been added to an area, the design window 550 may update to identify inputs, outputs, status indicators, and/or other interface elements for each object. In some embodiments, the user may utilize the line drawing tool to draw lines 604 identifying connections between the inputs, outputs, status indicators, and/or other interface elements of the various objects. In other embodiments, the system may utilize machine learning, historical data, compatibility data, preference data, and/or a set of rules to predict connections between the devices. FIG. 18 is a screenshot of the dashboard 200 in which the system has proposed a connection to the user. In such an embodiment, the proposed connections may be suggested to a user via a message 610, as shown in FIG. 18, which the user may review and accept or reject, either in bulk or individually. In other embodiments, the system may proceed to draw the suggested connections, which the user can delete if the user desires other connections.

The system may be configured to monitor actions by the user in designing the system and reference historical data to anticipate future actions and make suggestions. These may include, for example, adding one or more objects, adding one or more connections, specific configurations of objects, etc. In some embodiments, the system may reference historical data to find previous instances of the monitored actions taking place. The system may then, based on the historical data, identify a set of possible next actions. The set of next actions may then be assigned a probability based on the historical data. For example, the system may consider what percentage of instances in the historical data set when a specific combination of objects were being used that the next object added to the project was object A. In some embodiments, when the probability of a specific possible next action exceeds some threshold value, the system may generate a recommendation for the specific possible next action. In other embodiments, at certain intervals or upon certain actions taking place, the system may select the specific possible next action having the highest probability and generate a recommendation for the specific possible next action.

Further, as with the incompatible objects described above, the system may utilize historical data, compatibility data, preference data, and/or a set of rules to determine when connections provided by the user violate connection rules or are otherwise invalid. FIG. 19 is a screenshot of the dashboard 200 in which the user has drawn an invalid connection. The user has attempted to draw a connection 612 between the input of the roller controller object 600 to the input of the motor object 602. Because connecting the input of one object to the input of another object breaks the connection rules, a warning message 614 appears to notify the user that the connection 612 is invalid. As with the incompatible objects described above, the system may prevent the user from drawing invalid connections at all. In other embodiments, the user may be capable of overriding the system, which may be dependent upon permissions granted to the user, the user's rank, the user's department, the user credentials, etc.

In addition to objects from the definitions window 564, the user can drag objects from other windows into the design window. FIG. 20 is a screenshot of the dashboard 200 in which the user has selected a routine 616 and dragged it into the guide roll area 554 in the design window 550 along with the roller control object 600. The routine may define actions of one or more of the objects within the guide roll area 554 in the design window 550. It should be understood however, that the specific combinations of objects and elements shown in FIGS. 13-20 are merely examples and not intended to be limiting. Accordingly, other combinations of objects and elements are also envisaged.

As previously discussed, each object in the library may have a corresponding file of computer code or portion of computer code that defines object and the object's interaction with other objects within the library. When the design of a project is complete, or at intermittent time periods during development, the system may take the portions of code for each object in the project and modify the code based on the other objects in the project such that each object interacts with the other objects in the project as depicted in the design window 550. The modified portions of code may then be combined into a project code file that defines the operation of the entire project. By automatically generating the project code file, writing all of the code for the project code file is no longer the responsibility of the designer.

Customer-Specific Naming Conventions

A user may develop custom customer-specific naming conventions for objects in the design-time environment, via the dashboard 200, which may then be propagated through one or more projects and/or one or more libraries used by the corresponding customer. That is, different clients may use different naming conventions (e.g., formats) to designate an identity of each device. For example, motors may be designated as "MOTOR_1," "MOTOR_2," and so on. In addition, the naming convention may provide some information regarding a hierarchical level of the respective device. For instance, for systems that are organized according to areas, sections, and devices, motors may be designated as "SECTION1_MOTOR2." Updating libraries and/or projects of objects to adhere to naming conventions may be resource intensive, tedious, and prone to human error. Accordingly, the following techniques may be used to learn a naming convention and apply the naming convention to one or more groups of objects by giving the objects new names that comply with the new naming convention. Additionally, as the number of devices in a system grows, it becomes increasingly challenging to add new devices into an existing system's naming convention. That is, a new motor installed in a system that should be associated with a particular number because of its location may be provided a different number because of the particular number is already used to represent another motor. However, by employing the embodiments described herein, any device may receive the correct or appropriate naming designation and name changes for other relevant devices may be automatically incorporated throughout the system.

By way of example, FIG. 21 is a flow chart of a process 620 for defining a naming convention and propagating the naming convention through one or more projects and/or one or more libraries. At block 622, one or more example object/device names and/or definitions of a naming convention, or partial definitions of a naming convention are received. In one embodiment, the user may provide one or more names for objects to be used as examples. In some embodiments, the one or more example names may include objects selected from an existing library that accord with the naming convention. Further, in some embodiments, data from other projects in which the naming convention was used may be provided as training data. The number of examples may correspond to the complexity of the underlying naming convention. For example, in some embodiments, for simple naming conventions, a single example name may be given. For complex naming conventions, 5, 10, 20, or more examples may be provided. Further, as is described in more detail below, a user may rely on a feedback loop to provide additional examples over time to fine tune the naming convention.

In other embodiments, the user may provide a definition or a partial definition of the underlying naming convention. For example, the user may define the various fields of a naming conventions, open or closed lists of examples for possible values for one or more fields, and/or provide rules for how the naming convention is applied to a project, library, etc. For example, the user may define a naming convention as including an object type field, a model name/number field, and/or an instantiation number field, where the object type field represents a respective object type (e.g., motor, controller, routing, pump, valve, etc.), the model name/number field represents the model name/number of the device, and the instantiation number field represents the number of instantiations of the object type within the area or the project. In some embodiments, the naming convention may also include an area field representing the area of the project in which the object is disposed. It should be understood, however, that these are merely examples and that any naming convention the user desires may be used. In some embodiments, fields may be omitted from an object's name when the object is in the library, and then added to the name of an instantiation of the object when added to a project. For example, the instantiation and/or area fields may be omitted from an object's name when the object is in a library, as the object in the library is not tied to a particular instantiation or area. However, when an instantiation of the object is placed in a project, the name of the instantiation of the object may appear with an instantiation field, an area field, and/or one or more additional field. This is described in more detail below with regard to FIG. 22.

The user may also provide rules or guidelines for how the naming convention is to be implemented. For example, the user may specify that the instantiation number field counts upward for the whole project or resets for each area. Further, the user may specify that the instantiation field may be omitted for the first object of a given object type until a second object of the object type is added, at which point the instantiation field for the first object is included as having a value of "1" and the instantiation field for the second object is given a value of "2".

At block 624, a machine learning algorithm may be applied to the received example names and/or naming convention definitions to derive one or more rules for defining the naming convention. In some embodiments, the machine learning algorithm may also use otherwise known information about the objects associated with the example object names (e.g., object type, instantiation number, area, etc.) when deriving the rules for defining the naming convention. For example, the machine learning algorithm may recognize alphanumeric character strings that correspond to known object types, known area names, known instantiation numbers, known component manufacturers, known part model names/numbers, known serial numbers, other known alphanumeric character strings, and/or known abbreviations of these known alphanumeric character strings. In some embodiments, because naming conventions may follow a handful of common forms, the naming convention may be identified with an acceptable level of confidence (e.g., 70%, 80%, 90%, etc.) based on a small number of example names.

In some cases the underlying naming convention may even be identified with an acceptable level of confidence based on a single example. For example, the design window 550 in the dashboard 200 shown in FIG. 20 include a first motor object named "Motor_1". Based on this single example, the naming convention may be understood to include an object type field and an instantiation number field, separated by an underscore, where the object type field is populated by a character string assigned to a respective object type (e.g., motor, controller, routing, pump, valve, etc.), and the instantiation number field corresponds to the number of instantiations of the object type within the area or the project. Accordingly, when a second motor is dragged into the design window 550, based on the assumed naming convention, the object may be given the name "Motor_2".

At block 626, other devices to which the naming convention applies are identified. This may include, for example, searching the instant project, one or more other projects, the instant library of objects, one or more other libraries of objects, objects corresponding to industrial automation devices connected to the network, etc. The naming convention may be determined to apply to an object or industrial automation device based on the item being of a known object type, the item being used in an area of a project, used in a specific project, existing in a specific library, the data for all of the fields in the naming convention being known for an object, etc. In some embodiments, once the devices are identified, the devices in question may be presented to a user (e.g., via a GUI) to confirm that the user wishes to apply the naming convention to the identified devices. In some embodiments, if the user wishes not to apply the naming convention to an identified device, the machine learning algorithm may be updated to reflect that the user wishes to exclude the identified devices from the naming convention.

At block 628, the derived rules defining the naming convention are used to generate a derived new name for the one or more identified devices. For example, in the example given above with respect to FIG. 20, if a third motor was in the design window 550, but named according to its serial number (e.g., "123456789"), the third motor may be identified and a new name generated in accordance with the naming convention (e.g., "Motor_3"). At block 630, the derived new name may be presented to a user (e.g., via a GUI) for review. In some embodiments, multiple derived new names may be presented to the user at once for bulk review. If the user approves the derived new name (block 632), the name may be propagated through the instant project, one or more other projects, the instant library, one or more other libraries, etc. by replacing the old name with the derived new name (block 634). That is, other instantiations of the same object or device in other libraries or projects may be updated to replace the old name with the new name. Further, approval of the new name by the user may be indicative of the derived rules defining the naming convention being correct. As such, the system may derive new names for other objects according to the naming convention and replace the old names for the other objects with the new derived names throughout one or more libraries or projects without additional input from the user. However, in some embodiments, if the user rejects the derived new name, the feedback may be utilized to further train the machine learning algorithm and update the rules defining the naming convention. It should be understood that in some embodiments, the user review and approval of blocks 630 and 632 may be omitted and the derived new name for one or more devices may automatically be propagated through one or more projects and/or one or more libraries without review and approval by the user. Further, in some embodiments, a user may designate one or more other projects and/or one or more other libraries to which to propagate the naming convention.

FIG. 22 is a flow chart of a process 640 for generating a name for an instantiation of on object within a project. At block 642, an input is received placing an instantiation of an object in a design window. For example, a user may select an object from a library and drag the object into the design window. In other embodiments, the user may select an object from the library and insert or paste the object into the design window. In further embodiments, the user may select an instantiation of an object already in the design window and copy and paste the object or duplicate the object to create a new instantiation of the object. The user may also provide inputs locating the instantiation of the object within the design window, relative to other objects in the design window, and/or specifying how the object interacts with, or is coupled to, other objects in the design window.

At block 644, a name for the object instantiation is determined according to a naming convention. In some embodiments, the name of the instantiation may be the same as appears in the library. In other embodiments, the name of the particular instantiation of the object may be different from the name shown in the library. For example, fields may be added to the name (e.g., area field, instantiation number field, etc.), fields may be changed, fields may be removed, etc. to reflect the location of the object instantiation within the project and the object instantiation's interactions with other objects. For example, an object for a motor may appear as "Motor" in the library, but when the object is inserted into a project, the name for the particular instantiation of the object may be "Motor_1" or "Section1_Motor2". At block 646, an icon for the object and the determined name for the object instantiation, or an abbreviation of the determined name for the object instantiation, may be displayed within the design window. The user may then provide inputs adjusting the position of the object within the design window and specifying how the object is to interact with other objects in the project.

At block 648, the underlying portion of code for the instantiation of the object may be updated to reflect the new name. For example, the portion of code may include place holders for the name for the object instantiation. The portion of code may be searched for the place holders, which are then replaced with the new name for the object instantiation. In other embodiments, the portion of code for the object instantiation may include one or more instances of an old name for the object instantiation. In such embodiments, the portion of code may be searched for instances of the old name. Once an instance of the old name is identified, the portion of code may be modified to replace the instance of the old name with the new name. Further, in some embodiments, the underlying portions of code for the other objects in the project may be updated to reflect the new name of the instantiation of the object. For example, the portions of code associated with other objects in the project may reference the instantiation of the object (e.g., receive input from object instantiation, send output to object instantiation, receive control signal from object instantiation, send control signal to object instantiation, receive set point from object instantiation, send set point to object instantiation, receive measurement value from object instantiation, send measurement value to object instantiation, and so forth.). In such embodiments, the portions of code associated with the other objects in the project may be searched for references to the object instantiation (e.g., place holders, the old name for the object instantiation, etc.) and replaced with the new name for the object instantiation.

As previously described, as the number of devices in a system grows, maintaining a logical naming convention may be difficult as objects are added, removed, and/or rearranged. A logical naming convention may dictate, for example, that values for one or more fields within a name increase or decrease with each instantiation along a flow path of a system. In one embodiment, a value for a field of a first object upstream of a second object may be higher than that of the second object. In another embodiment, the value for the field of the first object upstream of the second object may be lower than that of the second object. As such, the value for the field may count upward or downward in the direction of flow. The direction of flow may refer to the flow of product within the system, the flow of data within a system, the flow of logic within the system, the actual physical arrangement of components within the system, the sequential flow of steps of a process, and so forth. For example, a project may include motors named "Motor_1", "Motor_2", "Motor_3", and "Motor_4". If a user adds a new motor between Motor_2 and Motor_3, based on the location of the new motor, the logical name for the new motor may be "Motor_3" and, as such, the names of Motor_3 and Motor_4 should be adjusted accordingly (e.g., Motor_3 becomes Motor_4, and Motor_4 becomes Motor_5). However, adjusting the names of the other components and the underlying associated portions of code may be extremely resource intensive, tedious, and prone to human error, especially for systems with many more than 4 or 5 motors. Accordingly, the likely result is that the user names the new motor "Motor_5" and locates the motor between Motor_2 and Motor_3, or decides not to add the additional motor at all, even though it would improve the operation of the system.

Accordingly, the disclosed techniques may be used to adjust the names of other objects in a project based on the addition, removal, or relocation of an object. FIG. 23 is a flow chart of a process 660 for revising the names of one or more existing objects in a project based on the addition of a new object instantiation. At block 662, an input is received placing an instantiation of an object within the design window of a project. For example, a user may select an object from a library and drag the object into the design window. In other embodiments, the user may select and an object from the library and insert or paste the object into the design window. In further embodiments, the user may select an instantiation of an object already in the design window and copy and paste the object or duplicate the object to create a new instantiation of the object. The user may also provide inputs locating the instantiation of the object within the design window, relative to other objects in the design window, and/or specifying how the object interacts with, or is coupled to, other objects in the design window.

At block 664, a name for the object instantiation is determined according to a naming convention, based on the object instantiation's position within the design window relative to other objects. The name of the instantiation may be the same as appears in the library, or the name of the particular instantiation of the object may be different from the name shown in the library. For example, the name of the particular instantiation may include fields omitted from the listing of the object in the library (e.g., area field, instantiation number field, etc.). In other embodiments, fields may be changed, fields may be removed, etc. to reflect the location of the object instantiation within the project and the object instantiation's interactions with other objects.

At block 666, a determination is made that the names of one or more other object instantiations within the project should be revised to account for the new object instantiation. For example, values for some fields may be adjusted to account for the insertion of the new object instantiation. In the example described above, a user adds a new motor between Motor_2 and Motor_3 of a system containing Motor_1, Motor_2, Motor_3, and Motor_4. Based on the location of the new motor, it is determined that the new motor should be named "Motor_3" and the names of Motor_3 and Motor_4 adjusted accordingly to become becomes Motor_4 and Motor_5, respectively. At block 668, new names for the surrounding objects are generated based on the insertion of the object instantiation. At block 670, the underlying portions of code for the instantiation of the object and one or more other object instantiations in the project may be updated to reflect the new names for the object instantiations and the other object instantiations in the project. For example, the portions of code for the various object instantiations may include place holders for the names of object instantiations or old names of the object instantiations. Accordingly, the portion of code may be searched for the place holders or old names, which are then replaced with the new names for the object instantiations.

Though the above techniques are for situations in which an object instantiation has been added to a project, it should be understood that similar techniques may be used when an object instantiation is removed from a project, modified, or relocated within a project such that the names of other object instantiations within the project should be changed. For example, when an object instantiation is removed from the project, the names for other object instantiations within the project, and portions of code referencing those object instantiations, may be revised with new names. Using the example described above, if a user adds removes Motor_2 from a system containing Motor_1, Motor_2, Motor_3, and Motor_4. The names of Motor_3 and Motor_4 may be adjusted accordingly to become Motor_2 and Motor_3, respectively. Correspondingly, when an object instantiation is relocated within the project, the names for other object instantiations within the project, and portions of code referencing those object instantiations, may be revised with new names. Continuing with the same example described above, if a user moves Motor_2 within a system containing Motor_1, Motor_2, Motor_3, and Motor_4 to a location between Motor_3 and Motor_4, the names of Motor_2, Motor_3, and Motor_4 may be adjusted accordingly such that Motor_3 becomes Motor_2, and Motor_2 becomes Motor_3. Accordingly, the to reduce the tedious workload on designers to rename objects within a system in response to addition, removal, or relocation of objects, which is also prone to human error, and to incentivize designers to implement designs of systems that are going to maximize performance, the names of components within a project and the underlying portions of code may be automatically updated in response to the addition, removal, or relocation of an object within the project.

Design Environment View Options

In the design-time environment, the dashboard 200 may be configured to display projects in several different view styles that are selectable by the user. In FIGS. 13-20, the dashboard 200 is shown in the logical view style, however, other styles may be available. FIG. 24 illustrates an embodiment of the dashboard 200 showing a project for a cookie making facility in the logical view style. As shown, the design window of the dashboard 550 includes multiple areas including a mixer area 700, an oven area 702, a packer area 704, and a wrapper area 706. In the illustrated embodiment, the mixer area 700 includes an industrial controller 20 (e.g., CLX), a drive 22, a motor 24, an input/output (I/O) device 26, a motion control system 28 (e.g., KINETIX), and an HMI 30. The oven area 702 includes an industrial controller 20 (e.g., CLX), a temperature sensor 32, an I/O device 26, and an HMI 30. The packer area 704 includes an industrial controller 20 (e.g., CLX), an industrially managed Ethernet switch 34 (e.g., STRATIX), a drive 22, a motor 24, a temperature sensor 32, a motion control system 28 (e.g., KINETIX), and an HMI 30. The wrapper area 706 includes an industrial controller 20 (e.g., CLX), an I/O device 26, a motion control system 28 (e.g., KINETIX), three motors 24, and an HMI 30. It should be understood, however, that the particular combinations of components shown in FIG. 24 are merely examples and that many other combinations of components are envisaged. Further, it should be understood that the scope of possible industrial automation components is not intended to be limited to those shown in FIG. 24. As shown, the logical view is characterized by the various areas 700, 702, 704, 706 being separated from one another such the areas are self-contained and connections between components do not cross area boundaries (i.e., the dotted lines). Further, connections between components are represented by a single line. In some embodiments, not all components that are in communication with one another are connected by a line on the dashboard 200. For example, though one or more components within an area may be in communication with the HMI 30, in the dashboard 200 shown in FIG. 24, none of the HMIs 30 are connected to components with lines. Accordingly, the logical view offers a simplified view of a project that reduces the number of connections shown so as to communicate how the system components within an area interact with one another.

A user may toggle between various available view options using the drop-down view menu 708. FIG. 25 illustrates an embodiment of the dashboard 200 showing the project for the cookie making facility shown in FIG. 24 in a network view style. As shown, whereas the connection lines within each area of in the logical view are mostly vertical, in the network view, the lines are mostly horizontal. Further, the areas emphasized in the logical view are deemphasized in the network view style. In some embodiments, as shown in FIG. 25, the area boundaries may be completely omitted. As shown in FIG. 25, the network view style emphasizes network architecture and connections between components through which data (e.g., control signals, measurement signals, etc.) pass.

FIG. 26 illustrates an embodiment of the dashboard 200 showing the project for the cookie making facility shown in FIGS. 24 and 25 in a tree view style. As shown, when the tree view style is selected in the drop-down menu 708, the dashboard transitions to a configuration similar to the configuration shown and described with regard to FIG. 5, in which the explorer window 204 occupies one side of the dashboard 200, the primary window 206 occupies the middle of the dashboard 200, and the accessory windows 208 occupy a second side of the dashboard 200, opposite the explorer window 204. The explorer window 204 displays an expanding and collapsing nested list of all of the components in the project. As a user navigates the explorer window 204 and selects components, information about the selected components is displayed in the primary window 206. The structure of the nested list of the components in the explorer window 204 corresponds to how the various projects and components within a project are configured relative to each other. In the embodiment shown in FIG. 26, the dashboard is for a customer called "MightyQ", for one of multiple lines (e.g., line 1) within a process and/or facility called "cookie". As was shown and described with regard to FIG. 24, Line 1 includes the mixer area 700, the oven area 702, the packer area 704, and the wrapper area 706. Each area is expandable to expose the components within the area. For example, as shown in FIG. 26, the mixer area 700 includes an HMI client 30, a CLX chassis, including a CLX M1 controller, an input module, and an output module, and a PowerFlex motion control system 28 including three KINETIX units. Similarly, as shown in FIG. 26, the oven area 702, the packer area 704, and the wrapper area 706 each include expandable subsystems.

Periodically, the system may generate an alarm, an alert, or an informational notification (collectively referred to as notifications) for a specific component or group of components. As shown in FIG. 26, notifications 710 may appear in the explorer window 204 on or next to the component to which the notification is related. In the instant embodiment, the notification 710 is an exclamation point inside a diamond. However, it should be understood that notifications may take many different forms (e.g., a star, a colored shape, emphasis or deemphasis of the object, etc.). Further, the shape, color, or style of the notification may change to reflect the category of the notification, the severity of the notification, etc. After selection, a pop-up window may appear, or the primary window 206 may update to show more information. Another option for viewing notifications is a table view (selectable by via the drop down view menu 708). FIG. 27 illustrates an embodiment of the dashboard 200 showing the project for the cookie making facility shown in FIGS. 24-26 in a table view style. The table view emphasizes alarms, alerts, and informational notifications by displaying information in a table 750. Each row within the table 750 corresponds to a notification. The table 750 has columns for displaying information for different fields within the table. As shown, the fields may include, for example, notification type 752, area 754, date and time 756, component 758, and notification message 760. The notification type field 752 may include, for example alarm, alert, warning, information, etc. The date and time field 756 specifies the date and time of the notification. The equipment field 758 specifies the piece of equipment associated with the notification. The message field 760 displays a message of the notification. In some embodiments, the table 750 may include a column of checkboxes 762 that allows a user to deal with and/or dismiss notifications in bulk. It should be understood, however, that in other embodiments, the table 750 may include different combinations of fields, including fields not shown, that the fields shown in FIG. 27.

FIG. 28 illustrates an embodiment of the dashboard 200 showing the project for the cookie making facility shown in FIGS. 24-27 in a logic view style. As shown, the logic view is available via the editor tab 800 of the vertical navigation bar 202. Various components appear in an expandable/collapsible nested list in the explorer window 204. Logic is a nested item within most of the components in the explorer window 204. By selecting the logic for a particular component, the logic associated with that component appears in the primary window 206. Further, when a component is selected in the explorer window 204, the primary window 206 is updated to display information about the component. For a selected device, the primary window 206 may include a logic tab 802, a tags tab 804, an HMI tab 806, and an alarms tab 808. As shown in FIG. 28, when the logic tab 802 is selected, the primary window 206 displays a logic schematic 810 describing the various logic tasks for which the selected component has been programmed to perform.

In some embodiments, the logic view style may include a logic diagnostics tool that occupies a logic diagnostics tool window 812 within the primary window 206. The logic diagnostics tool may run one or more scripts or algorithms and/or apply a set of rules to analyze the logic within a project. In some embodiments, the scope of the logic diagnostics tool may be limited to a single selected component. In other embodiments, the logic diagnostics tool may consider a module having a number of components, multiple modules of components, an area, multiple areas, a whole project, etc. The logic diagnostics tool window 812 includes a logic diagnostics tool banner 814, which provides a summary 816 of results of a logic diagnostics run, including for example, the number of errors, the number of warnings, the number of informational messages, etc. A user may select specific items within the summary 816 to view more detailed information. Below the logic diagnostics tool banner 814, the logic diagnostics tool window 812 displays the detailed results 818 of the logic diagnostics run.

Similarly, when the tags tab 804 is selected, the primary window 206 updates to display the various tags assigned to the selected component. When the HMI tab 806 is selected, the primary window 206 displays information about the HMI associated with the selected component and interactions between the selected component and the HMI. When the alarms tab 808 is selected, the primary window 206 displays information about the various alarms associated with the selected component.

A user may also select multiple objects in the explorer window 204 to create a split screen view within the primary window 206. FIG. 29 is a screenshot of the dashboard 200 in a split screen view. As shown, a main display 850 of a distillation visualization has been selected, as well as a totalizer routine 852 within the distillation process. Accordingly, the primary window has been split into a first subwindow 854, which shows details of the main display 850, and a second subwindow 856, which shows details of the totalizer routine 852, as if each component/object has been chosen individually and detailed information for the chosen components are displayed within the primary window 206. Though the primary window 206 is divided into two subwindows in the embodiment shown in FIG. 29, it should be understood that, in some embodiments, the primary window 206 may be divided into 3, 4, 5, 6, 7, 8, 9, 10, or any suitable number of subwindows. In such an embodiment, all of the subwindows may not be able to fit within a single screen, the user may be able to scrolls through the various subwindows. Similarly, each subwindow 854, 856 may include a row of tabs 858, each corresponding to a selected component, such that a user may toggle the view displayed by a subwindow 854, 856 by selecting a tab from the row of tabs 858. Further, in some embodiments, the various subwindows 854, 856 of the primary window 206 in split-screen mode may be capable of displaying different view types simultaneously. For example, the first subwindow 854 may display in a logical view while the second subwindow 856 displays in a network view.

Manipulating Existing Projects

Creating areas for a project was shown and described with regard to FIG. 13. Though the areas in FIG. 13 (e.g., first reel area, guide roll area, press area, second reel area) were created before any objects were dragged into the design window 550 of the primary window 206, areas may also be added and/or adjusted in projects that already have one or more objects in the design window. FIG. 30 is a screenshot of the dashboard 200 that illustrates the creation of areas for an existing project. As shown, a drawing tool has been used to draw lines, forming closed shapes, that define one or more areas of an existing project. Specifically, the user has used a drawing tool to draw closed shapes that define a preparation area 900, a milling area 902, and a dispatch area 904. The drawing tool may allow the user to select from a menu of standard shapes, including circles, ovals, triangles, squares, rectangles, diamonds, parallelograms, pentagons, hexagons, heptagons, octagons, nonagons, decagons, or any other polygon. Further, the user may draw other shapes by defining points, which may then be connected with straight lines. In some embodiments, the drawing tool may also allow users to add curved lines. After area-defining shapes are drawn, the system may identify objects that are not entirely within the lines of a shape defining an area. If an object is not entirely within an area's shape, the system may determine the extent to which the object lies within the area (e.g., is the object mostly inside the area or mostly outside the area?), and consider the extent to which the object interacts with other objects within the area to determine whether or not the object should be considered within the area. In some embodiments, the use of areas may be used to define or designate networks or subnetworks. Further, in some naming conventions, the area in which an object is located, or the role an object plays in an area may help to define the name given to an object.

The dashboard 200 may also be used to generate and/or edit tags for a project. FIG. 31 is a screenshot of the dashboard 200 in a tag editing mode. As shown, when a tags/parameters item 950 is selected from the explorer window 204, the primary window 206 updates to display a tags/parameters editing window 952. From the tags/parameters editing window 952, a user may add and/or edit tags/parameters associated with a selected component.

A tag is a text-based name for an area of a component's memory in which specific data is sported. Thus, creating a tag is somewhat like creating a partition within the memory. Before tags, data location was identified by an network or memory address. Thus, using tags within a project is a mechanism for allocating memory of components within the system. Typically, the amount of memory allocated to a tag varies from tag to tag, but is at least four bytes. As shown, the tags/parameters editing window 952 includes a tag table 954 that lists the tags associated with a selected component. Within the tag table 954, each tag occupies a row. The row may include various data fields that define or describe the tag. For example, in the embodiment shown in FIG. 31, the data fields include name, value, style, data type, tag description, history, and alarms. The tag name may be generated by a user or automatically generated. Similarly, the description may be a string provided by a user or automatically generated by the system. The data type may include one of several options including REAL (e.g., for floating point numbers, such as provided by an analog device in floating point mode), INT (e.g., for an analog device in integer mode), STRING (e.g., for a string of ASCII characters), BOOL (e.g., for bits and/or digital I/O points), COUNTER (e.g., for a counter), DINT (for whole number integers), CONTROL (e.g., for sequencers), TIMER (e.g., for timers), and so forth. To add a tag to a component, a user may fill in the open fields at the bottom of the tag table 954. To add a tag, the user may provide an alpha-numeric character string for each field, select from a drop down menu, enter a number value, etc.

As shown in FIG. 31, the tags/parameters editing window 952 may also include a parameters table 956 and a child table 958. The parameters table 956 may define one or more parameters associated with the selected component, such that each row corresponds to a parameter and may include multiple fields that describe and/or define the parameter. In some embodiments, parameters may be used to further define tags. The child table 958 lists child instances of the selected component. If the selected component is a child of another component, in some embodiments, the parent component may also be displayed, either in the child table 958 or in a separate parent table (not shown).

The dashboard 200 may also be used to add logic to an existing project or a component within an existing project. FIG. 32 is a screenshot of the dashboard 200 in a logic editing mode. As shown, when a logic item 1000 is selected within the explore window 204, in the instant embodiment, for an agitator object, the primary window 206 updates to display a logic window 1002. Within the logic window 1002, a pop-up window 1004 may be displayed that allows a user to select how he or she would like to add logic. As shown, from within the pop-up window 1004, a user may choose to add ladder logic, add a structured text file, add a function block file, or add an SFC file. It should be understood, however, that the options for adding logic in the pop-up window 1004 are merely examples and not intended to be limiting. Accordingly, other ways for adding logic to a project or component are also envisaged. Upon making a selection within the pop-up window 1004, the dashboard 200 may guide the user through adding the ladder logic or locating and importing the appropriate file.

Suggesting Components

The ability of the dashboard 200 to use historical data to suggest connections between components is shown and described above with reference to FIG. 18. The dashboard 200 may also use historical data to suggest specific components within a project based on the other objects already in a project. FIG. 33 is a screenshot of the dashboard 200 in which the system is suggesting controllers for the cookie making project of FIGS. 24-27. In FIGS. 24-27, the industrial controllers 20 were shown with the generic label CLX. As shown in FIG. 33, the system may be configured to analyze the instant project, as well as historical data (e.g., previous projects from the designer, the designer team, the customer, and/or one or more other customers) to suggest specific CLX industrial controller 20 models for the project. As shown, when the system suggests one or more components, the dashboard 200 updates to display a suggestion notification banner 1050, which notifies the user that one or more suggestions are being made, and allows the user to accept or discard the suggestions individually or in bulk. Additionally, the dashboard may display a suggestion pop-up window 1052 over one or more of the objects. The suggestion pop-up window 1052 allows a user to accept the suggestion, reject the suggestion, see more information about the suggested object, and/or view object preferences. Suggestions may be used based on historical data (e.g., frequently used combinations of parts in past designs from the historical data set). For example, the system may recognize that the designer has used three specific objects in an area and determine that the combination of objects is typically used with a fourth object. The system may then suggest the fourth object via the dashboard 200. Further, the system may also suggest components based on an anticipated load and suggest specific products based on their known specifications. For example, a designer may have placed a generic controller 20 in a project. Based on the components connected to the controller, the system may be able to determine an anticipated load on the controller, as well as the number and type of components with which the controller 20 is designed to interface. The system may then reference specifications for known products and recommend a specific product that is well suited in the project. In some embodiments, the system may utilize machine learning to analyze trends in historical data and/or catalogs of available components in order to generate the suggestions.

In some embodiments, the about object option may send a user to a website for the vendor of the object. The about object option may also provide contact information for the vendor of the object and provide the user with guideline as to how to purchase the object, if a purchase is appropriate. Further, the object preferences option may allow a user to define his or her preferences with regard to certain objects, such as preferred vendors, preferred models, budgets, preferred programming languages, compliance with preferred standards, preference for objects designed for specific industries, etc. In other embodiments, the object preferences option may allow a user to view and edit the settings for a given object. When multiple objects are suggested, as is the case in FIG. 33, the suggestion pop-up windows 1052 for each suggestion may appear simultaneously, or one at a time, as each suggestion is accepted or discarded by the user. Further, a user may have the option to hold a suggestion and put off making a decision on the suggestion in order to further consider the suggestion. In the instant embodiment, the system has suggested a CLX L83 controller 20 in the mixer area 700 and the oven area 702, whereas a CLX L85 controller 20 was suggested for the packer area 704 and the wrapper area 706. In some embodiments, the dashboard 200 may present each suggested instance of an object as a separate suggestion. In other embodiments, all instances of a suggested component may be treated as a single suggestion (i.e., all suggested CLX L83 controllers are a single suggestion and all CLX L85 controllers are a single suggestion).

As shown in FIG. 33, the suggested objects are displayed within the design window 550 in an emphasized (e.g., bolded, flashing, color coded, etc.) or deemphasized (e.g., greyed out, dotted lines, etc.) fashion relative to the other components. Upon acceptance of the suggestions, the suggested objects are added to the project and the appearance of the suggested objects is updated to match the other objects in the project. FIG. 34 is a screenshot of the dashboard 200 in which the controller suggestions have been accepted (e.g., via user input) and the controllers are being added to the project. As shown, the CLX L83 controllers and the CLX L85 controllers have been added to the project and are shown in the same style as the other objects in the project.

In the embodiments shown and described with regard to FIGS. 33 and 34, the system suggested specific models of objects where generic placeholders for those objects existed within the project. However, in some embodiments, the system may also suggest new objects to add to the project. FIG. 35 is a screenshot of the dashboard 200 in which an additional motion control module 1100 has been suggested for the wrapper area 706. Though a generic motion control module 1100 has been suggested in FIG. 35, in some embodiments, the system may suggest specific models of objects. Though in the embodiments shown in FIGS. 33-35, the suggested objects are hardware components, it should be understood that the system may be configured to suggest that other objects be added to the project that are not necessarily hardware components, such as routines, software components, logic, alarms, timers, processes, etc.

In some embodiments, the system may also recognize when a component of a project has reached, or will soon reach, the end of its suggested life cycle, has become, or is expected to become, obsolete for lack of software/firmware updates, or has otherwise become an end of life product. In such a situation, the system may generate an end of life notification and suggest a replacement product. FIG. 36 is a screenshot of the dashboard 200 displaying an end of life notification 1102. As shown, when an end of life product is recognized, the system may deemphasize (e.g., grey out) the other objects in the area and attach an end of life notification 1102 to the end of life product. Further, the dashboard 200 may also display an end of life pop-up window 1104. The end of life pop-up window 1104 may display that the identified component is an end of life product and suggest a replacement product, identified based on the existing designed system, to interconnect with the existing components with minimal programming. In some embodiments, the pop-up window 1104 may include a hyperlink to website for the product, which may allow the user to order the product, or contact information for a vendor of the product. In instances in which the product is available from multiple vendors, the system may compare prices for the product from multiple vendors. The system may also apply an algorithm or one or more rules to confirm the compatibility of the suggested product with the rest of the components in the area and/or project.

The system may also detect when known hardware components have disconnected from the network and when new hardware components have connected to the network. FIG. 37 is a screenshot of the dashboard 200 showing a disconnected component and a new unconfigured component. In the instant embodiment, the CLX controller 20 in the packer area 704 has been disconnected from the network and a new unconfigured CLX controller has been connected to the network in its place. The system has recognized that the known CLX controller 20 in the packer area 704 has been disconnected from the network. Accordingly, the object corresponding to the CLX controller 20 in the packer area 704 has been deemphasized (e.g., greyed out) and a notification 1106 has been generated to communicate to the user that the component has been disconnected from the network. Further, an object corresponding to the new unconfigured CLX controller 20 appears floating above the various areas 700, 702, 704, 706 of the project. The object corresponding to the new unconfigured CLX controller 20 also includes a notification to notify that the new CLX controller has been connected to the network, but not configured. A notification window 1110 also appears, indicating that an unconfigured controller 20 has been attached to the network and giving the user the option to configure the new CLX controller by selecting a configure button 1112. Upon selection of the configure button 1112, the system may walk the user through configuring the new piece of hardware. During the configuration process, the system may update the dashboard 200 to replace the object associated with the old CLX controller 20 with the object for the new CLX controller 20. However, in some embodiments, the system may recognize that a component has been disconnected and that a new unconfigured component has been connected in its place. Accordingly, the system may skip the dashboard 200 view shown in FIG. 37 and assume that the new component replaces the old component and that the user wants to configure the new component.

FIG. 38 shows new replacement CLX controller 20 in the packer area 704 in place of the old CLX controller 20. As shown, the new replacement CLX controller 20 has been emphasized via highlighting, however other forms of emphasis (e.g., bold lines, color coded, flashing, notification, etc.) are also envisaged. The dashboard 200 updates the accessory windows 208 to display an object properties window 1114. Within the object properties window 1114, the dashboard 200 displays a direct replacement box 1116 that enables the user to provide inputs stating whether or not the new component is a direct replacement for the disconnected component. If so, the system may assign configurations for the old component to the new component.

Simultaneous Edits by Multiple Users

As described above with regard to FIG. 2, in some embodiments, rather than being stored locally on a computing device, industrial automation projects may be hosted by an on-premises (on-prem) server, a remote server, a private cloud network, a public cloud network, or some other way that is simultaneously accessible by multiple users. Accordingly, the dashboard 200 may be configured to facilitate two or more people accessing and editing the project simultaneously. FIG. 39 is a screenshot of the dashboard 200 showing multiple people editing a totalizer routine simultaneously. When multiple people are editing an aspect of a project simultaneously, a notification 1150 may appear to inform the users that multiple people are editing an aspect of the project. As shown in FIG. 39, the notification 1150 may include the number of users editing the aspect of the project. Further, in some embodiments, when a user selects the notification 1150, a pop-up window 1152 may appear identifying which users are editing the project. The dashboard 200 may allow the users simultaneously editing a project to send messages to one another. FIG. 40 is a screenshot of the dashboard illustrating users sending messages to each other. As shown, when multiple users are editing a project simultaneously, the users may exchange messages via a chat window 1154. In some embodiments, the chat window 1154 may allow two users to exchanges messages. However, in other embodiments, the chat window 1154 may have more extensive capabilities, such as allowing users to assign tasks to each other and reference specific modifications to the project. Further, in some embodiments, the messages may appear as comments coupled to specific portions of the project. As shown in FIG. 40, these comments may appear as a comment notification 1156, which a user may select to open a larger chat window 1154.

In some embodiments, multiple users may be editing a master copy of the project, which is hosted by an on-premises (on-prem) server, a remote server, a private cloud network, a public cloud network, or some other way that is simultaneously accessible by multiple users, and updated in real time or near real time (e.g., within seconds of an edit being made). However, in some embodiments, a user's computing device may make a local copy of the project to edit rather than working from the master. Differences or conflicts between the master and the local copy may be considered at set intervals (e.g., seconds, minutes, hours, days), or upon some triggering activity (e.g., certain number of changes made, user selects save button, or requests to sync master and local copy, when a user closes their local copy, etc.). Upon noticing one or more conflicts, the user may be prompted as to how to deal with the realized conflicts. FIG. 41 is a screenshot of the dashboard 200 in which a user has been prompted as to how they would like to resolve conflicts. As shown, a conflict pop-up window 1158 may open, presenting multiple options for resolving the identified conflicts. For example, the options may include merging the local file with the master version 1160, ignoring the changes to the local version 1162, and pushing the changes to the local version to the master version 1164. In some embodiments, after the user has made a selection, the dashboard may display mockups of the changes for the user to consider. FIG. 42 is a screenshot of the dashboard 200 displaying three mockups. In the illustrated embodiment, the user has selected to merge his or her changes with the master version. Accordingly, the dashboard presents three windows: a local version 1166, a merger version 1168, and a mockup of what the updated master version would look like if user proceeds with the selected options. The mockups assist the user in understanding the possible ramifications of their chosen action before implementing it. Accordingly, the dashboard may include a cancel button 1172 to stop the chosen action return to the previous screen, and a finish button 1174 to proceed with the chosen action.

Retrospective Project Code File Analysis

As discussed with regard to FIGS. 18, 19, and 33-38, rule sets, algorithms, and historical data may be used to analyze projects in real time, near real time, at set time intervals, or upon the occurrence of triggering events, during design of a project, to discourage users from designing systems that do not follow certain guidelines and/or generating recommendations for adding objects and/or connections as the user designs a project. However, in some embodiments, the system may also analyze completed project code files. FIG. 43 is a flow chart of a process 1200 for analyzing a project code file. As shown, in block 1202, the project code file is received or retrieved from some suitable storage component. In some embodiments, the project code file may be sent or uploaded by a customer. In other embodiments, the customer may provide a hyperlink to the project code file, or otherwise identify a location of the project code file. At block 1204, the rules and/or analysis algorithms are received or retrieved. The rules and/or analysis algorithms may define guidelines and/or best practices for project code files. In some embodiments, there may be multiple sets of rules and/or analysis algorithms that may be used. Selection of a specific set of rules and/or analysis algorithms may be performed by the customer or based on one or more characteristics of the project code file (e.g., industry, application, size of project code file, etc.). At sub-process 1206, the sets of rules and/or analysis algorithms are applied to the project code file to analyze the project code file, for example, via static code analysis.

For example, as shown in FIG. 43, the sub-process 1206 may include a collection of blocks that represent different aspects of the analysis. It should be understood, however, that the blocks shown in FIG. 43 are merely exemplary and that the sub-process 1206 may include only some of the blocks shown in the sub-process 1206, may include different combinations of blocks in the sub-process 1206, may include the blocks shown in sub-process 1206, but in a different order, or may include additional blocks not shown in FIG. 43.

At block 1208, the system may analyze the project code file to identify its code structure. This may include, for example, recognizing the larger portions of the code, as well as identifying modules of code, loops, interactions between portions of code, etc. For example, the system may suggest alternate structures for certain portions of the project code file, such as suggesting an if, then, else structure. In instances in which the project code file was written by a person who is no longer available (e.g., departed employee, contractor, employee of third party hired to develop the project code file), identifying the structure of a project code file may help an owner of the project code file to understand how the project code file is constructed. At block 1210, the system may generate one or more visualizations of the project code file. The visualizations may include, for example, a map of data flow within the project code file, a call graph, etc.

At block 1212, the system may identify dead code within the project code file. For example, the system may find portions of code within the project code file that are not run because of how the code is written (e.g., portions of code are not called upon). Further, in block 1214, the system may identify dead ends in the project code file. If the system finds portions of dead code or dead ends within the project code file, the system may suggest one or more steps for addressing the dead code or dead ends. In block 1216, the system may identify improper or inefficient tag usage within the project code file. If the system finds improper or inefficient tag usage, the system may suggest one or more steps for addressing the improper or inefficient tag usage. In block 1218, the system identifies overlapping and/or concurrent tasks within the project code file and determines whether those tasks should be separated and how to go about separating the overlapping and/or concurrent tasks. At block 1220, the system considers whether connections between components are valid. That is, the system considered whether connections between components comply with one or more sets of rules or guidelines. If one or more connections are found to be invalid, the system may recommend one or more steps for bringing the one or more connections into compliance with the one or more sets of rules or guidelines. At block 1222, the system identifies overload situations for a component or a group of components (e.g., when a component is running too many processes simultaneously) and provides suggestions for addressing the overload situations.

At block 1224, the system calculates a code complexity score for the project code file. Calculating the code complexity score may include applying an algorithm to determine a single numerical value that represents the complexity of the project code file. It should be understood, however that the project code file analysis in sub-process 1206 may include calculating other scores for the project code file that ascertain, for example, the extent to which the project code file complies with various rules or guidelines, such as, well-organized structure, lack of dead code and dead ends in code, efficiency of tag usage, amount of parallel overlapping/concurrent tasks, lack of overload situations, etc. Accordingly, in some embodiments, calculating the code complexity score may utilize the results of other blocks within the project code file analysis sub-process 1206. At block 1226, the system determines whether the project code file meets an acceptance criteria. The acceptance criteria may include one or more sets of rules or guidelines that define best practices for project code files. In some embodiments, the output of whether the project code file meets the acceptance criteria may be a binary yes/no, pass/fail, etc. However, in other embodiments, the output may include a selection of one or multiple gradations, such as letter grades, poor/satisfactory/good/excellent, etc. In further embodiments, the output of whether the project code file meets the acceptance criteria may be a numerical score. However, other embodiments for the output of whether the project code file meets the acceptance criteria are also envisaged.

At block 1228, the system generates and outputs a report summarizing the analysis of the project code file sub-process 1206. Accordingly, the report may include results from blocks within the sub-process 1206, as well as other information. The report may be displayed within the dashboard, within a different GUI, output as a PDF, or provided in some other fashion. At block 1230, data from the analysis sub-process 1206 may be added to a database or other store of historical data, where the data may be further analyzed. At block 1232, data collected from analyzing the project code file, as well as other project code files may be used to update the rules and/or analysis algorithms. Updating the rules and/or analysis algorithms may occur at set intervals (e.g., daily, weekly, monthly, quarterly, annually, etc.), upon some triggering event (e.g., threshold number of project code files analyzed, a request to update rules and/or analysis algorithms, change in processes, etc.).

Alerts

FIG. 44 is a screenshot of the dashboard 200 displaying an alarm notification 1250 and an alarm pop-up window 1252. As described above, the dashboard 200 is configured to display notifications to a user when in the design-time environment. In some embodiments, the notifications may include alarms. For example, if an industrial automation process is running while a user is editing the corresponding project within the design-time environment, and alarms are generated, the alarms may appear as notifications 1250 within the dashboard 200. As shown, the industrial controllers 20 in the oven area 702 and packer area 704 both have outstanding alarm notifications 1250 adjacent to the respective icons. Further, as shown in FIG. 44, in some embodiments, when one or more components have outstanding alarm notifications 1250, the other objects in the project may be deemphasized (e.g., greyed out) within the dashboard 200. Further, the dashboard 200 may also display the alarm pop-up window 1252, which brings the user's attention to the outstanding alarm. The user may select a view button 1254 to display more information about the alarm notification. When the view button 1254 is selected, the dashboard 200 may update to display an alarm summary screen. FIG. 45 is a screenshot of the dashboard 200 displaying an alarm summary screen 1256. As shown in FIG. 45, the alarm summary screen 1256 occupies the primary window 206 of the dashboard and displays an expandable and collapsible list of alarms 1258. The list of alarms 1258 includes a banner 1260 for each alarm, which displays the associated object, a priority level for the alarm (e.g., low, medium, high, urgent), and a message associated with the alarm. Selecting the banner 1260 for an alarm opens a window that displays information about the selected alarm. For example, the information may include the priority, a severity score, an in-alarm time, an event time, and the message. The priority level reflects the determined urgency of the alarm (e.g., the degree to which timely resolution of the alarm will reduce the impact of the underlying issue). The severity score may be a value (e.g., 1-100) that conveys the extent of the ramifications of the underlying issue on the industrial automation system if the issue goes unaddressed. Further, the alarm summary screen 1256 may include a row of tabs 1264 for each expanded alarm that control what is shown in a content window 1266. The tabs may include, for example, HMI, code, trend, manuals, etc. The when the HMI tab is selected, the content window 1266 may display items being displayed in the HMI screen. In some embodiments, the user may interact with buttons recreated from the HMI screen within the content window 1266 as if the user were holding an HMI. Selection of the code tab may cause the content window 1266 to be updated to display code associated with the affected object or component. The user may then make edits to the code within the content window 1266. Selection of the trend tab may cause the content window 1266 to be updated to display a graph of a value or metric over time and whether the value is above or below an average or some desired target for the value or metric. Selection of the manuals tab may cause the content window 1266 to be updated to display hyperlinks to the manuals of the components or objects experiencing the alarm. In other embodiments, the one or more relevant manuals may be embedded within the content window 1266.

In some embodiments, the system may reference historical data and make one or more suggestions as to how to address the alarm. For example, the system may utilize machine learning or artificial intelligence trained based on collected historical data. The system may recognize that the same or similar situation has occurred in the past and been resolved. The system may recognize the solution that worked previously and suggest the solution to a user. The system may provide instructions for implementing the suggested solution, or provide the user with an option to automatically implement the suggested solution. In some embodiments, where multiple possible solutions are available, the system may present multiple possible solutions. In further embodiments, the system may be configured to evaluate and rank the possible solutions. The system may provide, for example, a predicted likelihood of success for each possible solution.

Light Engineering Client

As described above with regard to FIGS. 3 and 4, a light engineering client environment may provide an operator with a run-time style environment, but with limited functionality of the design-time environment for troubleshooting and/or making adjustments to an industrial automation system. FIGS. 46-48 illustrate various aspects of the light engineering client. Specifically, FIG. 46 shows a home screen of a light engineering client dashboard 1300 as displayed on an HMI 30. It should be understood, however, that the light engineering client may be displayed on any computing device. As shown, the dashboard 1300 includes an explorer window 1302, a connected components window 1304, and a primary window 1306. As with the explorer window of the design-time environment, the explorer window 1302 includes an expandable and collapsible list of components and objects associated with the HMI 30. As a user navigates the explorer window 1302, selections from the explorer window 1302 may dictate what is displayed in the primary window 1306. The connected devices window 1304 displays information associated with one or more devices connected to the HMI 30. The information may include, for example, whether the component is online, a state of the component, whether there are any notifications associated with the component, etc.

The data window 1308 may be configured to display data associated with one or more connected components or objects. In some embodiments, the data may be displayed via one or more visualizations. In other embodiments, the data may be displayed via one or more scores. What is displayed within the data window 1308 may also be customizable by the operator. The devices window 1310 displays one or more devices associated with the HMI 30 and may include one or more pieces of information for the one or more devices. The system model window 1312 may list one or more models associated with the HMI 30, which the user may select to view the selected model. The alarm window 1314 displays a list of alarms experienced by the HMI 30, or components associated with the HMI 30.

The home screen of the light engineering client dashboard 1300 may be visible when a home screen tab 1316 has been selected. Selection of an alarm tab 1318 may cause the primary window 1306 to update to display information associated with one or more alarms. FIG. 47 is a screenshot of the light engineering client dashboard 1300 when the alarm tab 1318 has been selected. As shown, when the alarm tab 1318 has been selected, the dashboard 1300 updates the primary window 1306 to display an alarm listing window 1320 and an alarm details window 1322. The alarm listing window 1320 lists the alarms relevant to the HMI 30 or any components associated with the HMI 30. Upon selection of an alarm within the alarm listing window 1320, the alarm details window 1322 updates to display information associated with the selected alarm. For example, the alarm details window 1322 may display an alarm priority, an alarm severity, an in-alarm time, an event time, an alarm message, a location of the associated component, a parameter in question, as associated controller, a path, a trend of the value in question, hyperlinks to manuals for the relevant components, and tabs to display associated code and to the HMI screen.

In some embodiments, the user may minimize the explorer window 1302 and the connected devices window 1304 such that the primary window 1306 occupies the entirety of the HMI screen 30. FIG. 48 is a screenshot of the light engineering client dashboard 1300 when the explorer window 1302 and the connected devices window 1304 have been minimized. As shown, the alarm details window 1322 includes a row of tabs 1324. The tabs may include, for example, code and HMI. When the HMI tab is selected, the content screen 1326 may display information associated with the HMI 30. Selection of the code tab may cause the content window 1326 to be updated to display code associated with the affected object or component. The light engineering client dashboard 1300 may receive inputs from the user making modifications to the code, similar to the design-time environment, to address the alarm. As previously discussed, the light engineering client environment may be similar to the run-time environment, but with added functionality from the design environment, allowing the operator to make modifications to the code to make adjustments to the industrial automation system and/or to address alerts and alarms. For example, the light engineering client environment may allow an operator to adjust target or threshold values for certain parameters (within a specified range set by the designer), switch parameters to check different sensors, change time periods, change input value, etc.). In contrast, the design-time environment allows a user to change the function of analysis, change analysis algorithms, etc. In some embodiments, the added functionality from the design environment may be limited in scope as compared to the full functionality available in the design-time environment.

In some embodiments, the system may be configured to reference historical data and make one or more suggestions as to how to address the alarm. For example, the system may utilize machine learning or artificial intelligence trained based on collected historical data. The system may recognize that the same or similar situation has occurred in the past and been resolved. The system may recognize the solution that worked previously and suggest the solution to a user. The system may provide instructions for implementing the suggested solution, or provide the user with an option to automatically implement the suggested solution. In some embodiments, where multiple possible solutions are available, the system may present multiple possible solutions. In further embodiments, the system may evaluate and rank the possible solutions. The system may provide, for example, a predicted likelihood of success for each possible solution.

The disclosed techniques include applying a set of industrial automation system design rules to determine whether each action taken by a designer (e.g., adding an object to a project, drawing connections between objects, etc.) is allowed by the rules. The rules may act as "design guardrails" to help designers design better systems more efficiently, avoiding long periods of time spent troubleshooting. In some cases, designers may be entirely prevented from taking prohibited actions, whereas in other cases, designers having certain specified credentials may be able to override the warning message that a given design action does not follow the guidelines.

The disclosed techniques also include using AI and/or machine learning to consider actions taken by a designer in view of previous designs and known component specifications to suggest design actions, which the designer may accept or reject. Suggestions may include, for example, using specific models of components, adding connections between components, inserting additional components, replacing end of life components with replacement components, and so forth. When an action is suggested, the designer may choose whether to accept the suggestion or dismiss the suggestion. In some cases, the system may also provide the designer with contact information or hyperlinks to vendors or manufacturers of the suggested component, or other avenues to purchase the suggested component.

Further, the disclosed techniques include using AI and/or machine learning to analyze a historical data set, identify when the instant issue has been encountered before, and suggest a remedial action to the designer. For example, the system may recognize that a problem has been encountered and use a historical data set to identify when the problem has been encountered in the past. The system may then consider what was done in those previous occurrences to remedy the problem. The system may then identify one or more possible remedial actions to address the problem. In some cases, the system may rank or otherwise evaluate the possible remedial actions to identify a likelihood of success for each possible remedial action. The system may then suggest one or more of the remedial actions to the designer. For example, the system may communicate to the designer, "The last time this problem occurred, we took this remedial action." In some cases, the designer may have the option to automatically implement the suggested remedial action, see instructions for manually implementing the suggested remedial action, or dismiss the suggestion.

The disclosed techniques include a light engineering client environment, which is similar to a run-time environment, but includes some functionality of the design-time environment, allowing operators to make minor adjustments to an industrial automation system to resolve minor issues. In some embodiments, the light engineering client may also be capable of providing recommendations for how to resolve issues that arise.

The disclosed techniques further include using component libraries that include objects that are programmed to interact with one another in known ways. Accordingly, the designer may drag components from a library into a design window, and the system may understand how the components are intended to interact with each other. The system may automatically arrange components and connect the components accordingly to how they are frequently implemented. Each component in a library may have a respective portion of code that defines the operation of the respective component. Based on how the components are arranged and connected in the design window, the system may then generate or modify program code for the components so the designer is not burdened with writing the code for the system.

The disclosed techniques include using AI and/or machine learning to learn new naming conventions and propagate the new naming convention through one or more industrial automation systems and/or libraries, and to automatically adjust component names to maintain a naming convention when components are added, removed, or rearranged within the system.

The disclosed techniques include a project code file analysis algorithm that may be applied to project code files and generate a report for the project code file. The project code analysis algorithm may be configured to determine a structure of the project code file, create a visualization of the project code file, identify dead code (i.e., code that is not executed) within the project code file, identify dead ends within the project code file, identify inefficient tag usage, identify parallel concurrent tasks, consider the validity of connections between components, identify overload situations, calculate a complexity score for the code, determine whether the project code file meets an acceptance criteria, and so forth. Further, once the project code file has been analyzed, a database may be updated with data from the analysis. As the database is populated with data from analyzing numerous project code files, adjustments may be made to the project code analysis algorithm, such that the project code analysis algorithm improves over time.

While only certain features of the present disclosure have been illustrated and described herein, many modifications and changes will occur to those skilled in the art. It is, therefore, to be understood that the appended claims are intended to cover all such modifications and changes as fall within the true spirit of the embodiments described herein.

The invention claimed is:
1. A system, comprising:
a processor; and
a memory accessible by the processor, the memory storing instructions that, when executed by the processor, cause the processor to perform operations comprising:
presenting a graphical user interface (GUI) for designing an industrial automation system via a display, wherein the GUI comprises a first window and a second window;
presenting a visualization representative of a plurality of objects within the second window, wherein each object of the plurality of objects is represented by an icon and corresponds to a portion of computer code that corresponds to an operation of an industrial automation device;
receiving a first input indicative of a first selection of a first object of the plurality of objects, wherein the first object is represented by a first icon and corresponds to a first portion of computer code that corresponds to a first operation of a first industrial automation device;
presenting the first object in the first window in response to receiving the first input;
receiving a second input indicative of a second selection of a second object of the plurality of objects, wherein the second object is represented by a second icon and corresponds to a second portion of computer code that corresponds to a second operation of a second industrial automation device;

presenting the second object in the first window in response to receiving the second input; and in response to receiving the second input, generating a code file by:
  automatically modifying the first portion of computer code to enable the first industrial automation device to operate in conjunction with the second industrial automation device;
  automatically modifying the second portion of computer code to enable the second industrial automation device to operate in conjunction with the first industrial automation device; and
  combining the modified first portion of computer code and the modified second portion of computer code.

2. The system of claim 1, wherein the instructions, when executed by the processor, cause the processor to further perform the operations comprising:
  receiving a third input representative of a third object of the plurality of objects and placing the third object in the first window, wherein the third object is represented by a third icon and corresponds to a third portion of computer code that corresponds to a third operation of a third industrial automation device;
  in response to receiving the third input, updating the code file by:
  automatically modifying the first portion of computer code to enable the first industrial automation device to operate in conjunction with the second industrial automation device and the third industrial automation device;
  automatically modifying the second portion of computer code to enable the second industrial automation device to operate in conjunction with the first industrial automation device and the third industrial automation device;
  automatically modifying the third portion of computer code to enable the third industrial automation device to operate in conjunction with the first industrial automation device and the second industrial automation device; and
  combining the modified first portion of computer code, the modified second portion of computer code, and the modified third portion of computer code.

3. The system of claim 1, wherein the instructions, when executed by the processor, cause the processor to further perform the operations comprising displaying a first interface element of the first object and a second interface element of the second object.

4. The system of claim 3, wherein each of the first interface element and the second interface element comprises an input, an output, or a status output.

5. The system of claim 3, wherein the instructions, when executed by the processor, cause the processor to further perform the operations comprising receiving one or more inputs configured to connect the first interface element to the second interface element.

6. The system of claim 3, wherein the instructions, when executed by the processor, cause the processor to further perform the operations comprising automatically generating a connection between the first interface element and the second interface element based on a relationship between the first object and the second object.

7. The system of claim 1, wherein the instructions, when executed by the processor, cause the processor to further perform the operations comprising receiving a third input indicative of a third selection of a controller object of the plurality of objects and placing the controller object in the first window, wherein the controller object is represented by a third icon and corresponds to a third portion of computer code that defines a third operation of an automation controller.

8. The system of claim 1, wherein the instructions, when executed by the processor, cause the processor to further perform the operations comprising receiving a third input indicative of a third selection of a routine object of the plurality of objects and placing the routine object in the first window, wherein the routine object is represented by a third icon and corresponds to a third portion of computer code that defines a routine.

9. The system of claim 1, wherein the instructions, when executed by the processor, cause the processor to further perform the operations comprising querying a set of compatibility rules to determine whether the first object and the second object are compatible with one another.

10. A method, comprising:
  presenting a graphical user interface (GUI) for designing an industrial automation system via display, wherein the GUI comprises a first window and a second window;
  presenting a visualization representative of a plurality of objects within the second window, wherein each object of the plurality of objects is represented by an icon and corresponds to a portion of computer code that defines an operation of an industrial automation device;
  receiving an area input defining a first area of the industrial automation system;
  receiving a first input indicative of a first selection of a first object of the plurality of objects, wherein the first object is represented by a first icon and corresponds to a first portion of computer code that corresponds to a first operation of a first industrial automation device;
  presenting the first object in the first area within the first window in response to receiving the first input;
  receiving a second input indicative of a second selection of a second object of the plurality of objects, wherein the second object is represented by a second icon and corresponds to a second portion of computer code that corresponds to operations of a second industrial automation device;
  presenting the second object in the first area within the first window in response to receiving the second input; and
  in response to receiving the second input, generating a code file by:
    automatically modifying the first portion of computer code to enable the first industrial automation device to operate in conjunction with the second industrial automation device;
    automatically modifying the second portion of computer code to enable the second industrial automation device to operate in conjunction with the first industrial automation device; and
    combining the modified first portion of computer code and the modified second portion of computer code.

11. The method of claim 10, comprising displaying a first interface element of the first object and a second interface element of the second object.

12. The method of claim 11, wherein each of the first interface element and the second interface element comprises an input, an output, or a status output.

13. The method of claim 11, comprising receiving one or more inputs configured to connect the first interface element to the second interface element based on a relationship between the first object and the second object.

14. The method of claim 11, comprising automatically generating a connection between the first interface element to the second interface element.

15. The method of claim 10, comprising:
receiving a third input representative of a third selection of a third object of the plurality of objects, wherein the third object is represented by a third icon and corresponds to a third portion of computer code that defines a third operation of a third industrial automation device;
presenting the third object in the first window; and
in response to receiving the third input, updating the code file by:
automatically modifying the first portion of computer code to enable the first industrial automation device to operate in conjunction with the second industrial automation device and the third industrial automation device;
automatically modifying the second portion of computer code to enable the second industrial automation device to operate in conjunction with the first industrial automation device and the third industrial automation device;
automatically modifying the third portion of computer code to enable the third industrial automation device to operate in conjunction with the first industrial automation device and the second industrial automation device; and
combining the modified first portion of computer code, the modified second portion of computer code, and the modified third portion of computer code.

16. A non-transitory, tangible, computer readable medium comprising instructions that, when executed by a processor, causes the processor to perform a set of operations comprising:
presenting a graphical user interface (GUI) for designing an industrial automation system via a display, wherein the GUI comprises a first window and a second window;
presenting a library visualization representative of a plurality of objects within the second window, wherein each object of the plurality of objects is represented by an icon and corresponds to a portion of computer code associated with operations of an industrial automation device;
receiving a first input indicative of a first selection of a first object of the plurality of objects, wherein the first object is represented by a first icon and corresponds to a first portion of computer code associated with first operations of a first industrial automation device;
presenting the first object in the first window in response to receiving the first input;
receiving a second input indicative of a second selection of a second object of the plurality of objects, wherein the second object is represented by a second icon and corresponds to a second portion of computer code associated with second operations of a second industrial automation device;
presenting the second object in the first window in response to receiving the second input;
receiving a third input configured to connect a first interface element of the first object to a second interface element of the second object; and
in response to receiving the third input, generating a code file by:
automatically modifying the first portion of computer code and the second portion of computer code based on a connection between the first interface element of the first object to a second interface element of the second object; and
combining the modified first portion of computer code and the modified second portion of computer code.

17. The computer readable medium of claim 16, wherein each of the first interface element and the second interface element comprises an input, an output, or a status output.

18. The computer readable medium of claim 16, wherein the instructions, when executed by the processor, cause the processor to further perform the set of operations comprising receiving a fourth input indicative of a fourth selection of a controller object of the plurality of objects and placing the controller object in the first window, wherein the controller object is represented by a fourth icon and corresponds to a fourth portion of computer code that additional operations of an automation controller.

19. The computer readable medium of claim 16, wherein the instructions, when executed by the processor, cause the processor to further perform the set of operations comprising receiving a fourth input indicative of a fourth selection of a routine object of the plurality of objects and placing the routine object in the first window, wherein the routine object is represented by a fourth icon and corresponds to a fourth portion of computer code that defines a routine.

20. The computer readable medium of claim 16, wherein the instructions, when executed by the processor, cause the processor to further perform the set of operations comprising querying a set of compatibility rules to determine whether the first object and the second object are compatible with one another.

* * * * *